United States Patent
Masuoka et al.

(10) Patent No.: US 11,183,582 B2
(45) Date of Patent: *Nov. 23, 2021

(54) METHOD FOR PRODUCING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

(*) Notice: Subject to any disclaimer, the term of this patent is extended or adjusted under 35 U.S.C. 154(b) by 179 days.

This patent is subject to a terminal disclaimer.

(21) Appl. No.: 16/705,665

(22) Filed: Dec. 6, 2019

(65) Prior Publication Data

US 2020/0119166 A1    Apr. 16, 2020

Related U.S. Application Data

(63) Continuation of application No. 16/241,332, filed on Jan. 7, 2019, now Pat. No. 10,535,756, which is a (Continued)

(30) Foreign Application Priority Data

Dec. 18, 2015    (WO) .................. PCT/JP2015/085469

(51) Int. Cl.
*H01L 21/336*    (2006.01)
*H01L 29/66*    (2006.01)
(Continued)

(52) U.S. Cl.
CPC .... *H01L 29/66666* (2013.01); *H01L 21/2254* (2013.01); *H01L 21/3081* (2013.01);
(Continued)

(58) Field of Classification Search
CPC ............. H01L 21/3081; H01L 21/2254; H01L 21/823885

See application file for complete search history.

(56) References Cited

U.S. PATENT DOCUMENTS 10,211,340 B2    2/2019  Masuoka et al.
10,535,756 B2 *  1/2020  Masuoka ............ H01L 21/2254
(Continued)

FOREIGN PATENT DOCUMENTS

EP    2239772 A    10/2010
JP    02-188966 A    7/1990
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor(SGT) for Ultra-High-Density LSI's": IEEE Transaction on Electron Devices, vol. 38, No. 3, pp. 573-578 (1991).

(Continued)

*Primary Examiner* — Samuel A Gebremariam
(74) *Attorney, Agent, or Firm* — Crowell & Moring LLP

(57) ABSTRACT

The method for producing a pillar-shaped semiconductor device includes a step of providing a structure that includes, on an i layer substrate, a Si pillar and an impurity region located in a lower portion of the Si pillar and serving as a source or a drain, a step of forming a SiO₂ layer that extends in a horizontal direction and is connected to an entire periphery of the impurity region in plan view, a step of forming a SiO₂ layer on the SiO₂ layer such that the SiO₂ layer surrounds the Si pillar in plan view, a step of forming a resist layer that is partly connected to the SiO₂ layer in plan view, and a step of forming a SiO₂ layer by etching the SiO₂

(Continued)

layer below the SiO$_2$ layer and the resist layer using the SiO$_2$ layer and the resist layer as masks.

19 Claims, 59 Drawing Sheets

Related U.S. Application Data continuation-in-part of application No. 15/976,510, filed on May 10, 2018, now Pat. No. 10,211,340, which is a continuation of application No. PCT/JP2016/085295, filed on Nov. 29, 2016.

(51) Int. Cl.
*H01L 29/423* (2006.01)
*H01L 21/225* (2006.01)
*H01L 21/308* (2006.01)
*H01L 29/40* (2006.01)
*H01L 29/78* (2006.01)
*H01L 21/8238* (2006.01)
*H01L 29/786* (2006.01)
*H01L 29/417* (2006.01)
*H01L 27/092* (2006.01)

(52) U.S. Cl.
CPC .... *H01L 21/823885* (2013.01); *H01L 27/092* (2013.01); *H01L 29/401* (2013.01); *H01L 29/41741* (2013.01); *H01L 29/42392* (2013.01); *H01L 29/66772* (2013.01); *H01L 29/7827* (2013.01); *H01L 29/78642* (2013.01); *H01L 29/78654* (2013.01); *H01L 29/665* (2013.01)

(56) References Cited

U.S. PATENT DOCUMENTS

| | | |
|---|---|---|
| 2008/0258209 A1 | 10/2008 | Oyu |
| 2010/0264484 A1 | 10/2010 | Masuoka et al. |
| 2015/0357438 A1 | 12/2015 | Masuoka et al. |

FOREIGN PATENT DOCUMENTS

| | | |
|---|---|---|
| JP | 02-198170 | 8/1990 |
| JP | 2008-140996 | 6/2008 |
| WO | WO2009/096467 | 8/2009 |
| WO | WO2015/097798 | 7/2015 |

OTHER PUBLICATIONS

C.Y.Ting, V.J.Vivalda, and H.G.Schaefer:"Study of planarized sputter-deposited SiQ$_2$"J.Vac.Sci.Technol, 15(3), May/Jun. (1978).

V.Probst, H.Schaber, A.Mitwalsky. and H.Kabza: "WSi$_2$ and CoSi$_2$ as diffusion sources for shallow-junction formation in silicon", J.Appl.Phys.vol. 70(2), No. 15, pp. 708-719(1991).

Tadashi Shibata, Susumu Kohyama and Hisakazu Iizuka: "A New Field Isolation Technology for High Density MOS LSI", Japanese Journal of Applied Physics, vol. 18, pp. 263-267 (1979).

T.Morimoto, T.Ohguro, H.Sasaki, M.S.Momose, T.Iinuma, I.Kunishima, K.Suguro, I.Katakabe, H.Nakajima, M.Tsuchiaki, M.Ono, Y.Katsumata, and H.Iwai: "Self-Aligned Nickel-Mono-Silicide Technology for High-Speed Deep Submicrometer Logic CMOS ULSI" IEEE Transaction on Electron Devices, vol. 42, No. 5, pp. 915-922 (1995).

Search Report, including English Translation, dated Feb. 21, 2017, in corresponding PCT Application No. PCT/JP2016/085295.

* cited by examiner

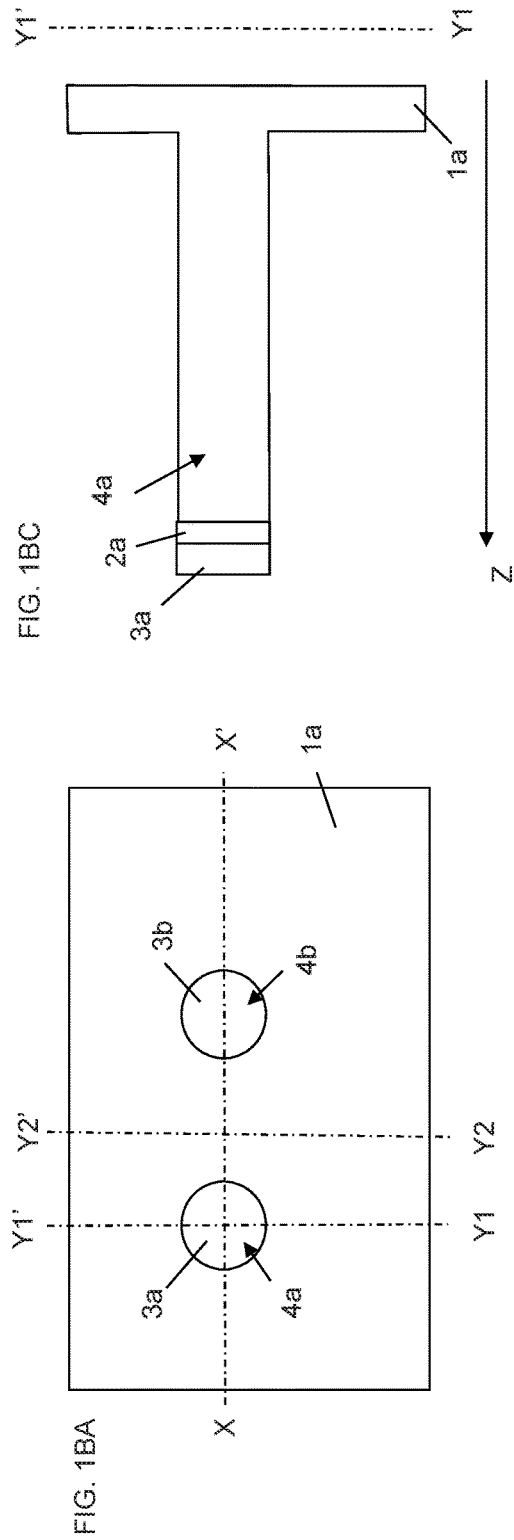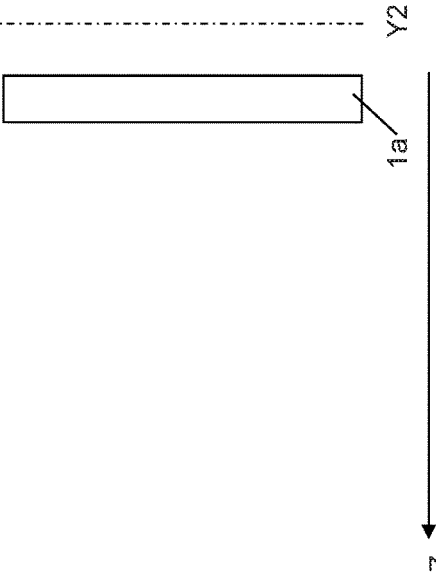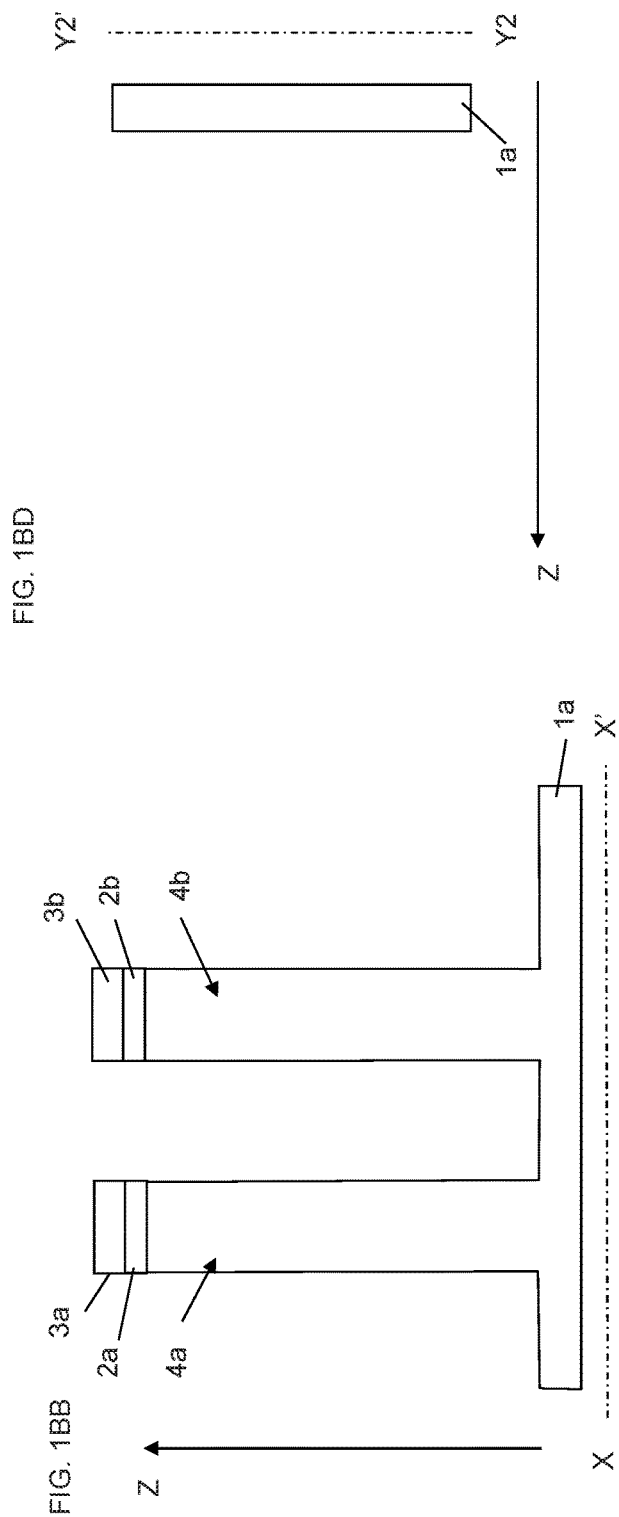

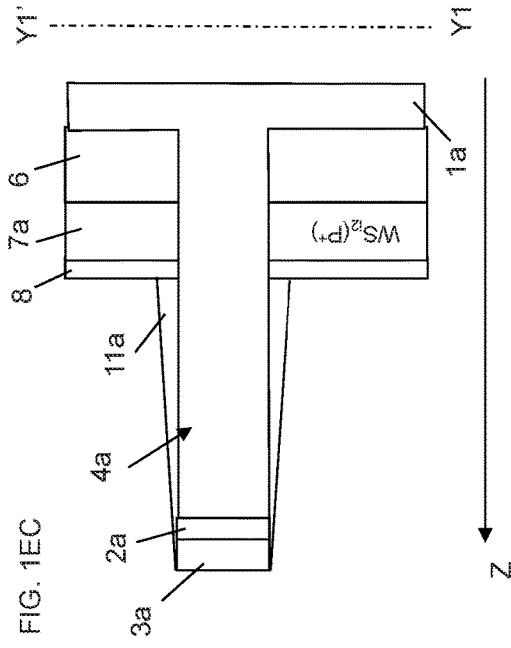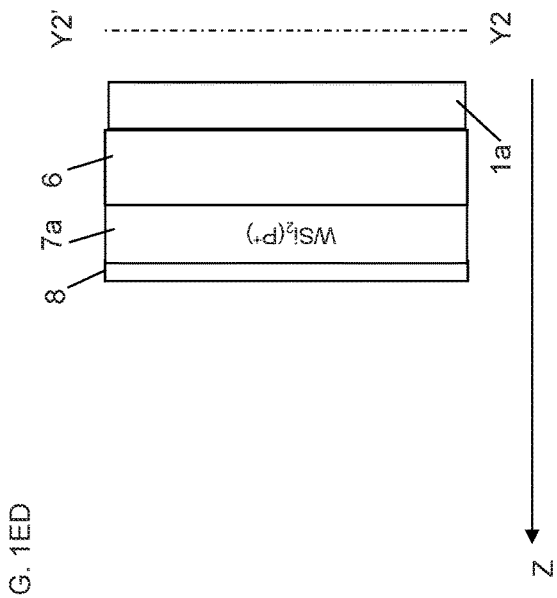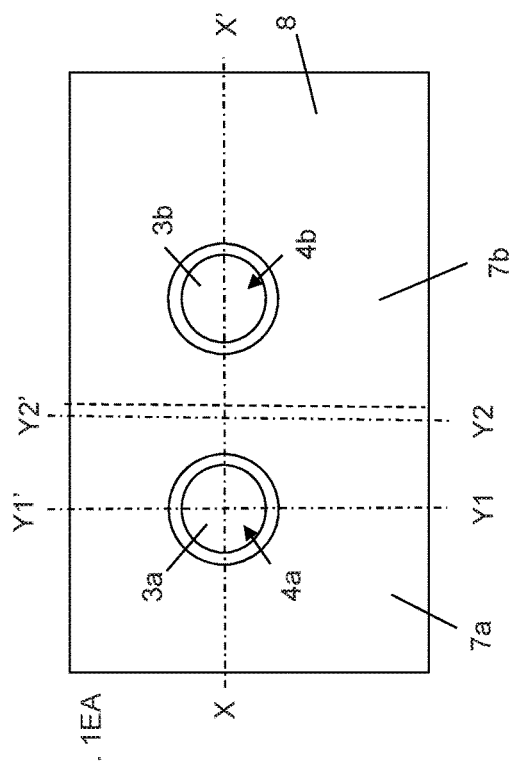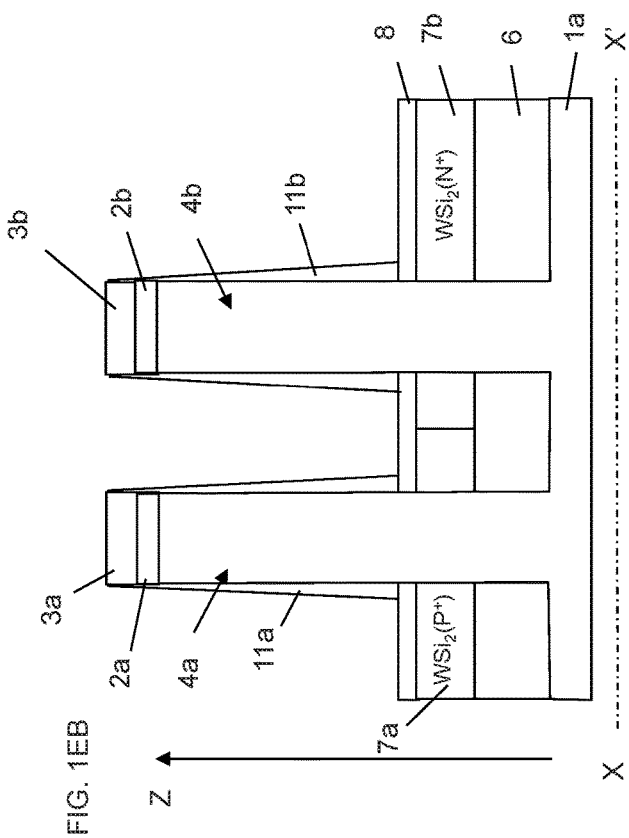

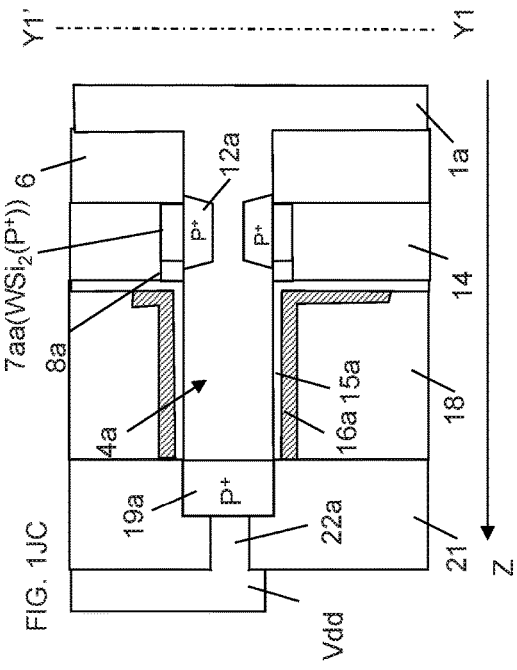
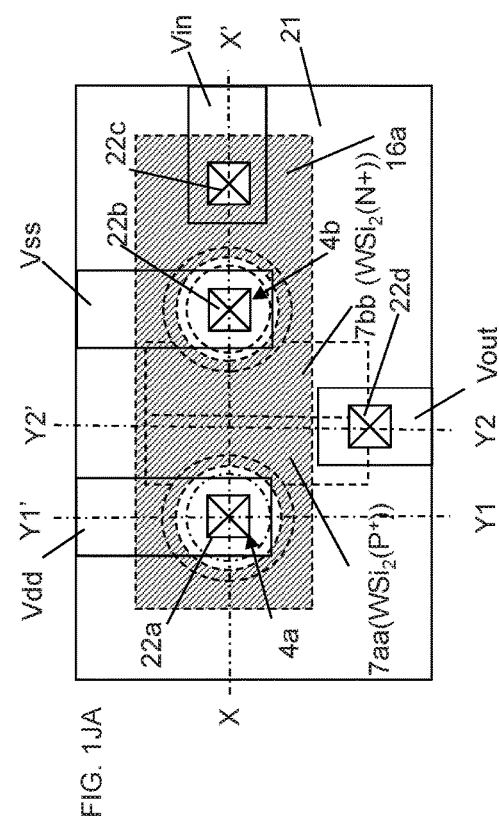
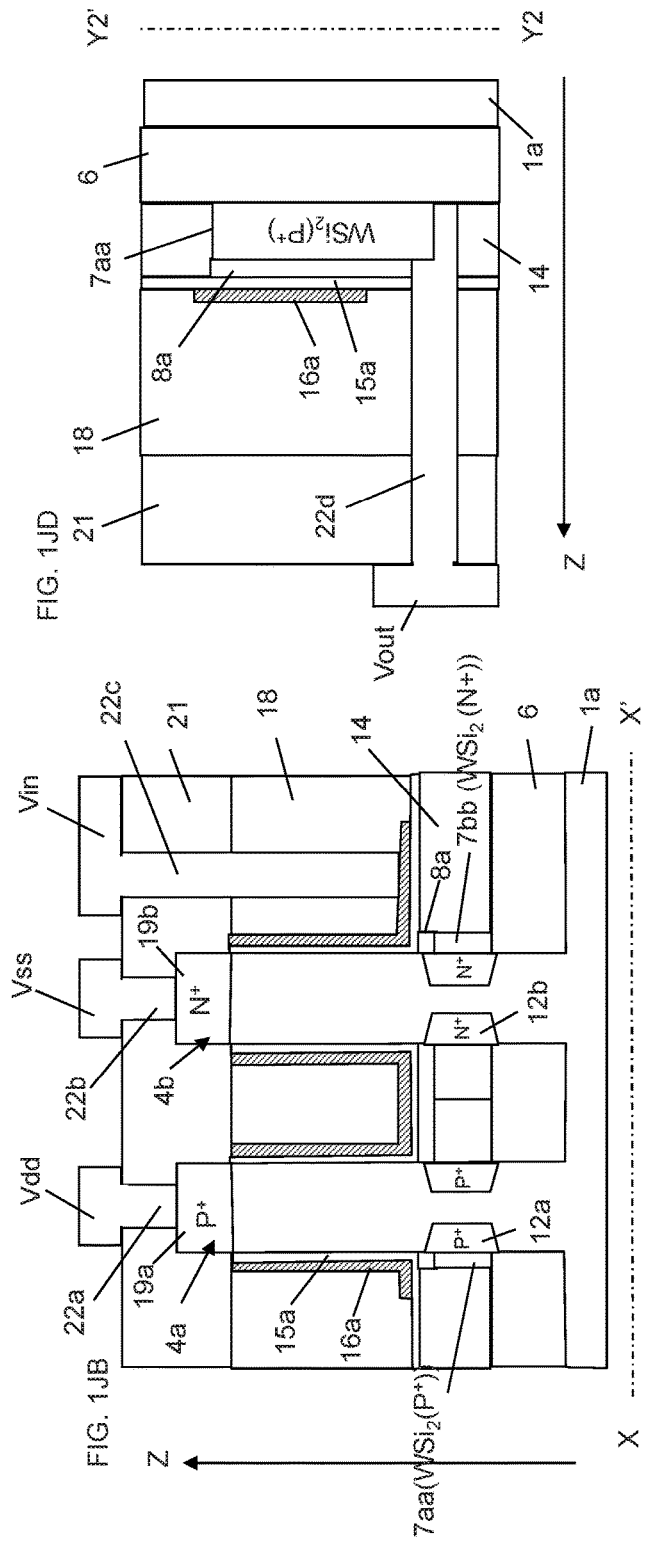
FIG. 1JA
FIG. 1JB
FIG. 1JC
FIG. 1JD

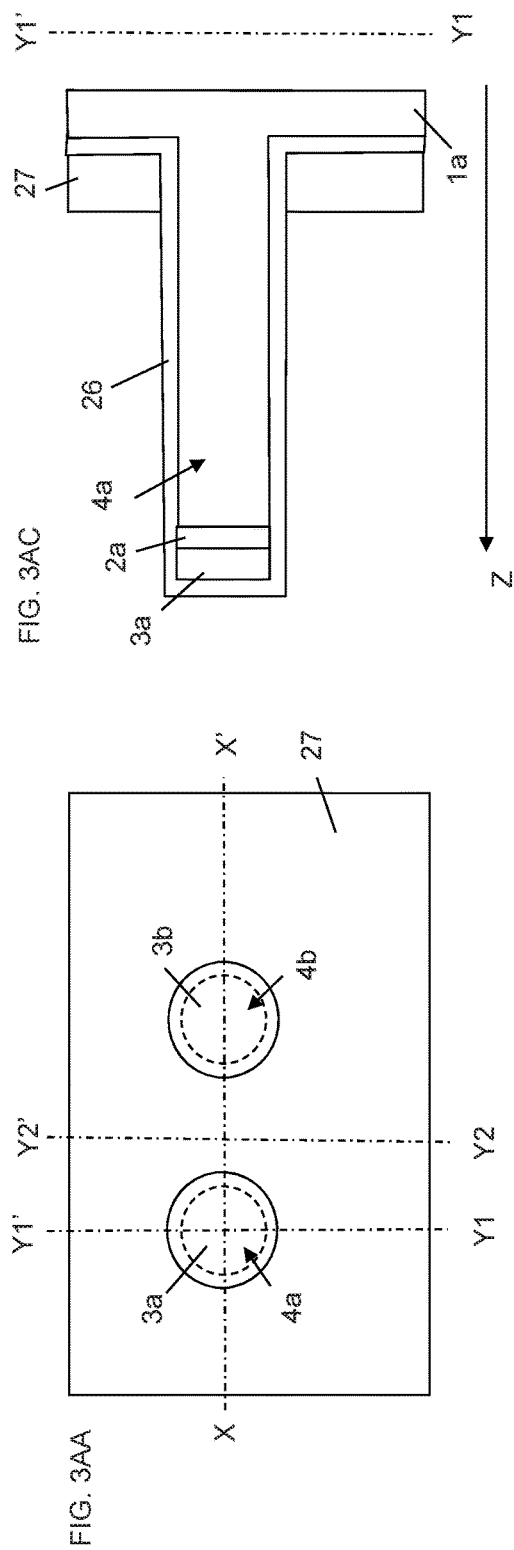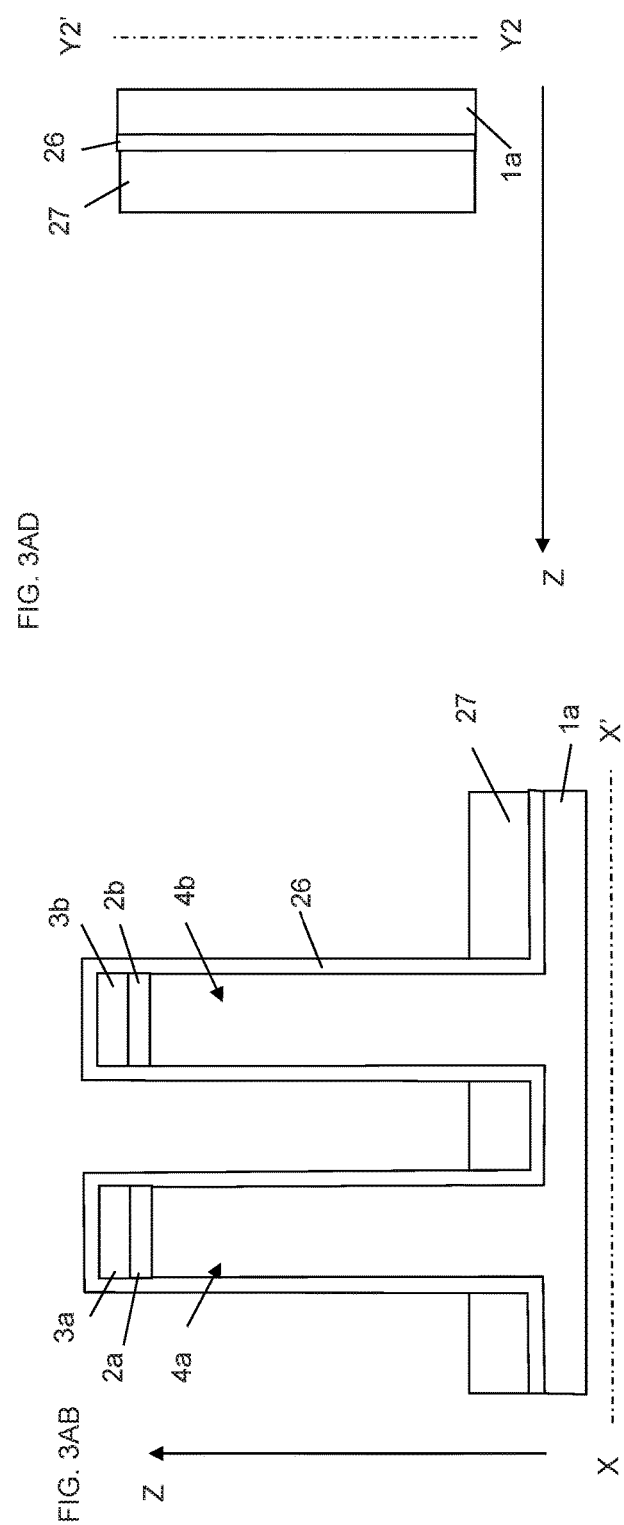

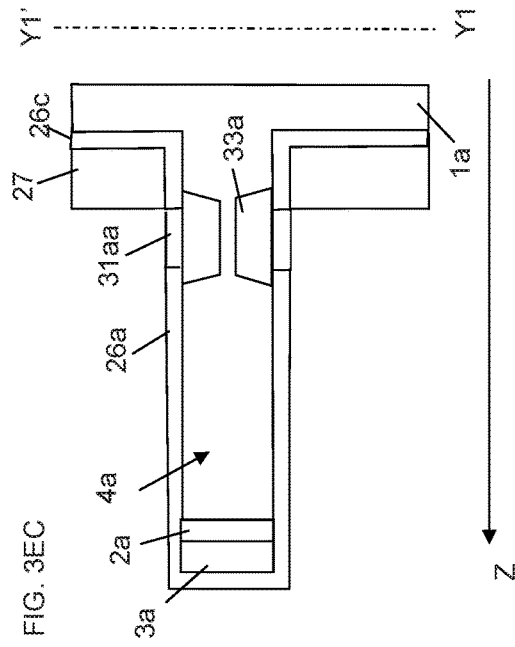
FIG. 3EA
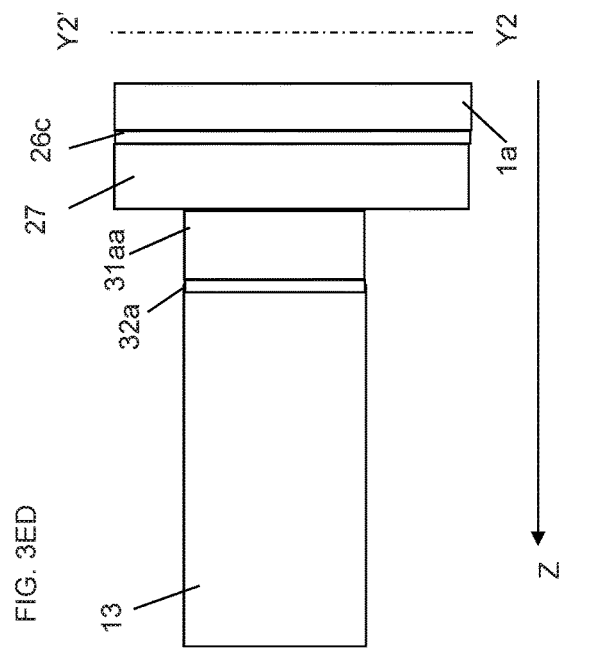
FIG. 3EC
FIG. 3ED
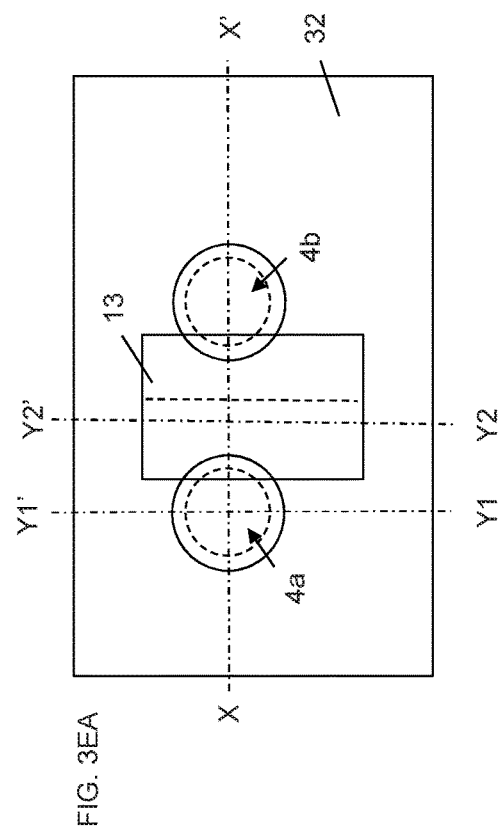
FIG. 3EB
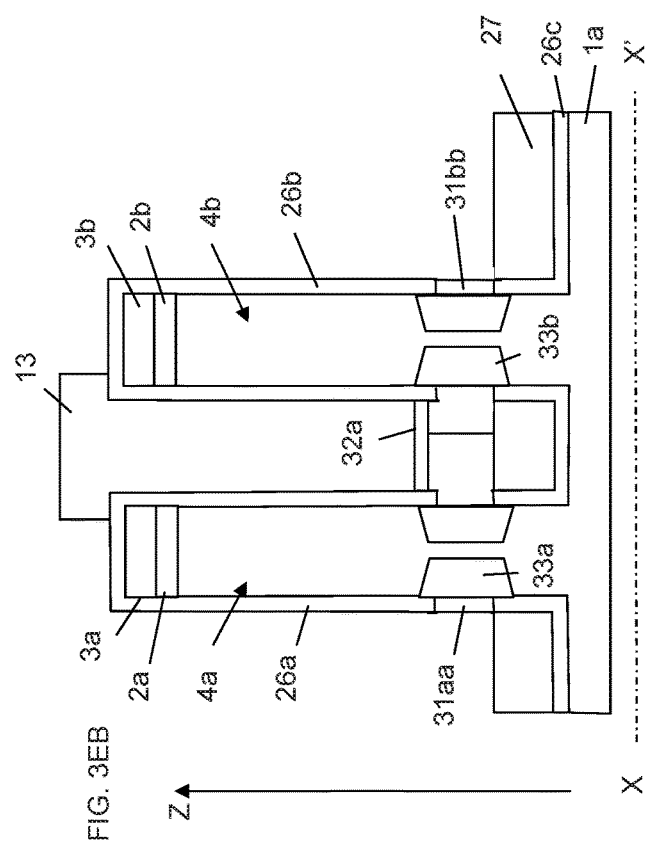

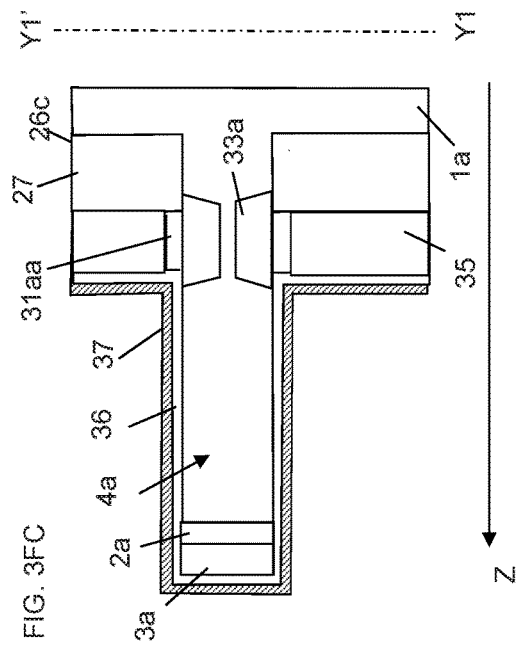
FIG. 3FA
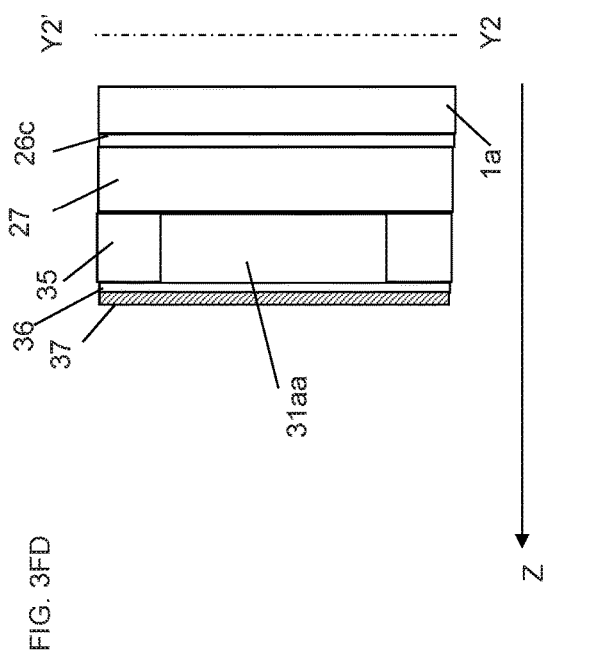
FIG. 3FC
FIG. 3FD
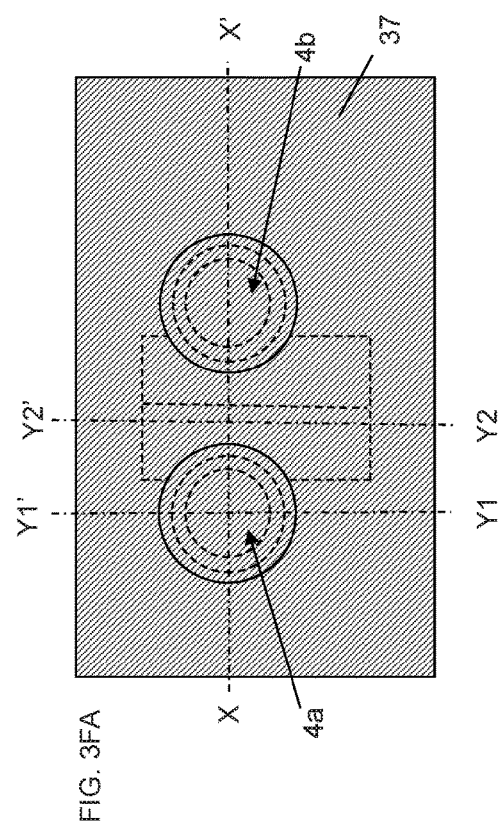
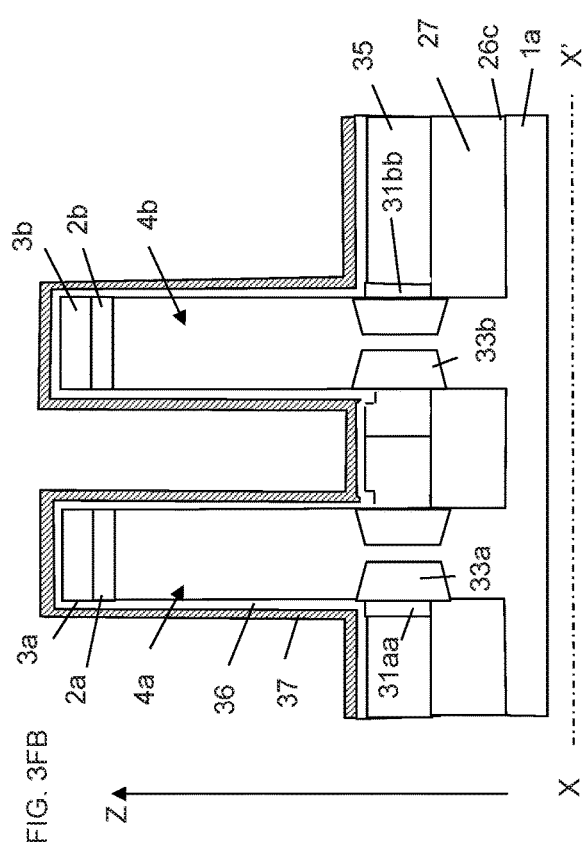
FIG. 3FB

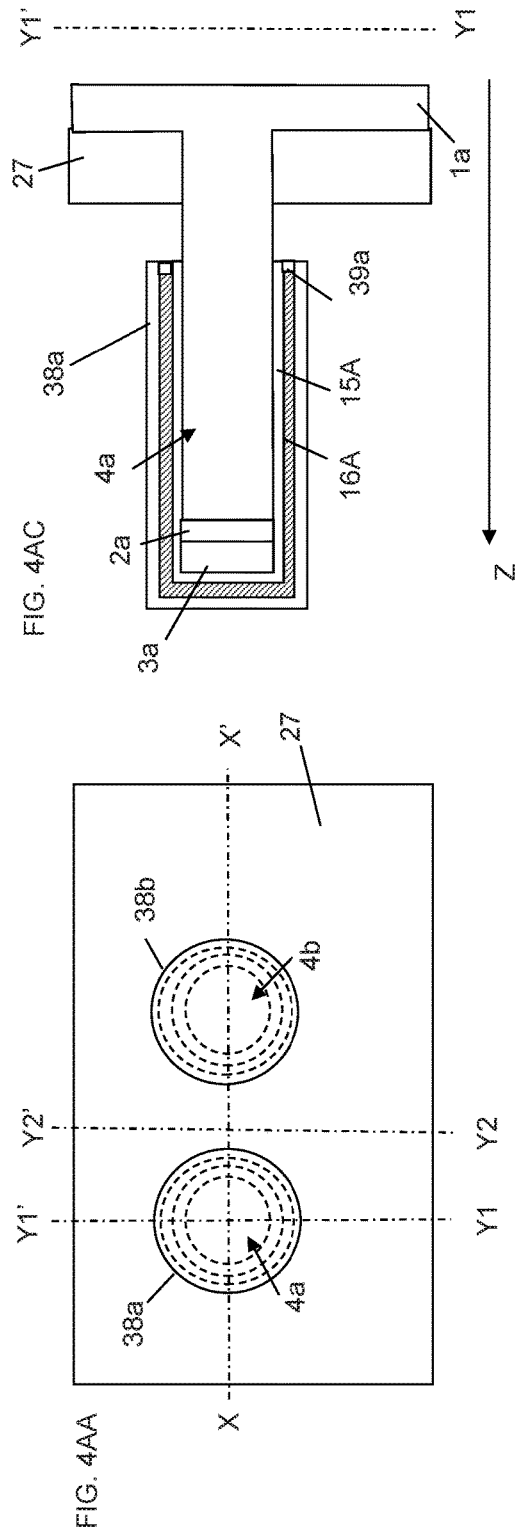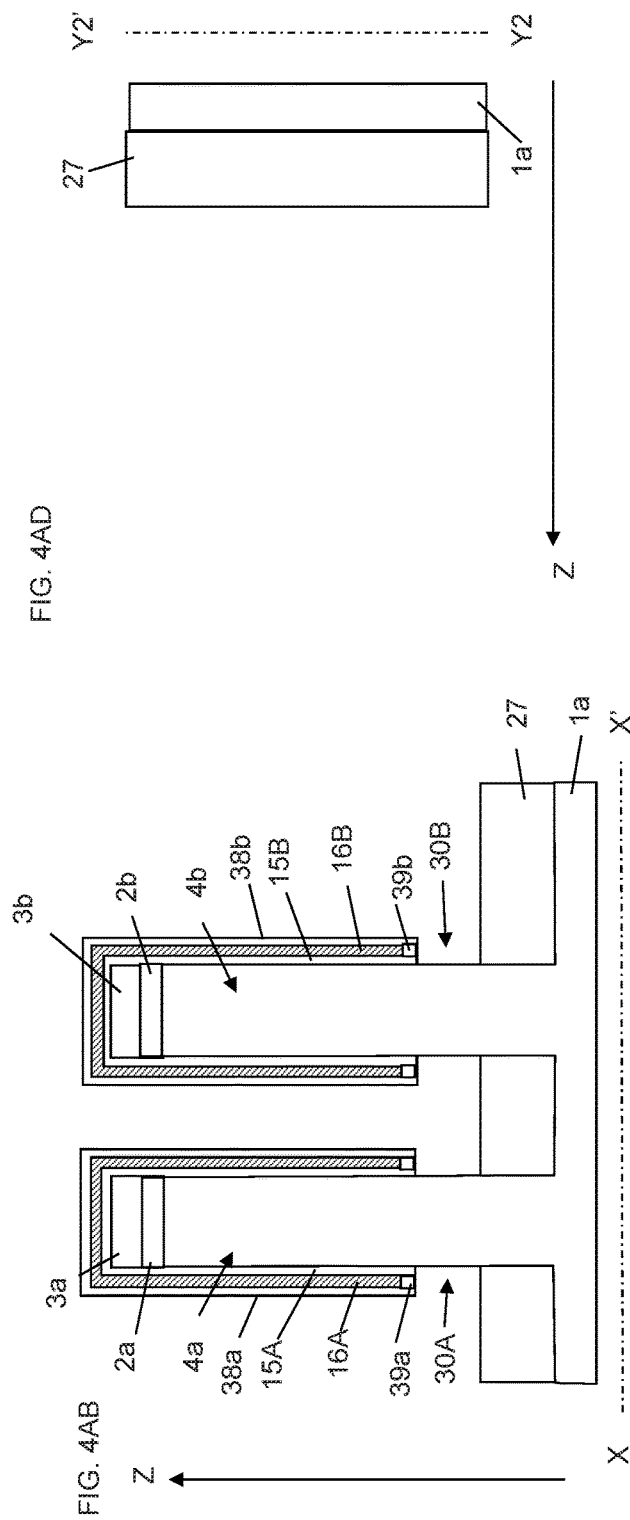

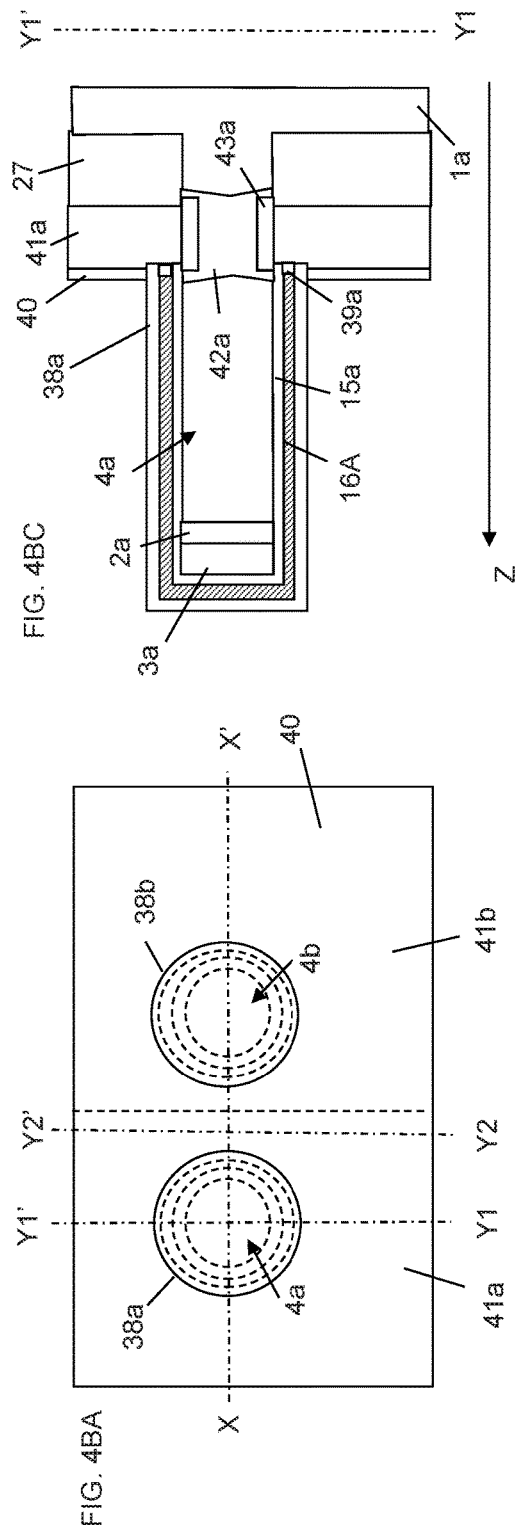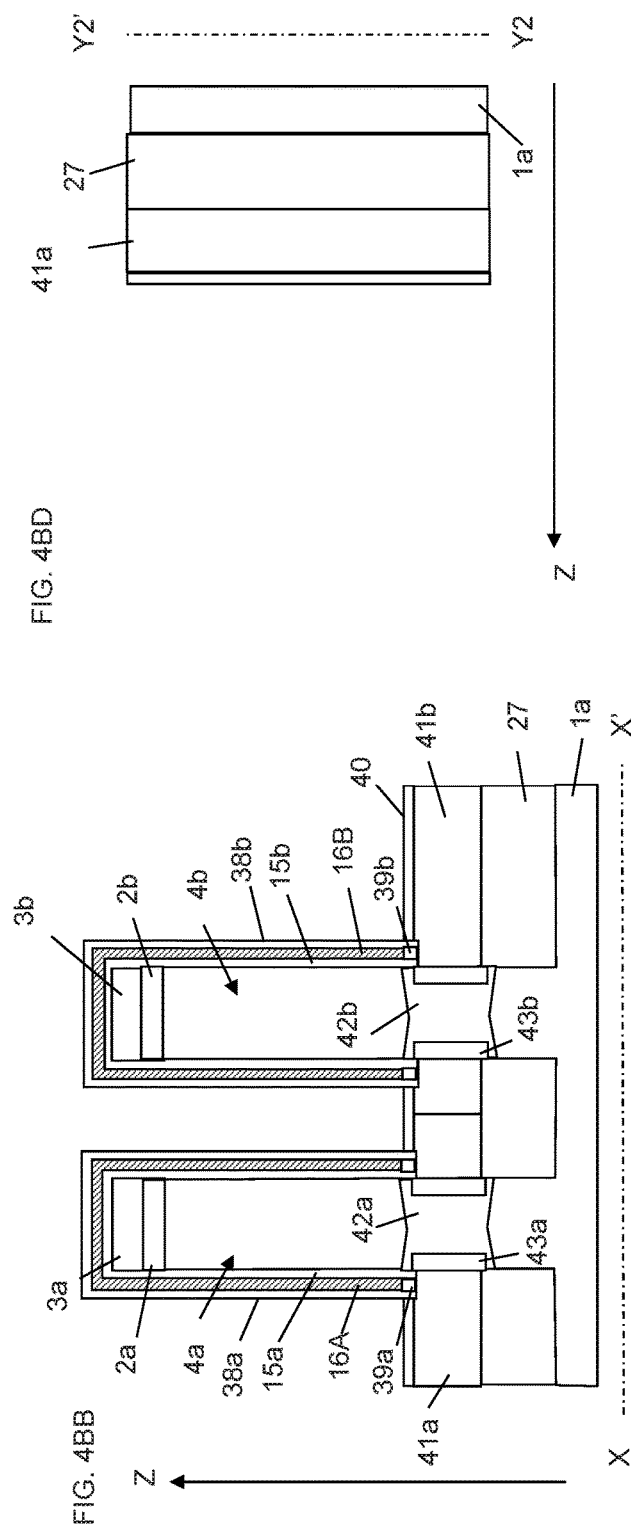

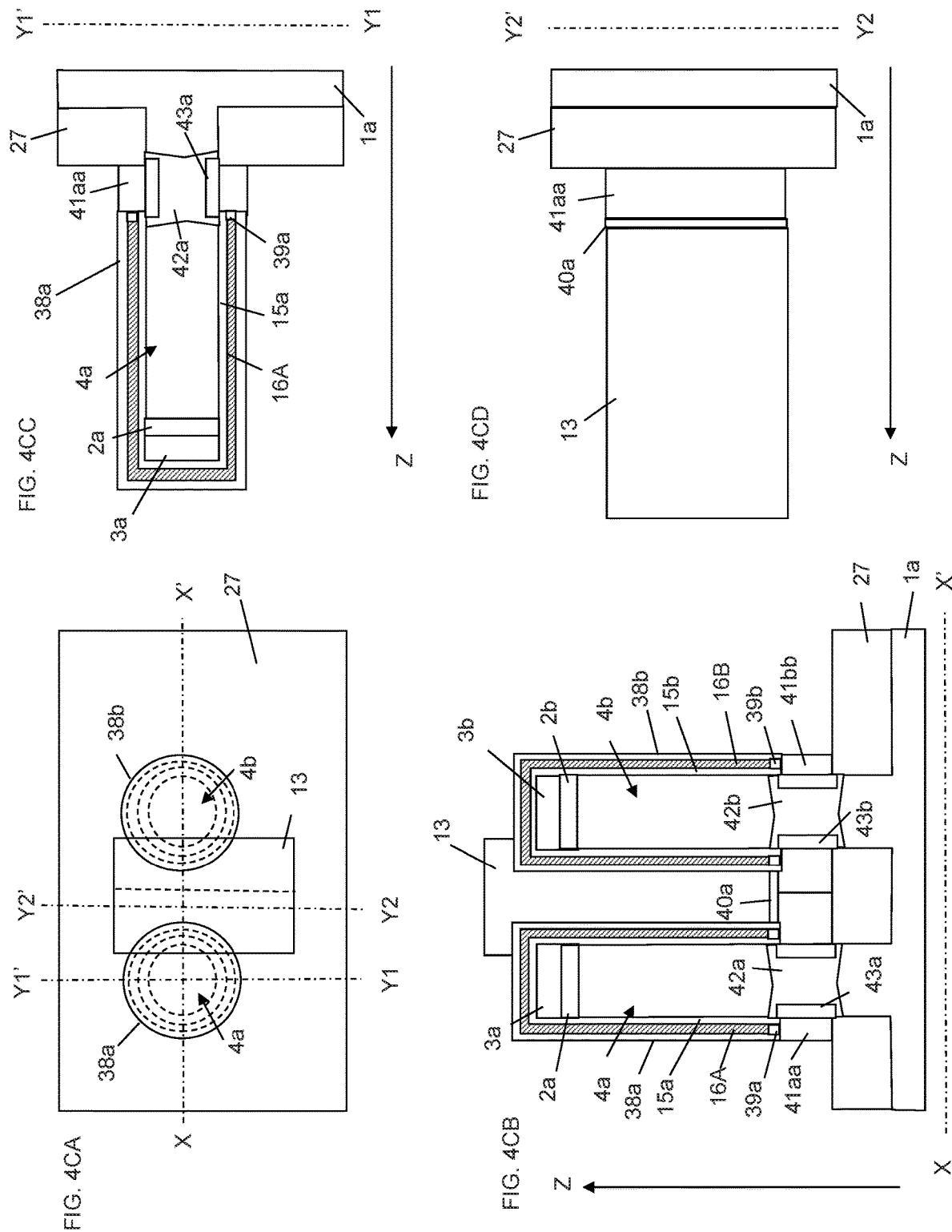

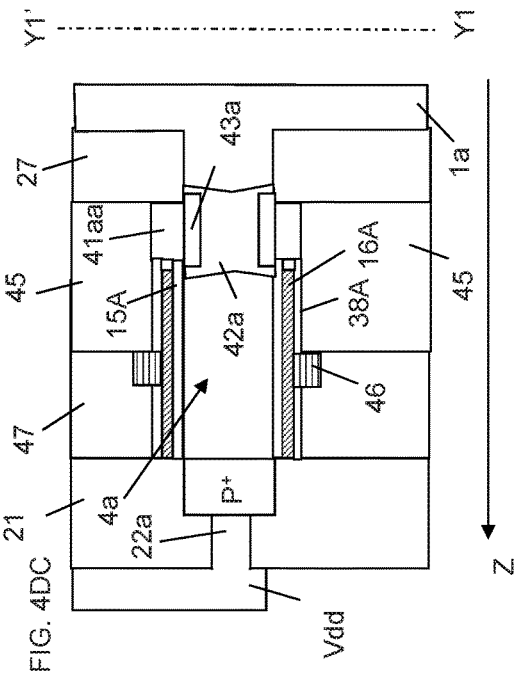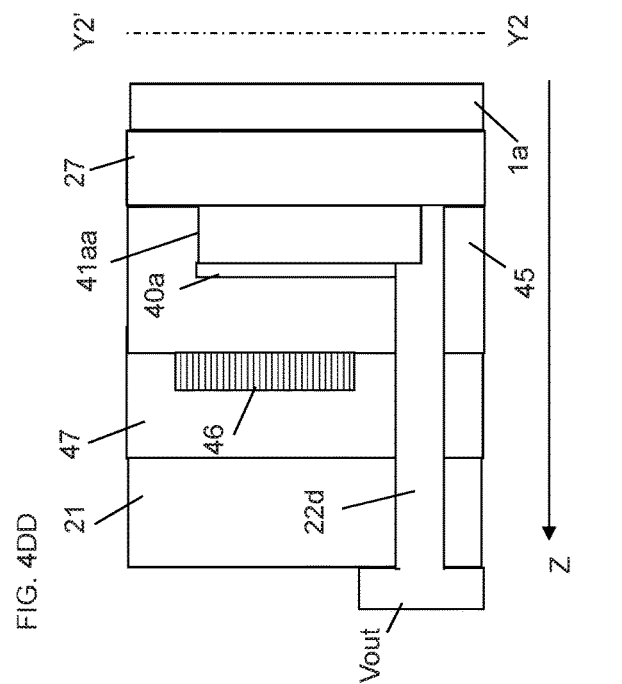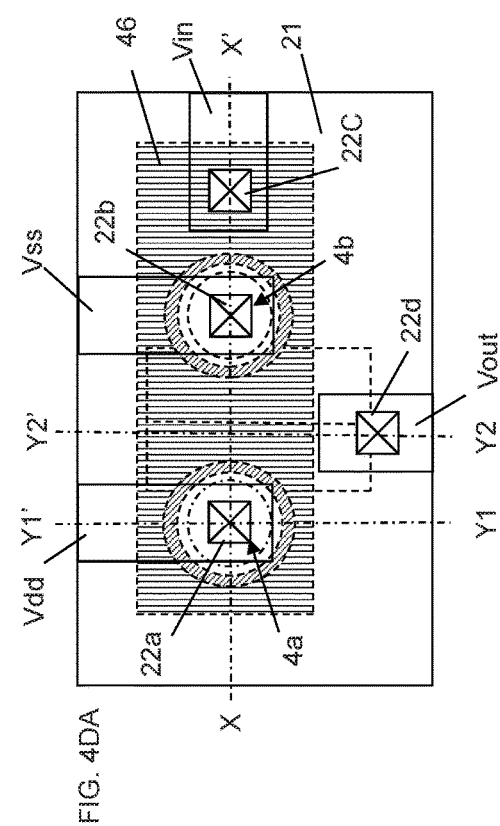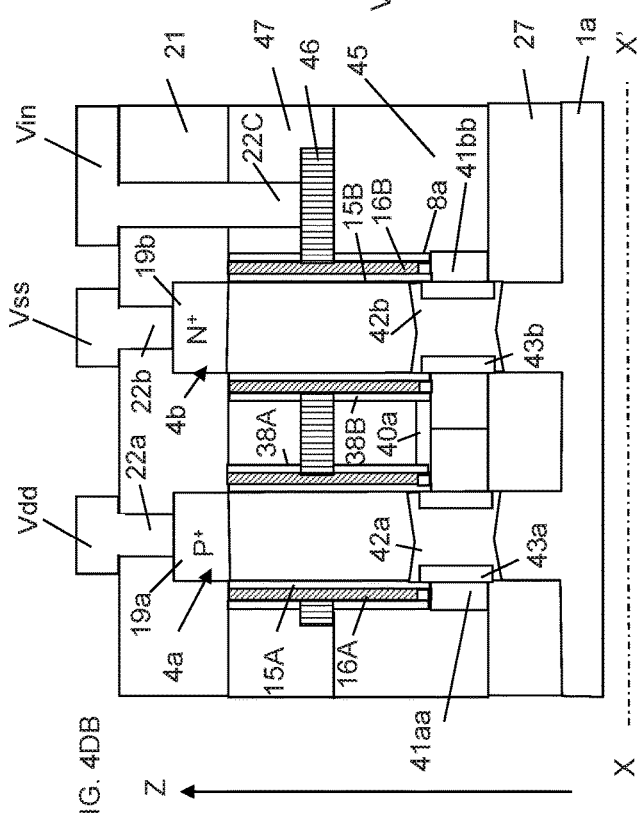

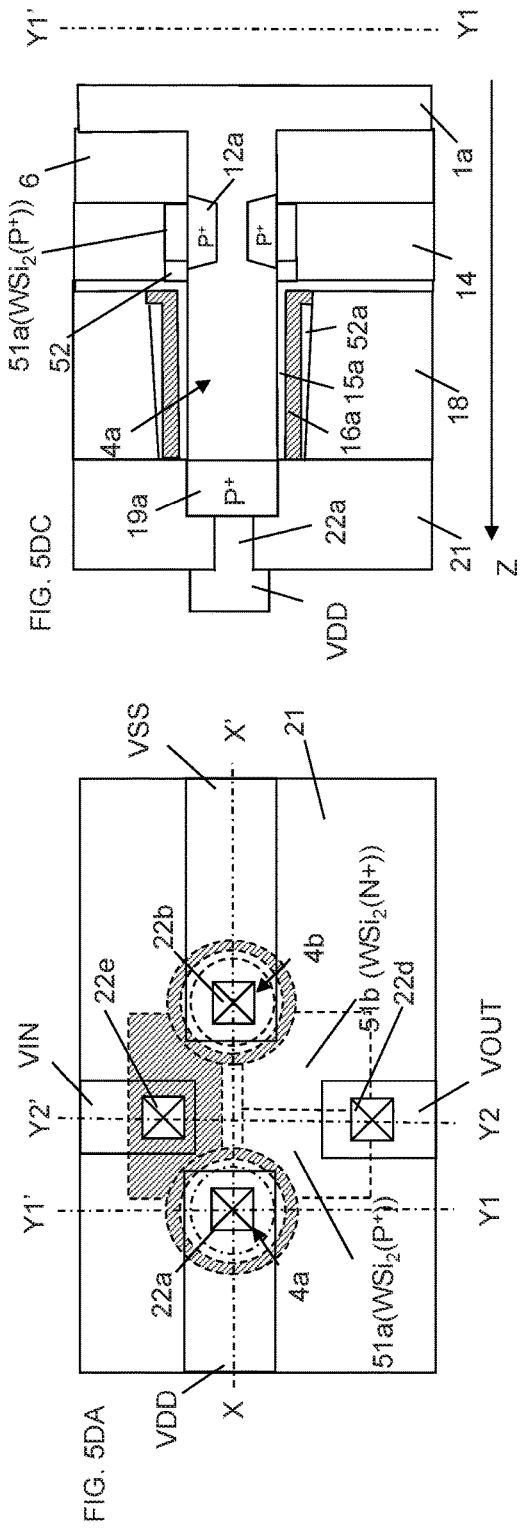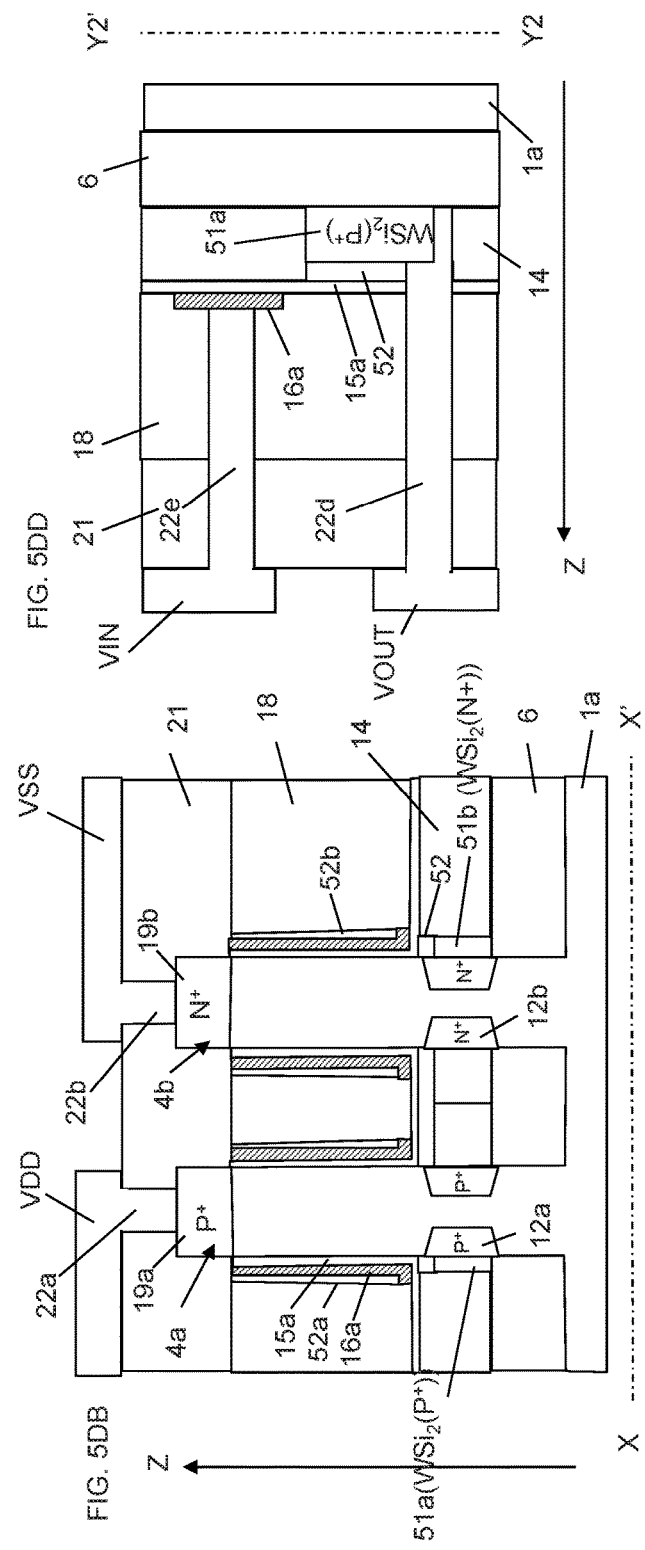

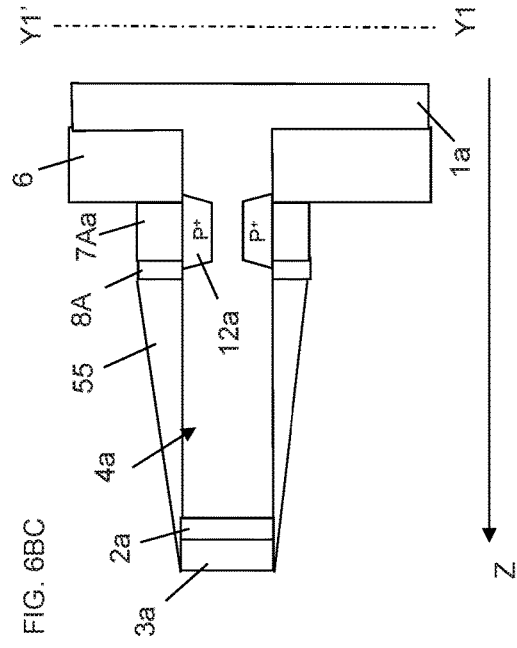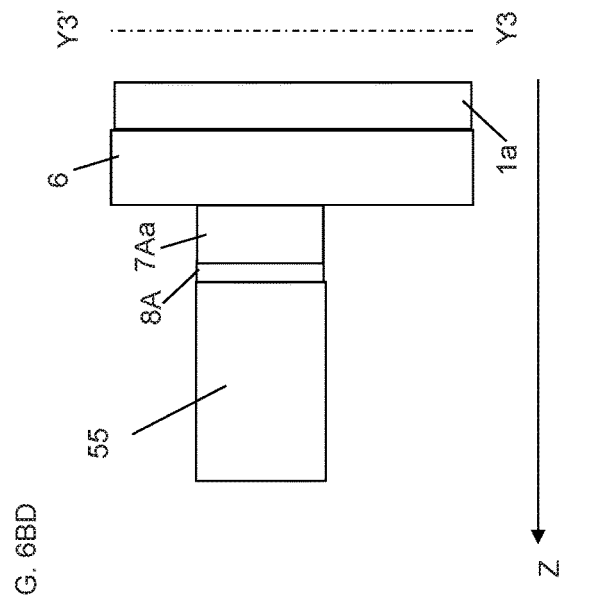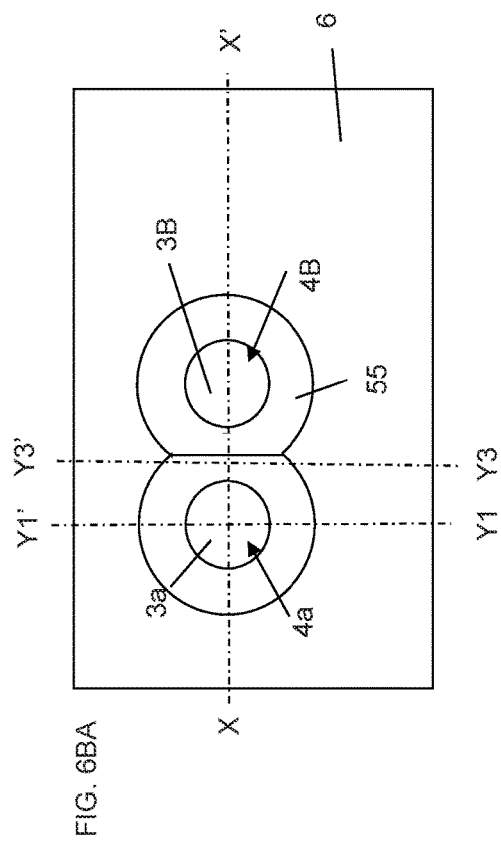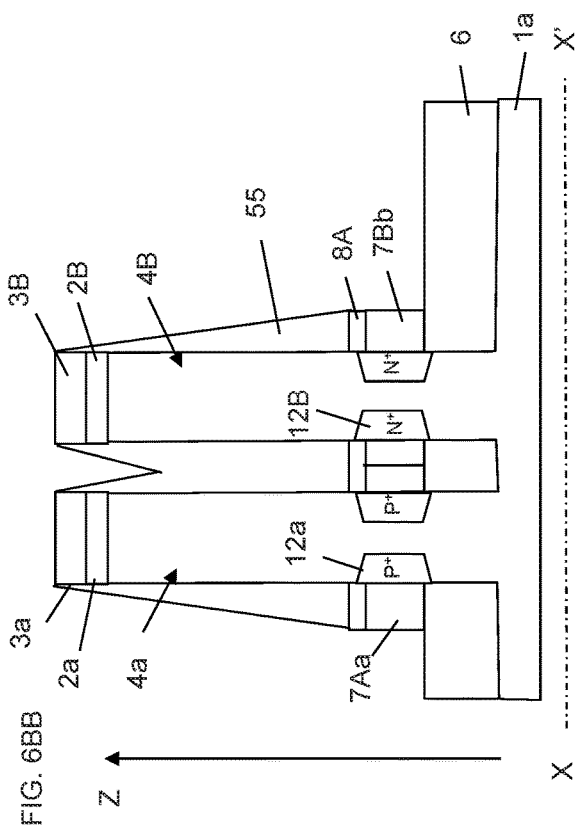

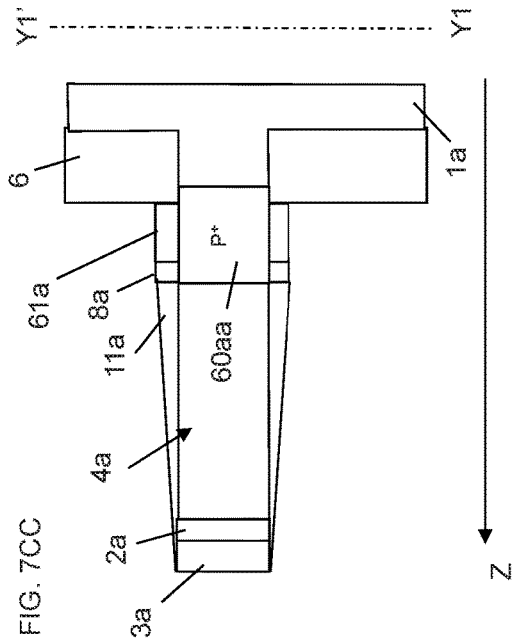
FIG. 7CA
FIG. 7CC
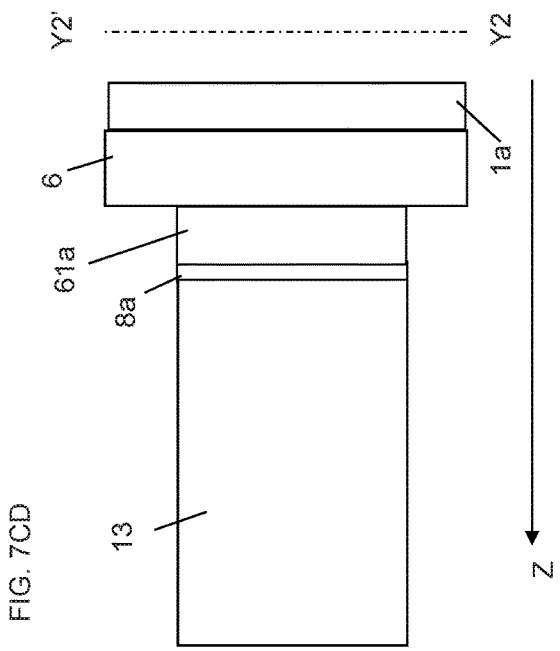
FIG. 7CD
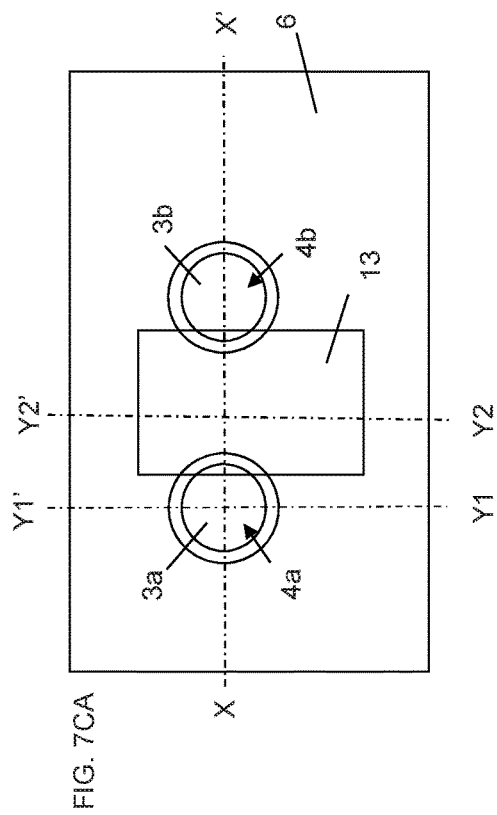
FIG. 7CB
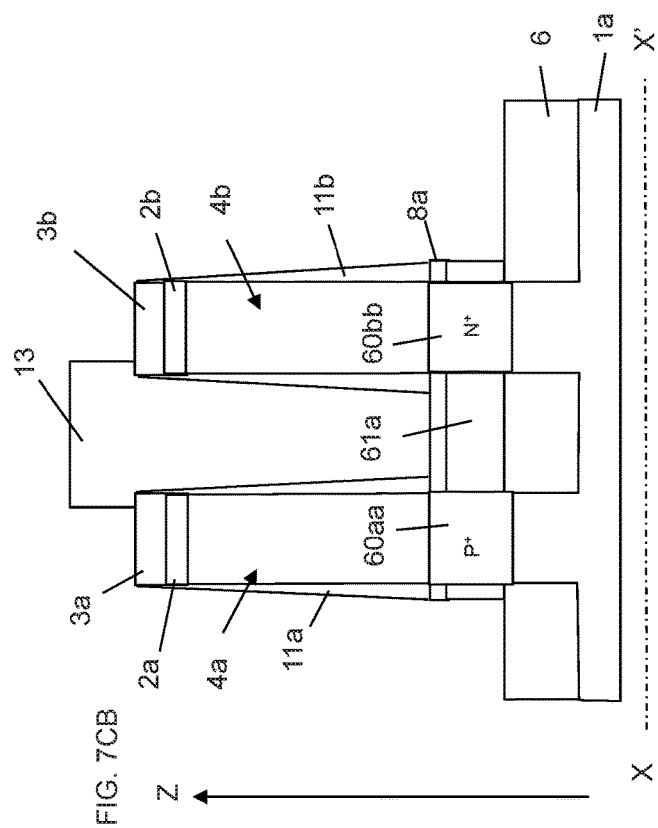

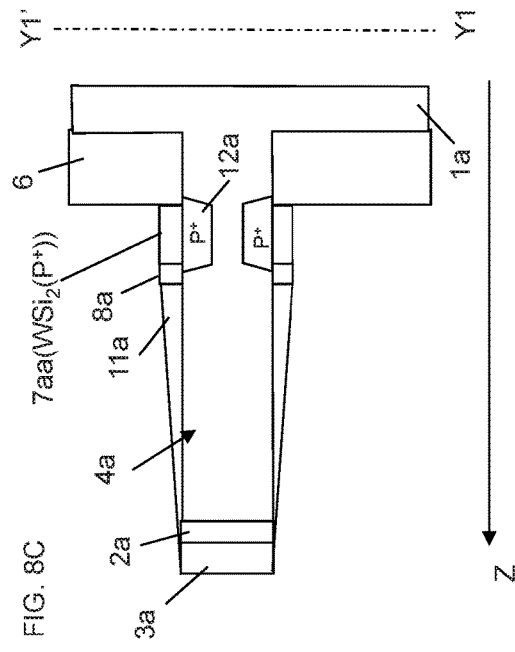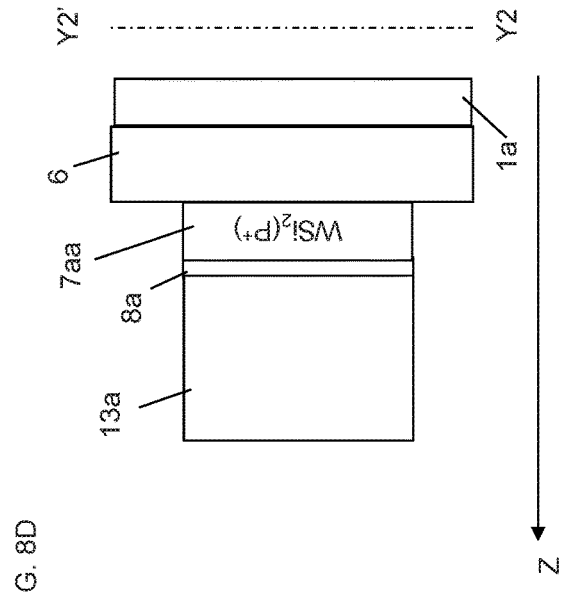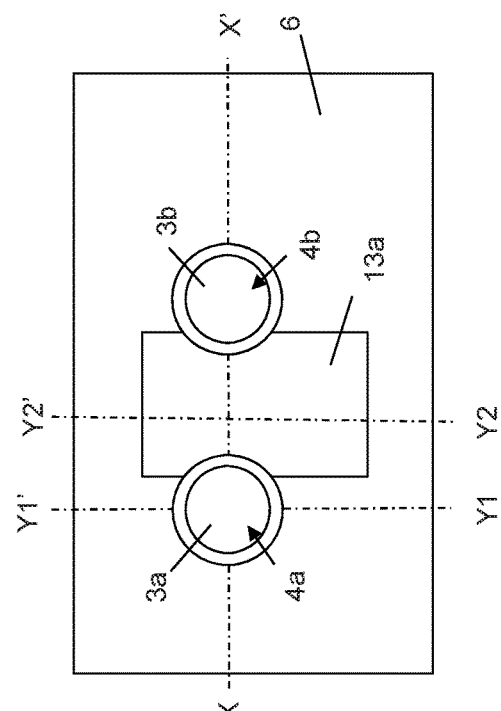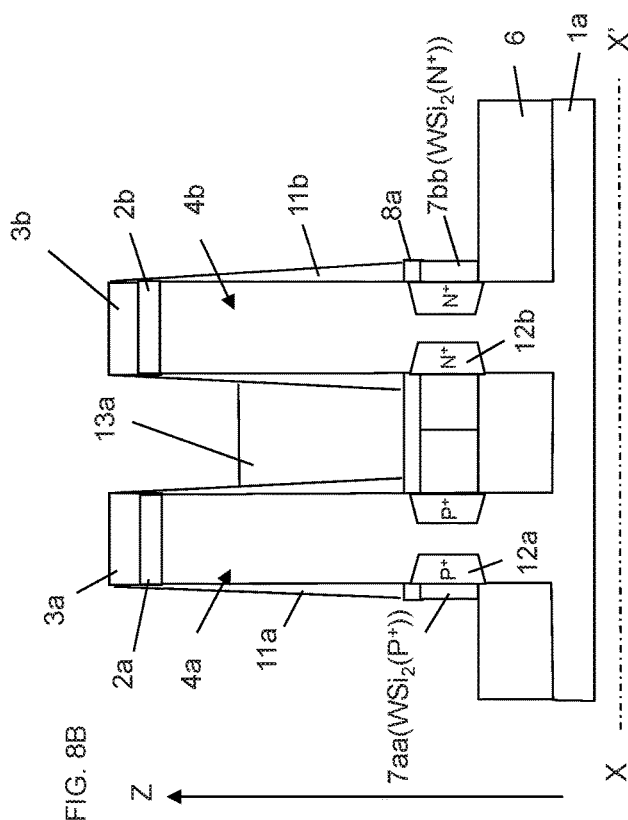

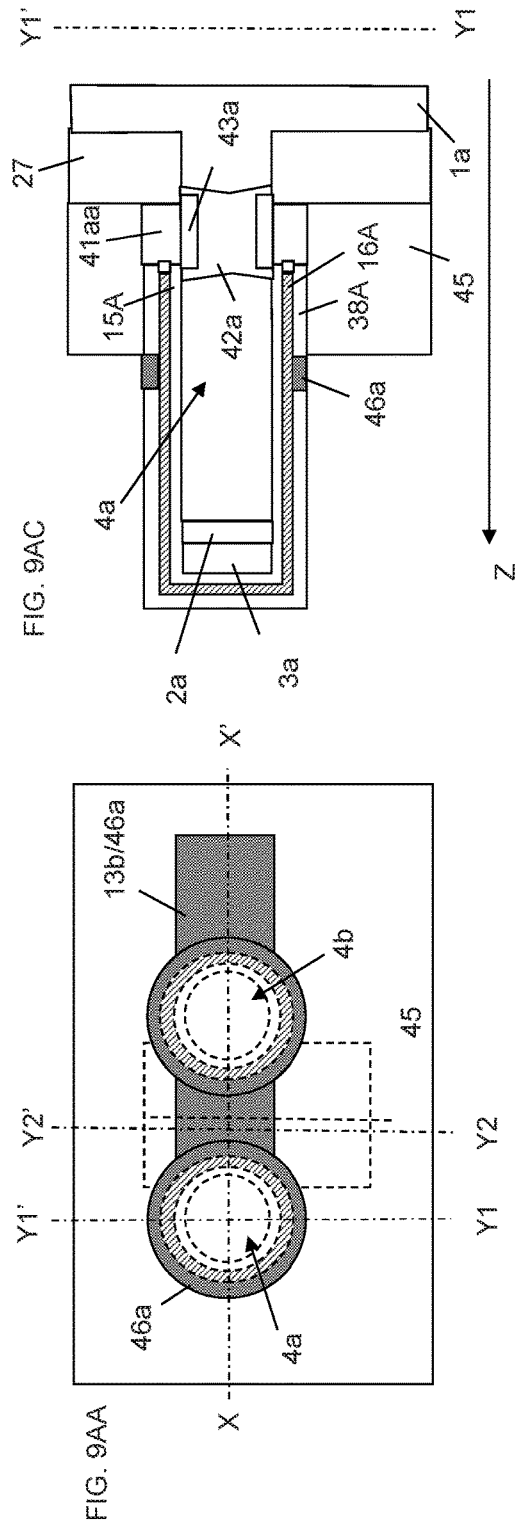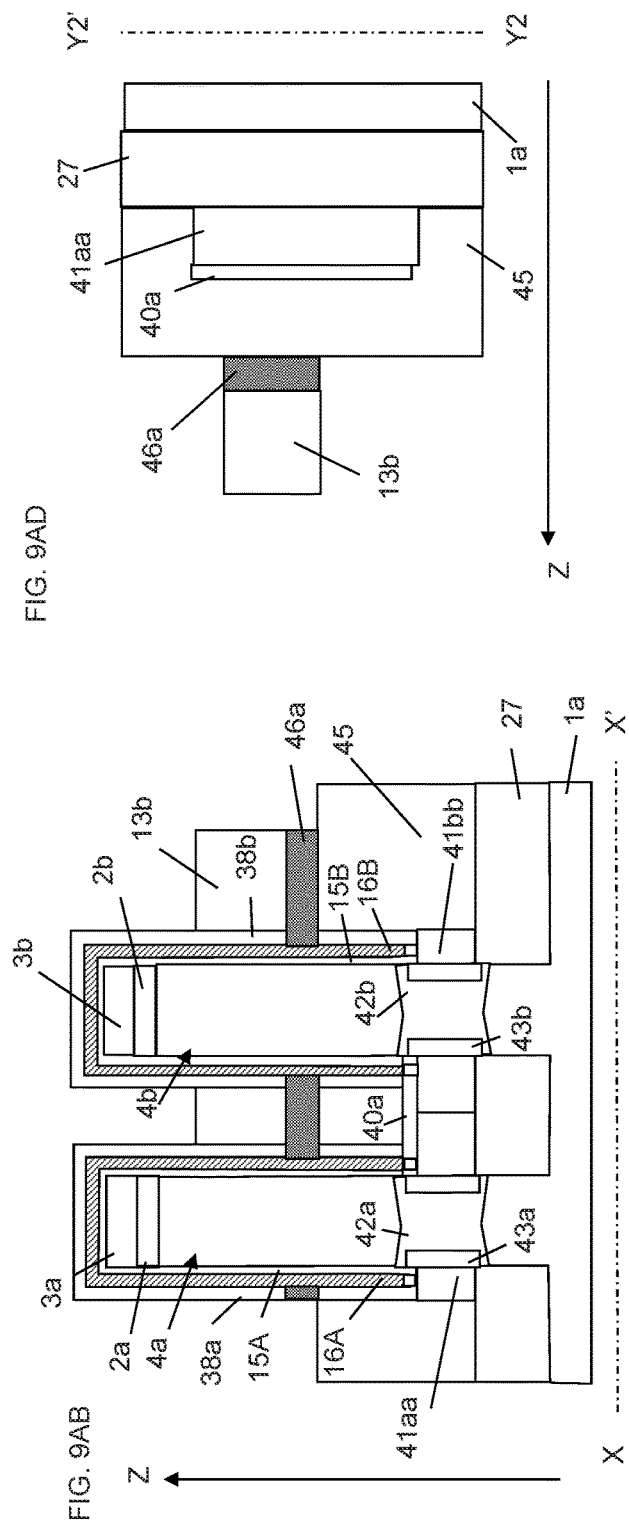

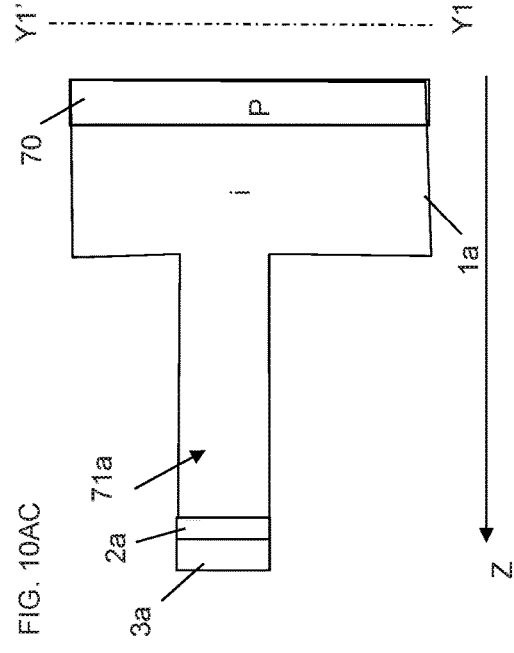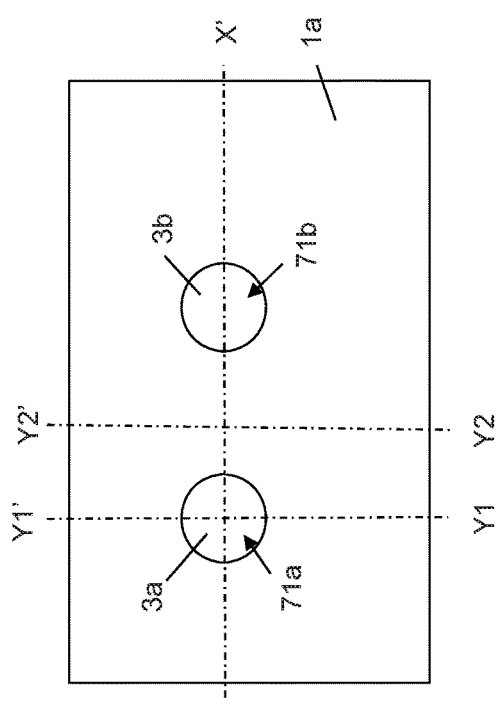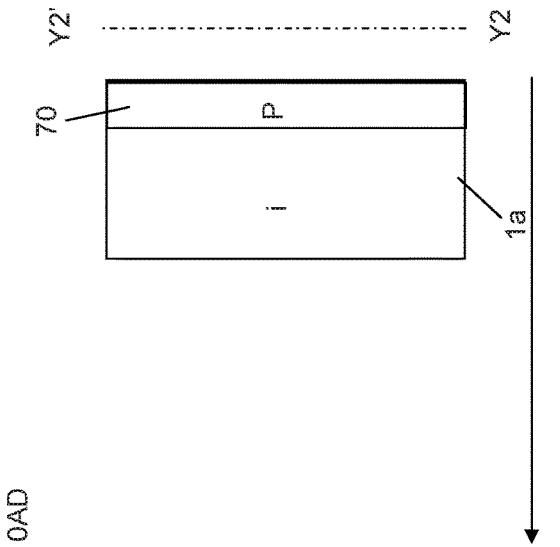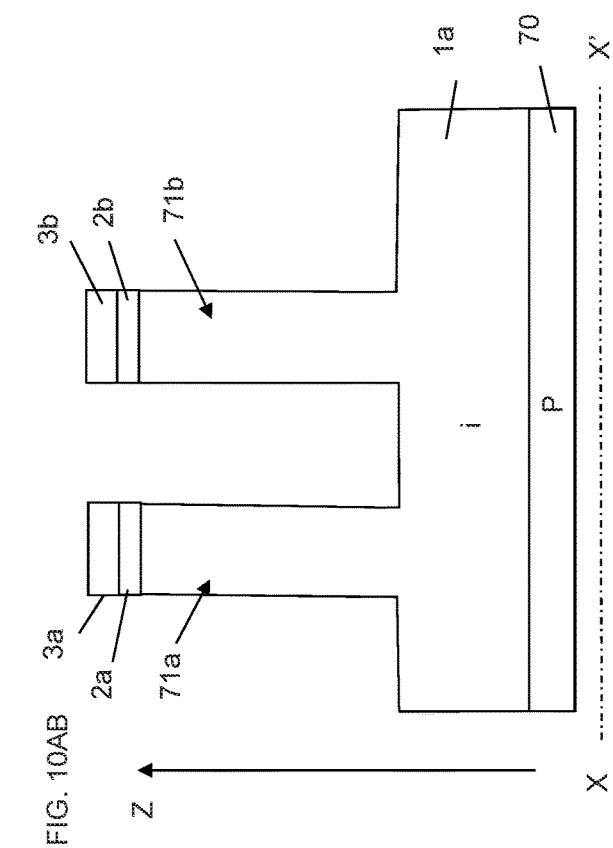

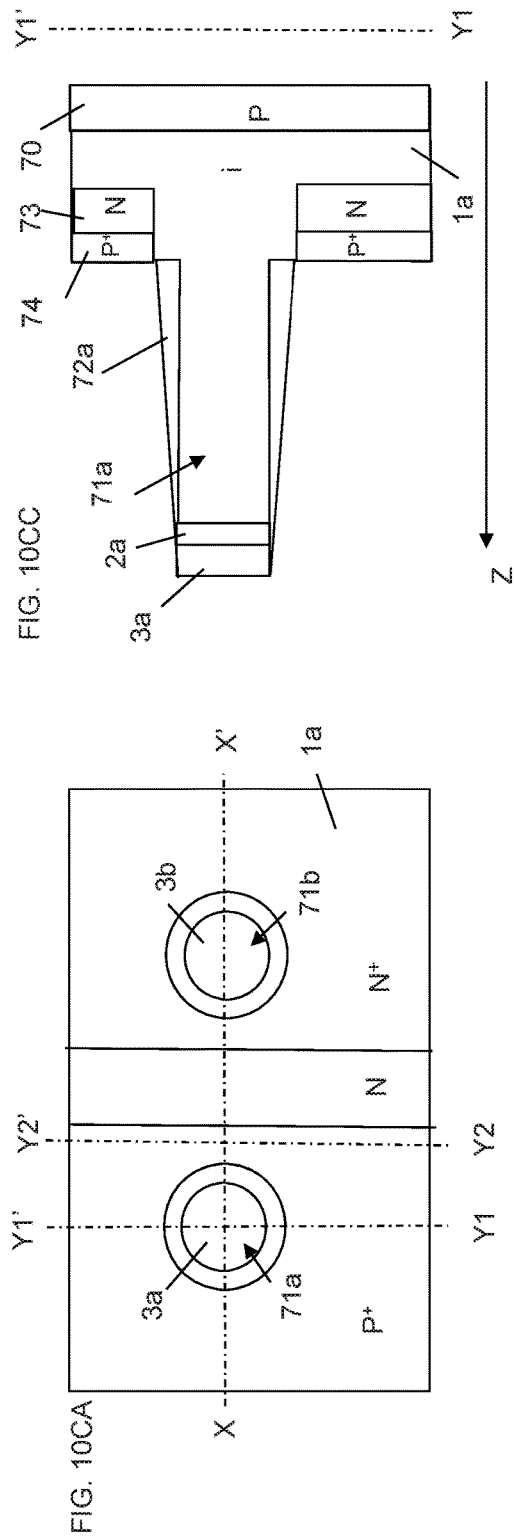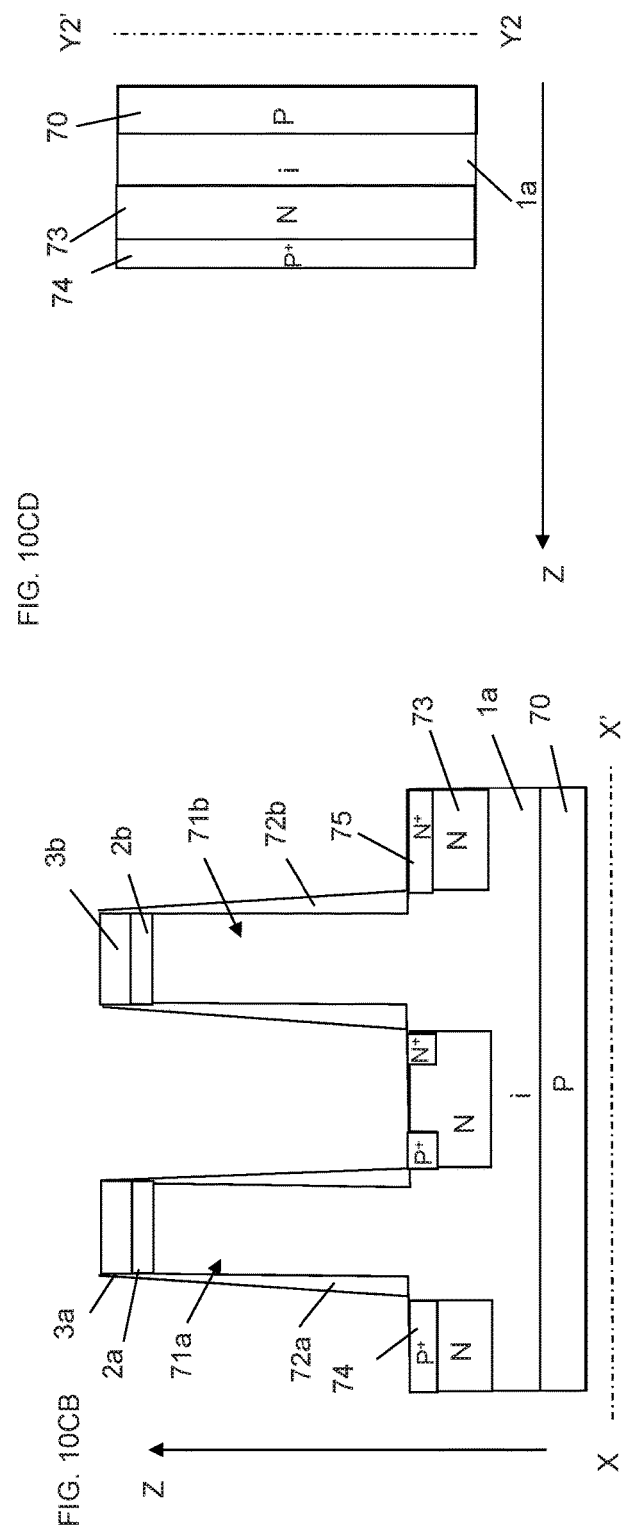

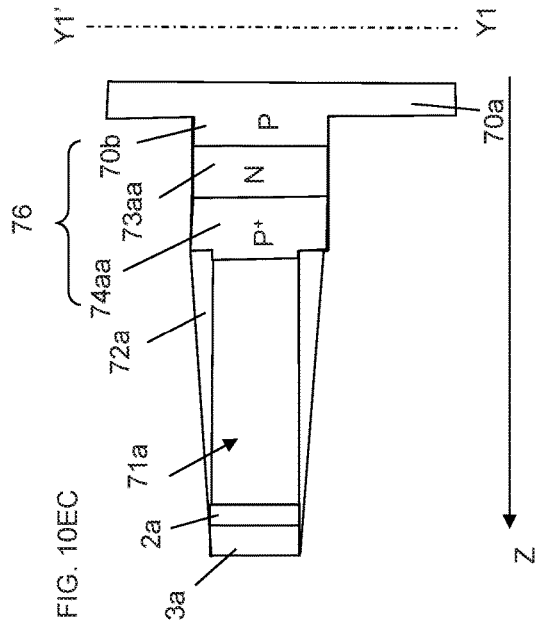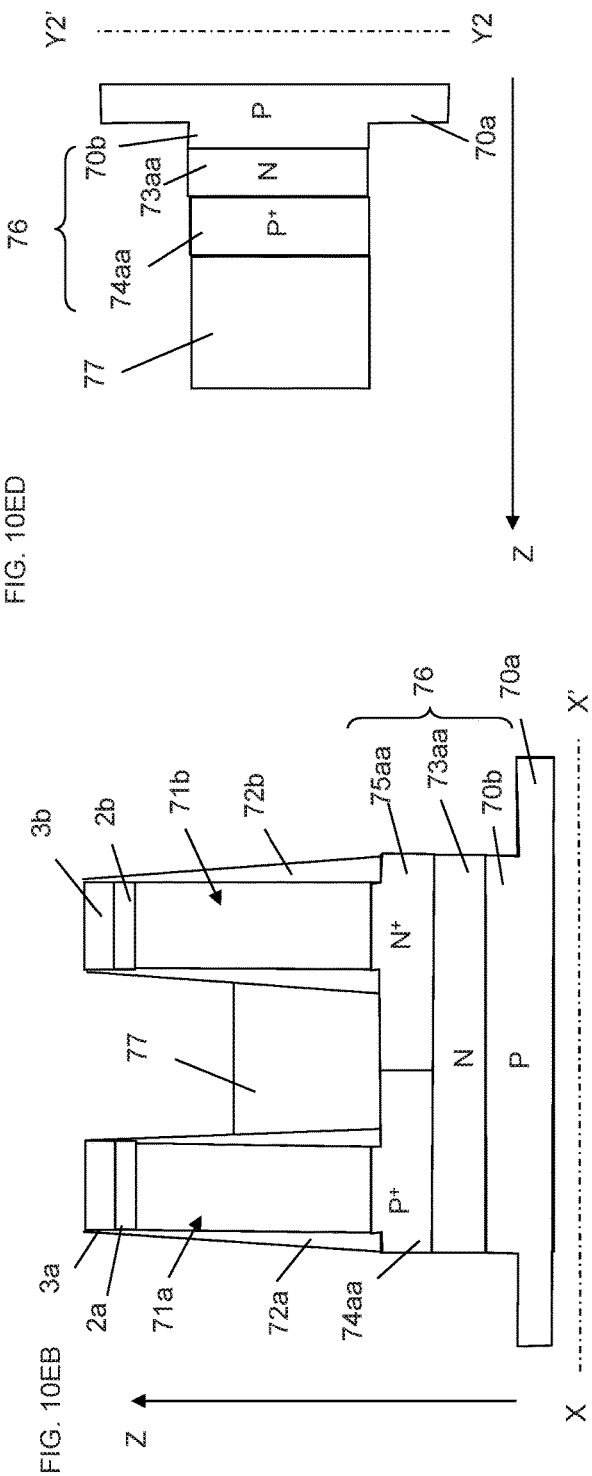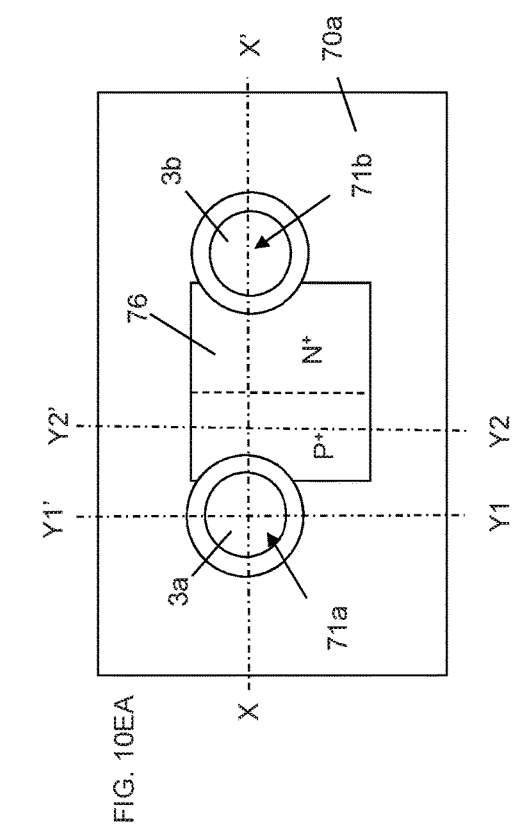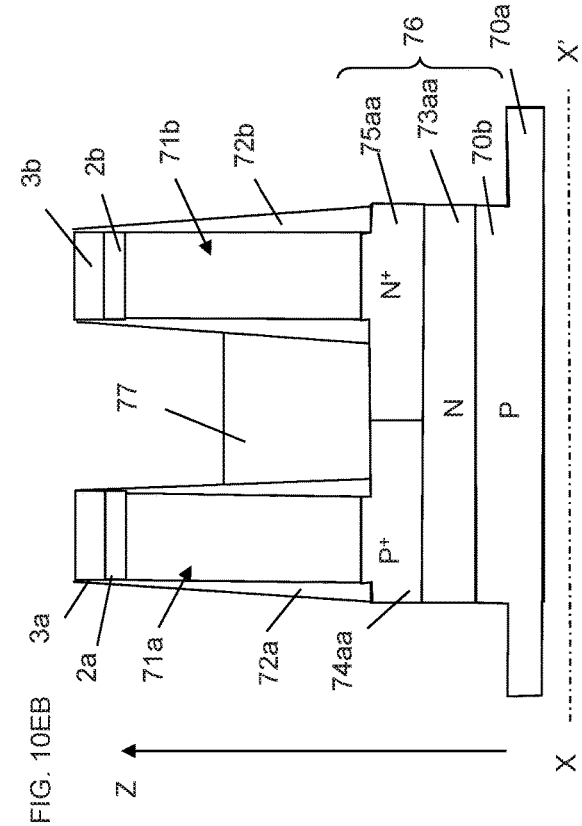

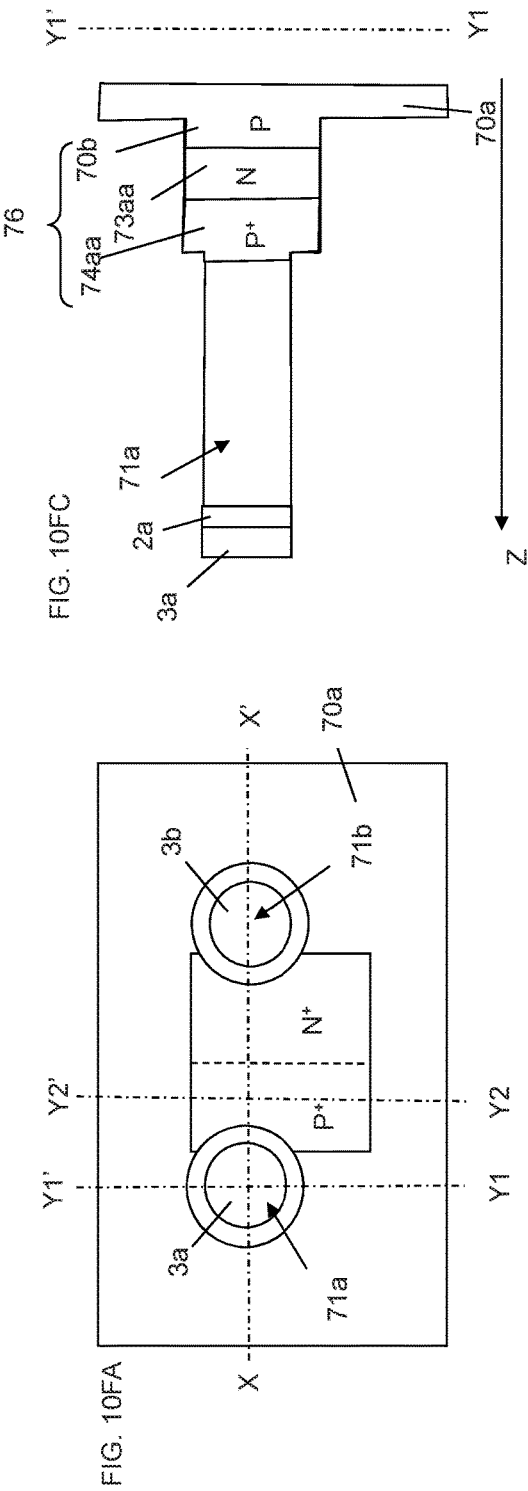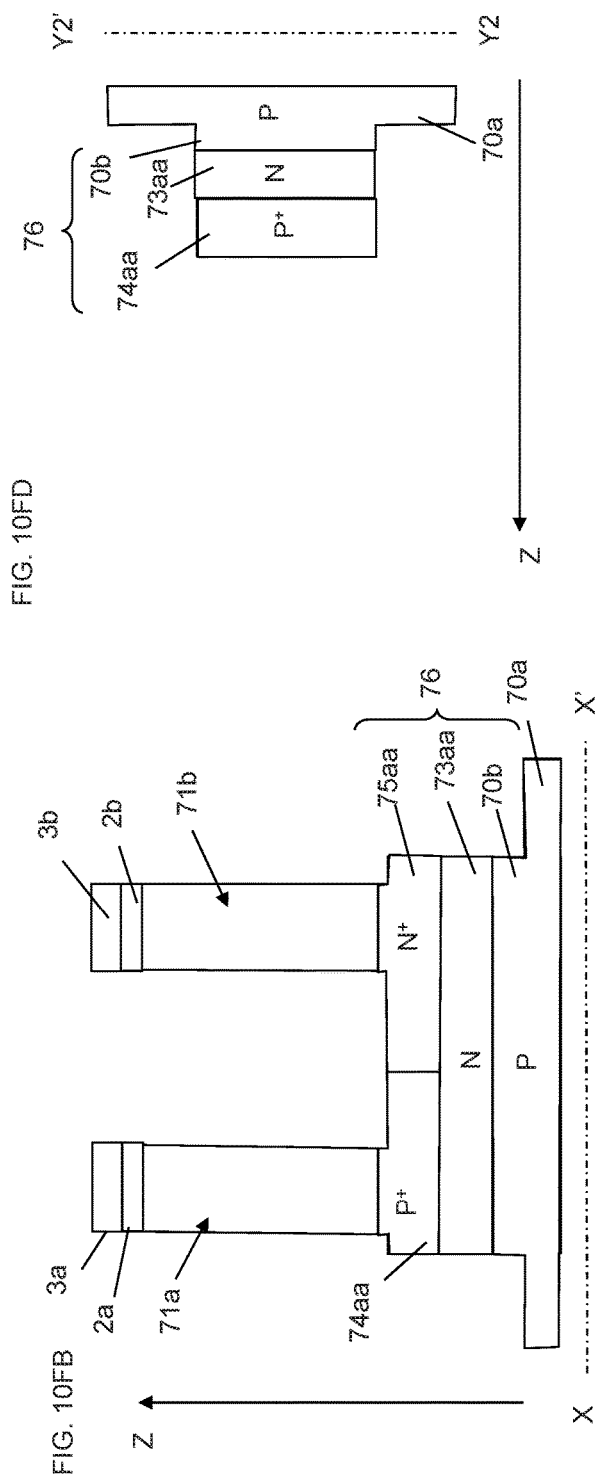

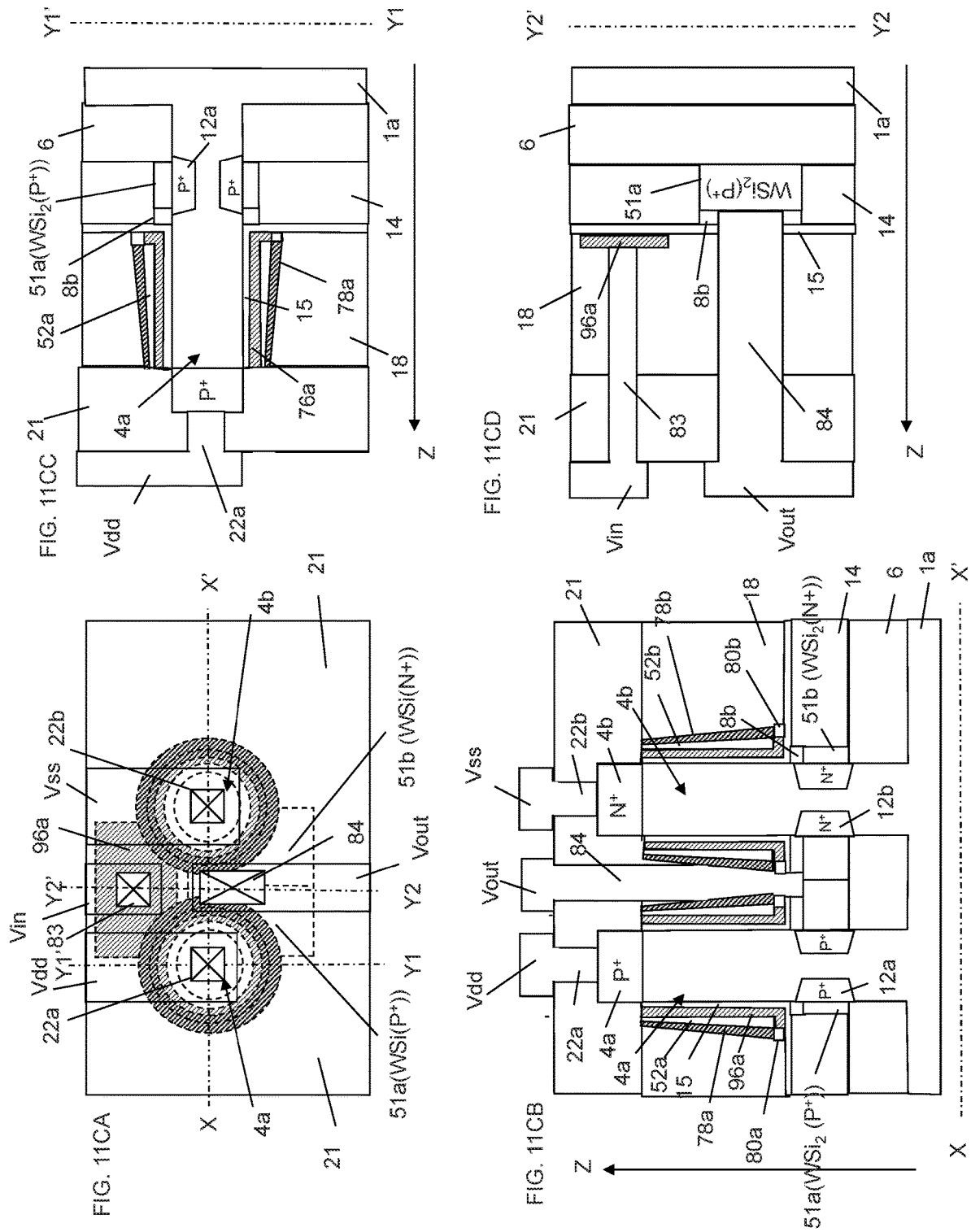

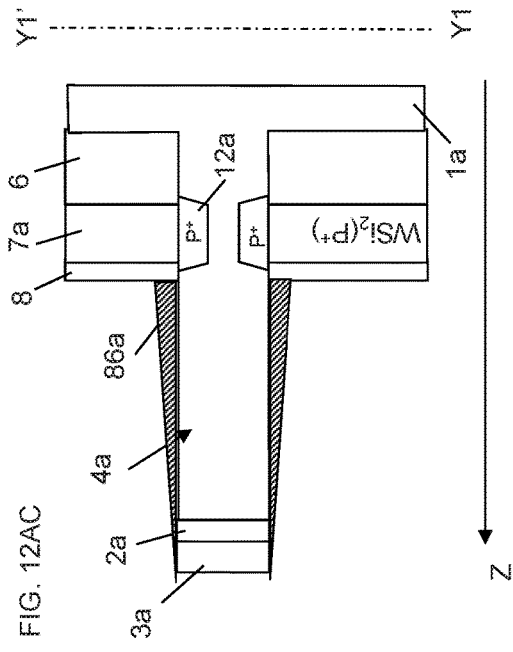
FIG. 12AA
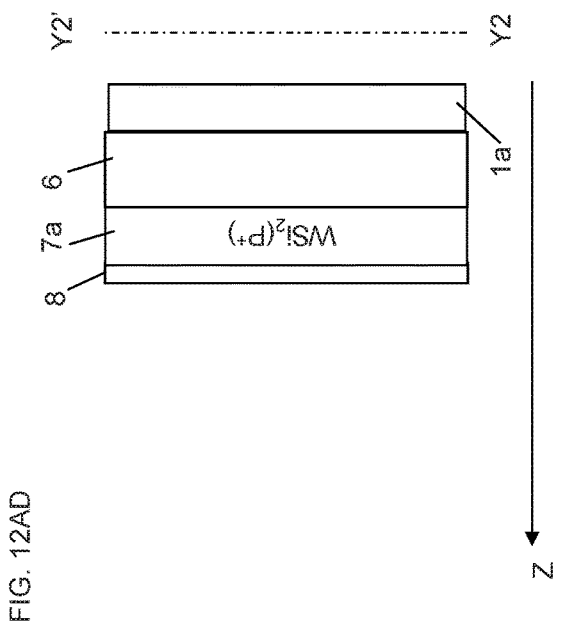
FIG. 12AC
FIG. 12AD
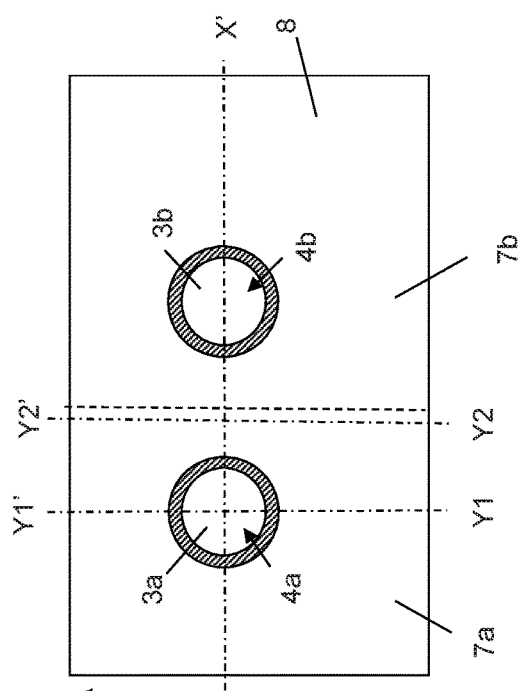
FIG. 12AB
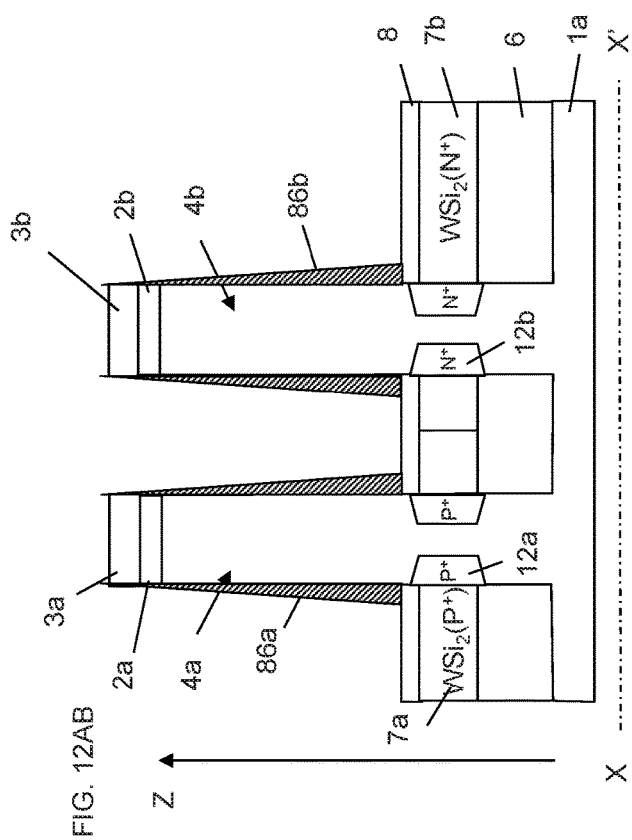

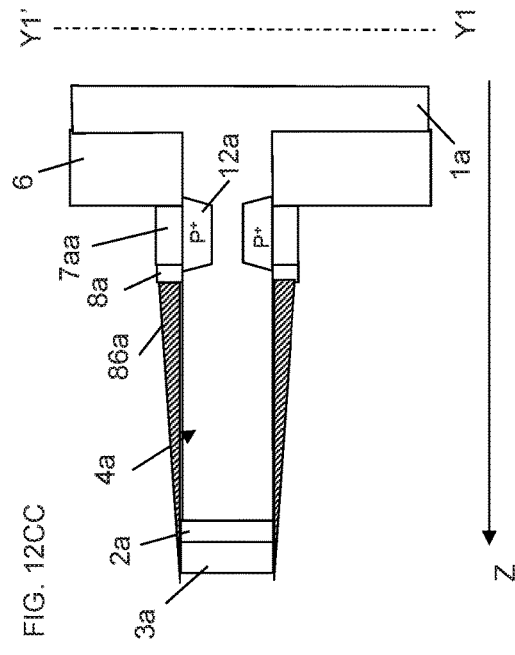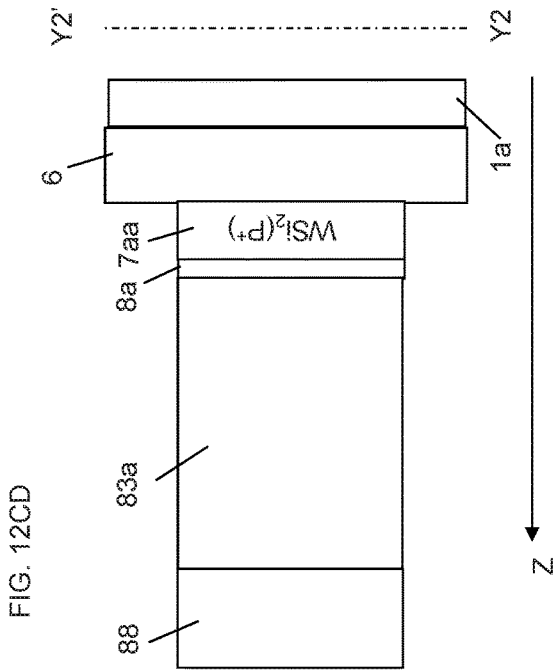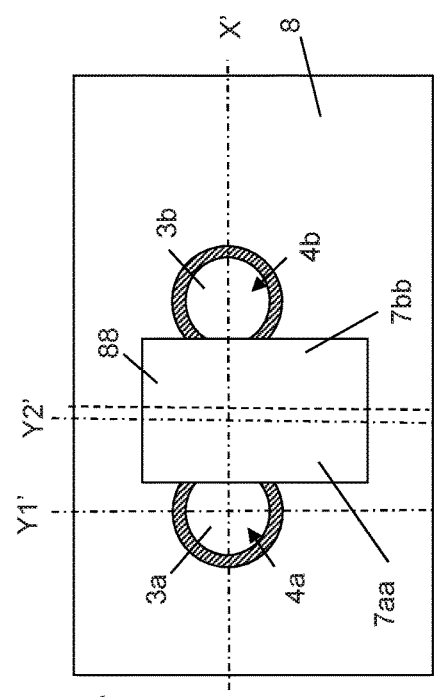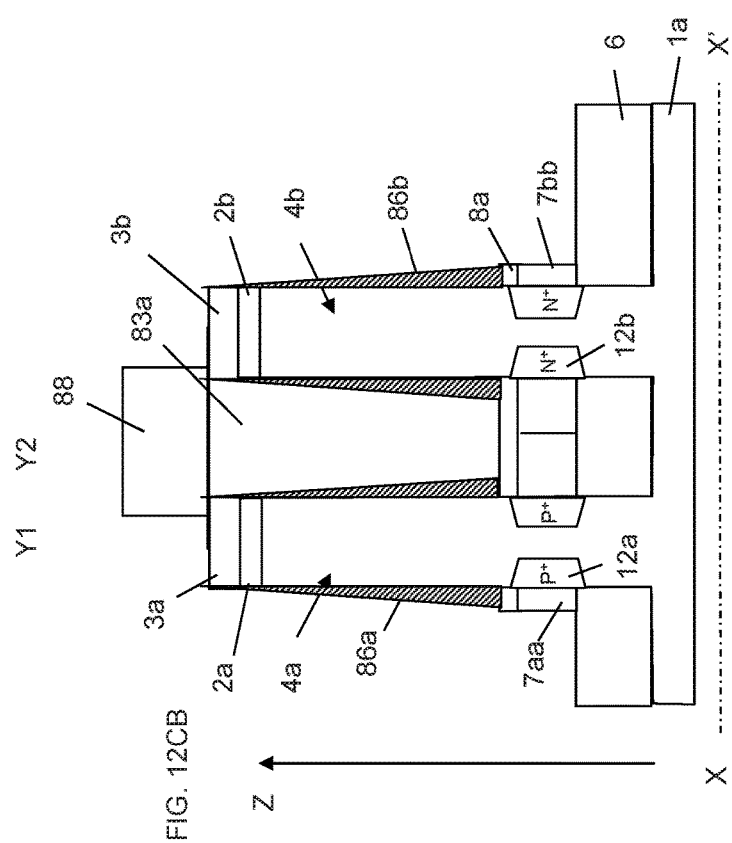

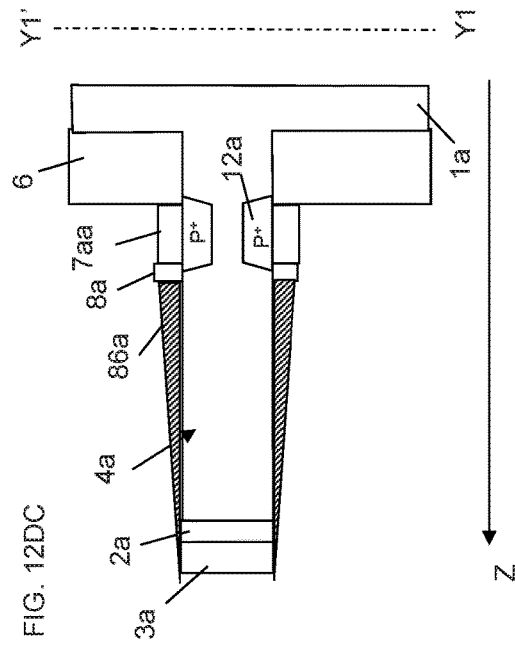
FIG. 12DA
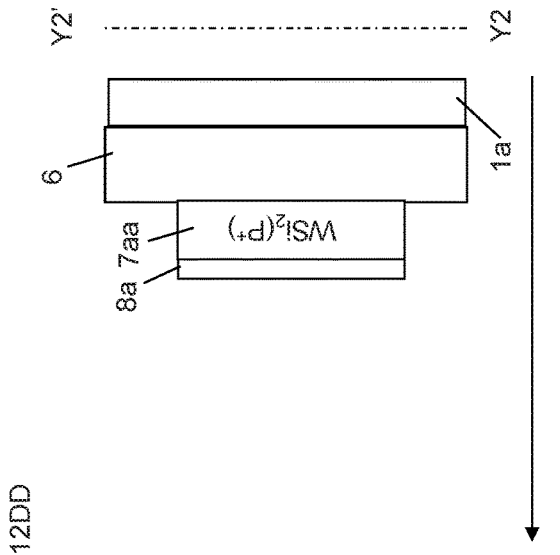
FIG. 12DC
FIG. 12DD
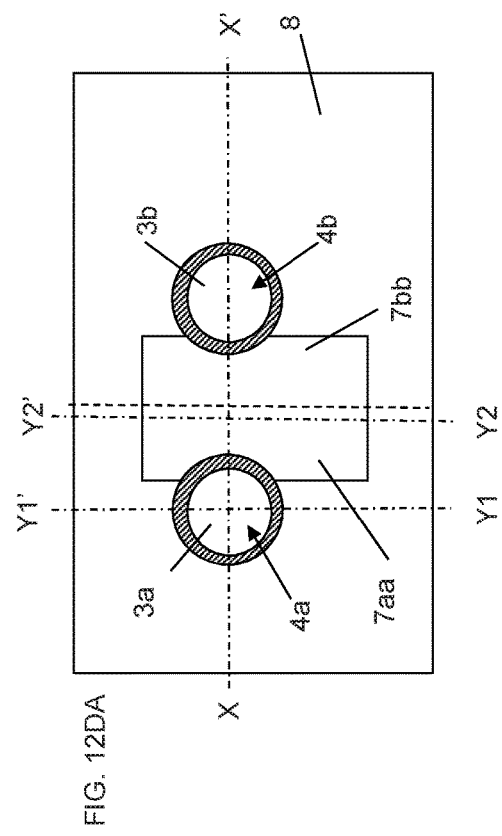
FIG. 12DB
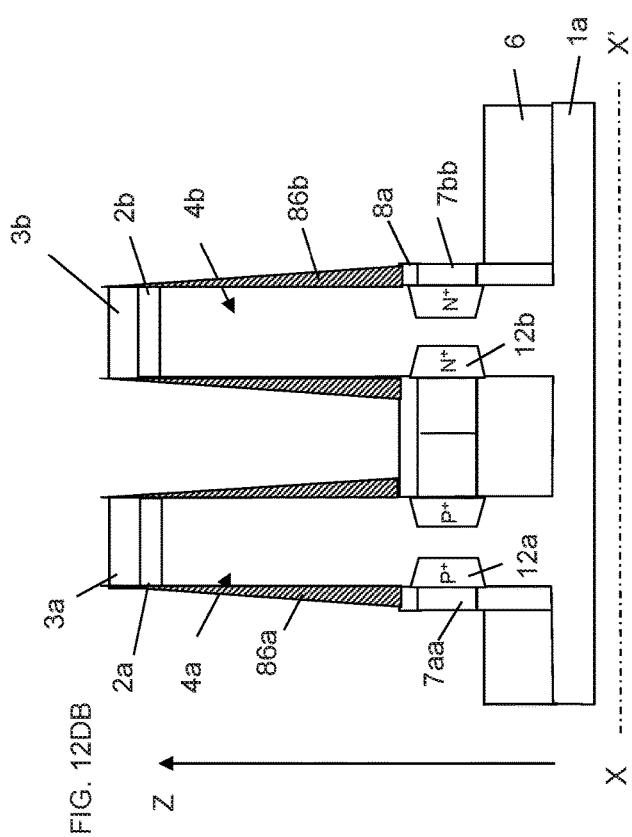

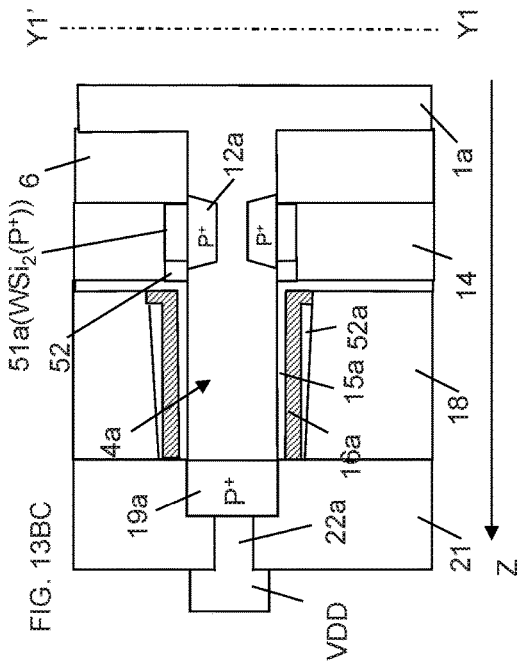
FIG. 13BA
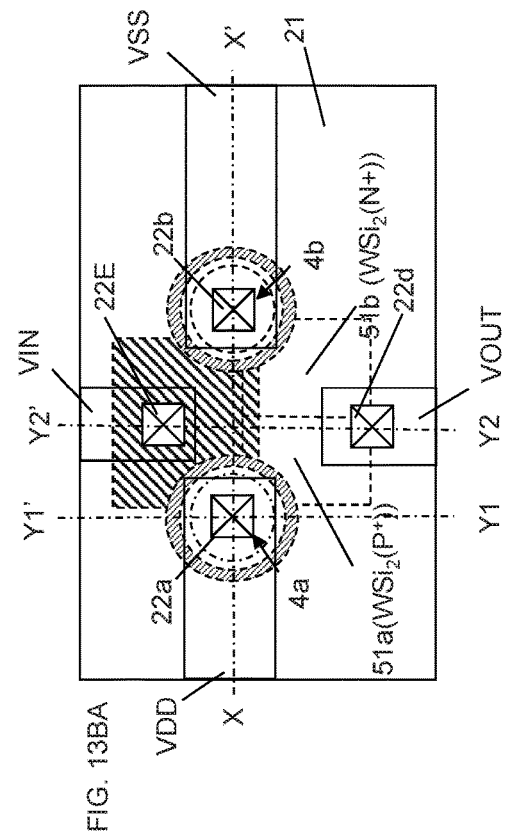
FIG. 13BB
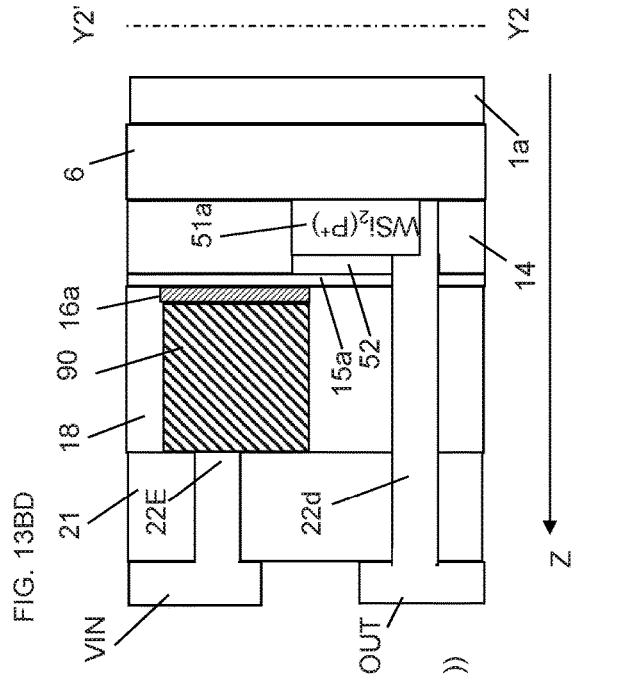
FIG. 13BC
FIG. 13BD
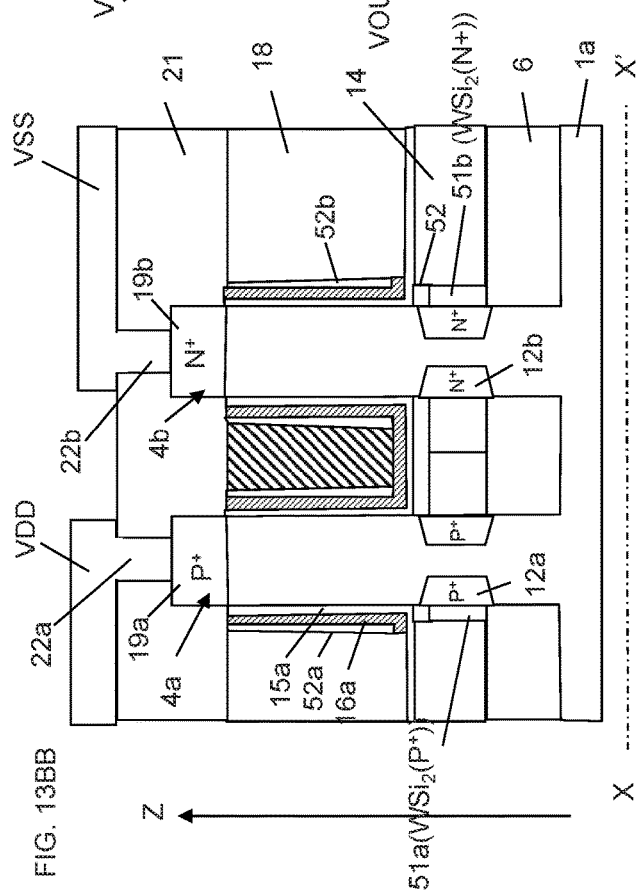

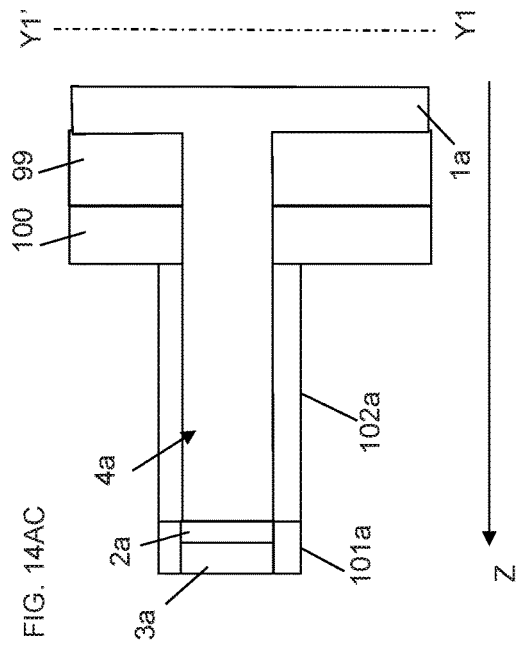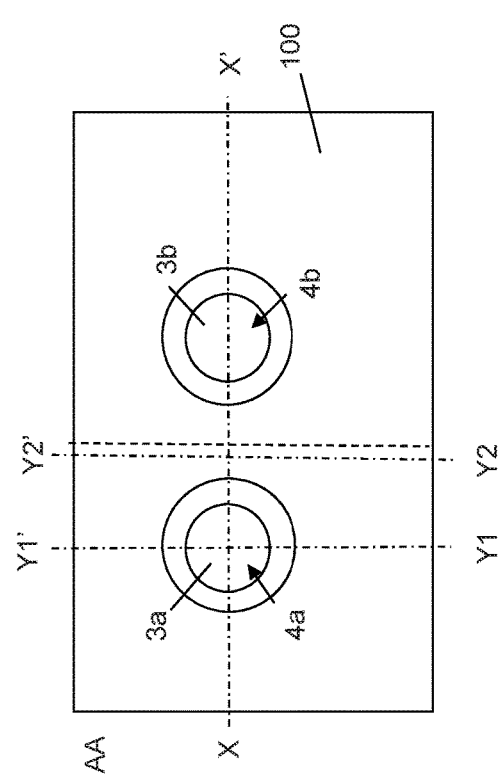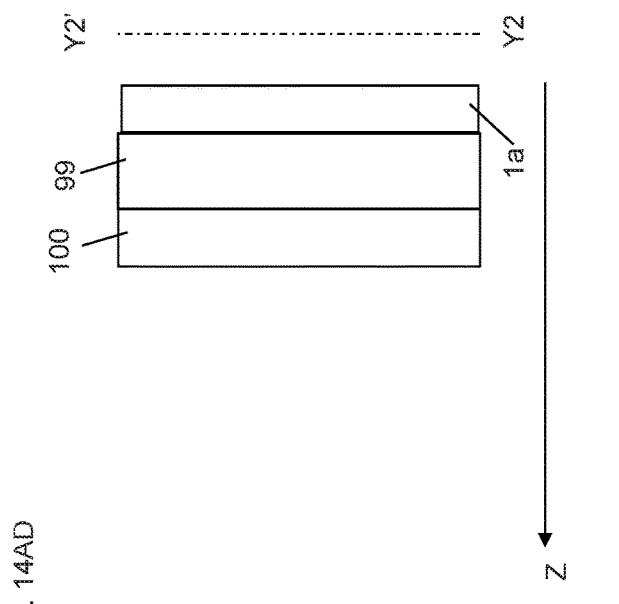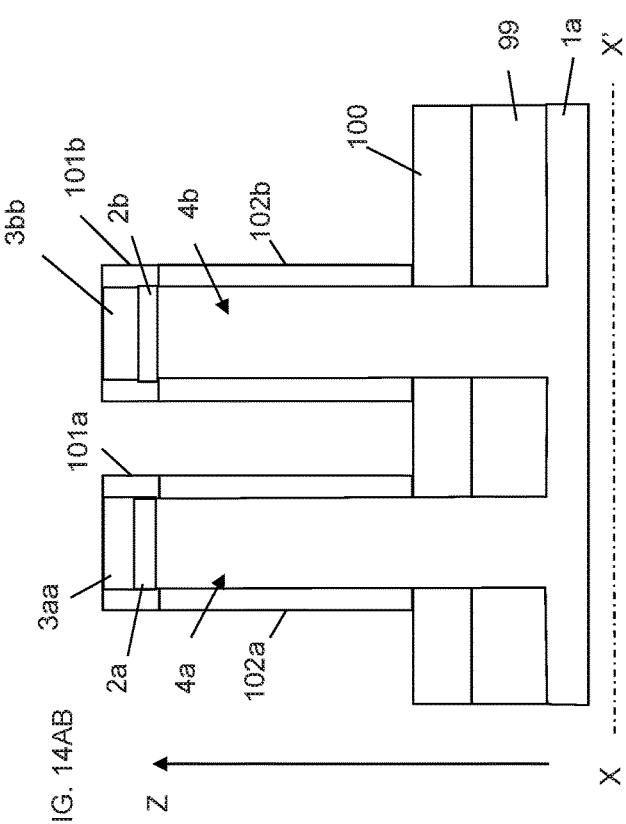

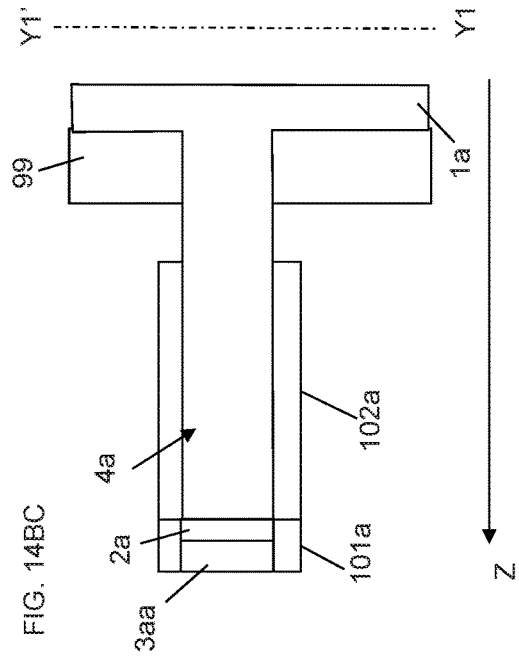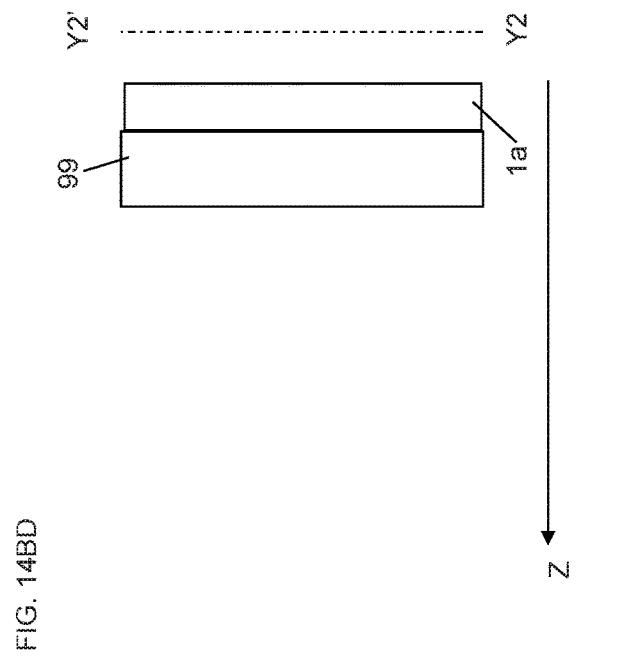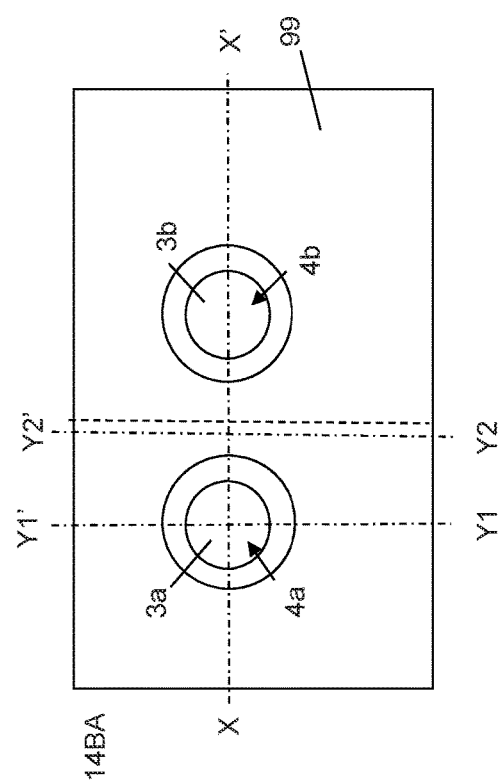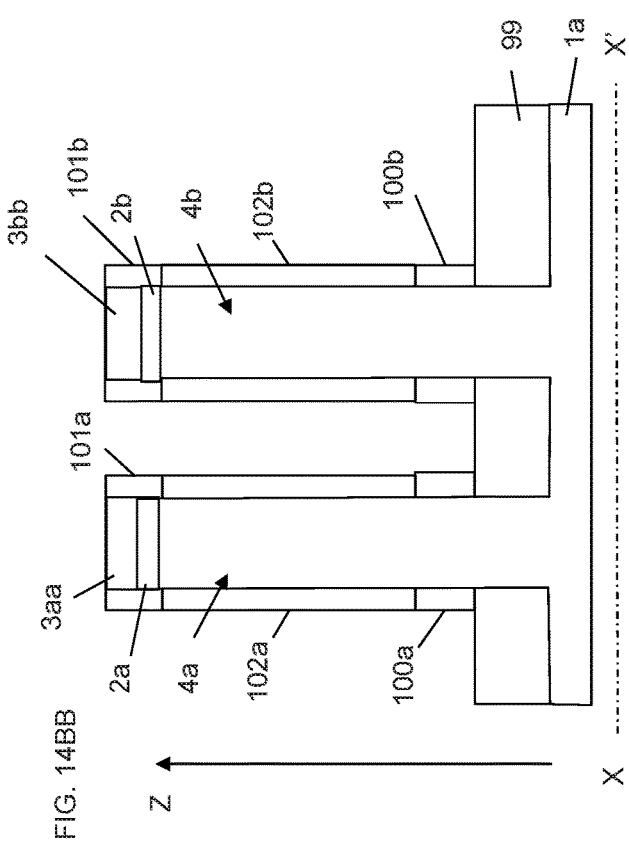

METHOD FOR PRODUCING PILLAR-SHAPED SEMICONDUCTOR DEVICE

CROSS REFERENCES TO RELATED APPLICATIONS

The present application is a continuation application of U.S. patent application Ser. No. 16/241,332, filed Jan. 7, 2019, now U.S. Pat. No. 10,535,756 issued Jan. 14, 2020, which is a continuation-in part application of U.S. patent application Ser. No. 15/976,510, filed May 10, 2018, now U.S. Pat. No. 10,211,340 issued Feb. 19, 2019, which is a continuation of PCT patent application No. PCT/JP2016/085295, filed Nov. 29, 2016, which claims priority to PCT patent application No. PCT/JP2015/085469, filed Dec. 18, 2015. The contents of these applications are incorporated herein by reference in their entirety.

BACKGROUND OF THE INVENTION

1. Field of the Invention

The present invention relates to a method for producing a pillar-shaped semiconductor device.

2. Description of the Related Art

In recent years, semiconductor devices including SGTs have been required to have higher density and higher performance. An SGT stands for a surrounding gate transistor.

In planar MOS transistors, the channel of a P- or N-channel MOS transistor is formed in a horizontal direction along the surface of a semiconductor substrate between the source and the drain. In contrast, the channel of an SGT is formed in a direction vertical to the surface of a semiconductor substrate (e.g., refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)).

FIG. 15 illustrates a schematic structure of an N-channel SGT. $N^+$ regions 116a and 116b are formed in a lower portion and an upper portion of a P-type or i-type (intrinsic) Si pillar 115 (hereafter a silicon semiconductor pillar is referred to as a "Si pillar"). When one of the $N^+$ regions 116a and 116b functions as a source, the other functions as a drain. A portion of the Si pillar 115 between the source and drain $N^+$ regions 116a and 116b is a channel region 117. A gate insulating layer 118 is formed so as to surround the channel region 117, and a gate conductor layer 119 is formed so as to surround the gate insulating layer 118. In an SGT, the source and drain N+ regions 116a and 116b, the channel region 117, the gate insulating layer 118, and the gate conductor layer 119 are formed in a single Si pillar 115. Therefore, the area of the surface of the SGT appears to be equal to the area of one source or drain $N^+$ region of a planar MOS transistor. Thus, circuit chips including SGTs can achieve further chip-size reduction compared with circuit chips including planar MOS transistors.

FIG. 16 is a sectional view of a CMOS inverter circuit including SGTs (e.g., refer to FIG. 38(b) in U.S. Patent Application Publication No. 2010/0264484).

In this CMOS inverter circuit, an i layer 121 (the "i layer" refers to an intrinsic Si layer) is formed on an insulating layer substrate 120, and a Si pillar SP1 for a P-channel SGT and a Si pillar SP2 for an N-channel SGT are formed on the i layer 121.

A drain $P^+$ region 122 of the P-channel SGT is formed in the same layer as the i layer 121 so as to surround a lower portion of the Si pillar SP1 in plan view. A drain $N^+$ region 123 of the N-channel SGT is formed in the same layer as the i layer 121 so as to surround a lower portion of the Si pillar SP2 in plan view.

A source $P^+$ region 124 of the P-channel SGT is formed in a top portion of the Si pillar SP1, and a source $N^+$ region 125 of the N-channel SGT is formed in a top portion of the Si pillar SP2.

Gate insulating layers 126a and 126b are formed on upper surfaces of the $P^+$ region 122 and N+ region 123 so as to extend along and surround the Si pillars SP1 and SP2. A gate conductor layer 127a of the P-channel SGT and a gate conductor layer 127b of the N-channel SGT are formed so as to surround the gate insulating layers 126a and 126b.

Sidewall nitride films 128a and 128b serving as insulating layers are formed so as to surround the gate conductor layers 127a and 127b. Similarly, sidewall nitride films 128c and 128d serving as insulating layers are formed so as to surround a $P^+$ region and an $N^+$ region in top portions of the Si pillars SP1 and SP2.

The drain $P^+$ region 122 of the P-channel SGT and the drain $N^+$ region 123 of the N-channel SGT are connected to each other through a silicide layer 129b. A silicide layer 129a is formed on the source $P^+$ region 124 of the P-channel SGT, and a silicide layer 129c is formed on the source $N^+$ region 125 of the N-channel SGT. Furthermore, silicide layers 129d and 129e are formed in top portions of the gate conductor layers 127a and 127b.

An i layer 130a of the Si pillar SP1 that lies between the $P^+$ regions 122 and 124 functions as a channel of the P-channel SGT. An i layer 130b of the Si pillar SP2 that lies between the $N^+$ regions 123 and 125 functions as a channel of the N-channel SGT.

A $SiO_2$ layer 131 is formed so as to cover the insulating layer substrate 120, the i layer 121, and the Si pillars SP1 and SP2. Furthermore, contact holes 132a, 132b, and 132c are formed so as to extend through the $SiO_2$ layer 131. The contact hole 132a is formed on the Si pillar SP1, the contact hole 132c is formed on the Si pillar SP2, and the contact hole 132b is formed on the drain $P^+$ region 122 of the P-channel SGT and the $N^+$ region 123 of the N-channel SGT.

A power supply wiring metal layer Vd formed on the $SiO_2$ layer 131 is connected to the source $P^+$ region 124 of the P-channel SGT and the silicide layer 129a through the contact hole 132a. An output wiring metal layer Vo formed on the $SiO_2$ layer 131 is connected to the drain $P^+$ region 122 of the P-channel SGT, the drain $N^+$ region 123 of the N-channel SGT, and the silicide layer 129b through the contact hole 132b. A ground wiring metal layer Vs formed on the $SiO_2$ layer 131 is connected to the source $N^+$ region 125 of the N-channel SGT and the silicide layer 129c through the contact hole 132c.

The gate conductor layer 127a of the P-channel SGT and the gate conductor layer 127b of the N-channel SGT are connected to an input wiring metal layer (not illustrated) while being connected to each other.

In this CMOS inverter circuit, the P-channel SGT and the N-channel SGT are formed in the Si pillars SP1 and SP2. Therefore, the circuit area is reduced when vertically viewed in plan. As a result, a further reduction in the size of the circuit is achieved compared with CMOS inverter circuits including known planar MOS transistors.

The CMOS inverter circuit including SGTs illustrated in FIG. 16 has also been required to have higher density and higher performance. However, the following problems arise when the density and performance of this circuit are further improved.

1. In the mask design for the Si pillars SP1 and SP2 and the i layer 121, margins need to be left in terms of shape and positional relationship to accurately form the Si pillars SP1 and SP2 on the i layer 121 with certainty. This inhibits the increase in the density of the circuit.

2. The resistances between the end of the silicide layer 129b and the P$^+$ region 122 directly below the Si pillar SP1 and between the end of the silicide layer 129b and the N$^+$ region 123 directly below the Si pillar SP2 decrease the driving current and the driving speed.

3. A thin gate insulating layer 126a lies between the gate conductor layer 127a and the P$^+$ region 122. Therefore, a large coupling capacitance is present between the gate conductor layer 127a and the P$^+$ region 122. Similarly, a thin gate insulating layer 126b lies between the gate conductor layer 127b and the N$^+$ region 123. Therefore, a large coupling capacitance is present between the gate conductor layer 127b and the N$^+$ region 123. Such large coupling capacitances inhibit the increase in the speed.

4. Thin sidewall nitride films 128a and 128b lie between the contact hole 132b and the gate conductor layers 127a and 127b. Therefore, large coupling capacitances are present between the gate conductor layers 127a and 127b and the output wiring metal layer Vo. Such large coupling capacitances inhibit the increase in the speed. If the coupling capacitance is decreased by increasing the thicknesses of the sidewall nitride films 128a and 128b, the circuit area increases.

Accordingly, the density and performance of the circuit need to be improved by addressing the above problems.

SUMMARY OF THE INVENTION

It is an object of the present invention to provide a method for producing a pillar-shaped semiconductor device that improves the density and performance of a circuit.

A method for producing a pillar-shaped semiconductor device according to a first aspect of the present invention includes a step of providing a structure including a substrate, a first semiconductor pillar that stands on a plane of the substrate in a vertical direction, and a first impurity region that is in contact with a lower portion of the first semiconductor pillar or a side surface of the lower portion and contains a donor or acceptor impurity atom; a step of forming a first material layer that has conductivity, extends in a horizontal direction, and is connected to, in plan view, at least one of an entire periphery of the first impurity region and an entire periphery of a first conductor layer surrounding a first insulating layer surrounding the first semiconductor pillar; a step of forming, on the first material layer, a second material layer that surrounds the first semiconductor pillar in plan view; a step of forming, on the first material layer, a third material layer that is partly connected to the second material layer in plan view; and a step of etching the first material layer using the second material layer and the third material layer as masks. A first region of the first material layer that surrounds the first semiconductor pillar in plan view is formed below the second material layer, and a second region of the first material layer that is partly connected to the first region in plan view is formed below the third material layer.

The second material layer is preferably formed so as to surround the first semiconductor pillar in a tubular shape with an equal width.

The first material layer preferably contains a semiconductor atom, a metal atom, and the donor or acceptor impurity atom.

The first material layer is preferably formed of a semiconductor layer containing the donor or acceptor impurity atom or a metal layer.

The step of providing a structure preferably includes a step of forming the first impurity region by performing heat treatment to force the donor or acceptor impurity atom toward an inside of the first semiconductor pillar from the first material layer containing the donor or acceptor impurity atom.

The method preferably includes a step of forming the first impurity region before formation of the first semiconductor pillar.

The second material layer is preferably formed of at least the first insulating layer and the first conductor layer.

The second material layer is preferably formed of a second insulating layer that surrounds an entire periphery of the first conductor layer, and the first material layer is preferably connected to an entire periphery of the first conductor layer in plan view.

The first region of the first material layer preferably includes a third region that is connected to the first impurity region and surrounds a part or entirety of the first semiconductor pillar and a fourth region that surrounds an entire periphery of the first conductor layer so as to be in contact with the entire periphery of the first conductor layer. The second region of the first material layer preferably includes a fifth region that is partly connected to the third region and extends in the horizontal direction and a sixth region that is partly connected to the fourth region and extends in the horizontal direction. The fifth region and the sixth region are preferably formed so as to be away from each other or to partly overlap each other in plan view.

The method preferably includes a step of entirely forming a third insulating layer after the structure is provided and a step of forming a first contact hole that extends through the third insulating layer. At least a surface layer of the second material layer preferably serves as an etching stopper for an etchant used for forming the first contact hole.

An upper surface of the third material layer is preferably positioned lower than a top of the first semiconductor pillar in the vertical direction.

The method preferably includes a step of forming a fourth material layer on the first material layer on a periphery of the first semiconductor pillar, the fourth material layer having a flat upper surface that is flush with or is positioned higher than an upper surface of a top of the first semiconductor pillar; a step of forming, on the fourth material layer, a fifth material layer that partly overlaps the first region in plan view; and a step of forming a sixth material layer by etching the fourth material layer using the fifth material layer as a mask. The third material layer is preferably formed by performing etching using both the fifth material layer and the sixth material layer as masks or the sixth material layer as a mask.

The method preferably includes a step of etching the fourth material layer having conductivity such that the fourth material layer has an upper surface positioned lower than the top of the first semiconductor pillar and a step of forming a second contact hole such that the second contact hole is in contact with the sixth material layer.

The method preferably includes a step of forming a second semiconductor pillar that is adjacent to the first semiconductor pillar; a step of forming, on the first material layer, a seventh material layer that surrounds the second semiconductor pillar in plan view; a step of forming the third material layer that is partly connected to each of the second material layer and the seventh material layer in plan view; and a step of etching the first material layer using the second material layer, the third material layer, and the seventh material layer as masks. The first region of the first material layer that surrounds the first semiconductor pillar in plan view is preferably formed below the second material layer, a seventh region of the first material layer that surrounds the second semiconductor pillar in plan view is preferably formed below the seventh material layer, and the second region of the first material layer that is partly connected to each of the first region and the seventh region in plan view is preferably formed below the third material layer.

The second material layer and the seventh material layer are preferably formed in a connected manner between the first semiconductor pillar and the second semiconductor pillar in plan view. The method preferably further includes a step of etching the first material layer using the second material layer and the seventh material layer as masks.

a part contacted with the side surface of the first semiconductor pillar or entirety of the first material layer is formed with a single crystal layer containing donor or acceptor impurity atoms.

the single crystal semiconductor layer is formed as the first impurity region.

A part or entirety of the first impurity region is preferably formed on the side surface of the lower portion of the first semiconductor pillar by an epitaxial crystal growth method.

A part or entirety of the first impurity region is preferably formed on the side surface of the lower portion of the first semiconductor pillar by a selective epitaxial crystal growth method.

The method preferably includes a step of partly etching the first impurity region using the second material layer as a mask in plan view.

The method preferably includes a step of forming the first impurity region by the epitaxial crystal growth method such that a periphery of the first impurity region in plan view is present inward with respect to a periphery of the second material layer;

a step of forming a fourth material layer that has conductivity and is in contact with a side surface of the first impurity region; and a step of etching the fourth material layer using the second material layer as a mask.

The present invention can provide a method for producing a semiconductor device including an SGT for improving the density and performance of a circuit.

BRIEF DESCRIPTION OF THE DRAWINGS

FIGS. 1BA to 1BD are a plan view and sectional views illustrating a CMOS inverter circuit for describing a method for producing a semiconductor device including an SGT according to a first embodiment.

FIGS. 1EA to 1ED are a plan view and sectional views illustrating a CMOS inverter circuit for describing a method for producing a semiconductor device including an SGT according to a first embodiment.

FIGS. 3AA to 3AD are a plan view and sectional views illustrating a CMOS inverter circuit for describing a method for producing a semiconductor device including an SGT according to a third embodiment.

FIGS. 3EA to 3ED are a plan view and sectional views illustrating a CMOS inverter circuit for describing a method for producing a semiconductor device including an SGT according to a third embodiment.

FIGS. 3FA to 3FD are a plan view and sectional views illustrating a CMOS inverter circuit for describing a method for producing a semiconductor device including an SGT according to a third embodiment.

FIGS. 4AA to 4AD are a plan view and sectional views illustrating a CMOS inverter circuit for describing a method for producing a semiconductor device including an SGT according to a fourth embodiment.

FIGS. 4BA to 4BD are a plan view and sectional views illustrating a CMOS inverter circuit for describing a method for producing a semiconductor device including an SGT according to a fourth embodiment.

FIGS. 4CA to 4CD are a plan view and sectional views illustrating a CMOS inverter circuit for describing a method for producing a semiconductor device including an SGT according to a fourth embodiment.

FIGS. 4DA to 4DD are a plan view and sectional views illustrating a CMOS inverter circuit for describing a method for producing a semiconductor device including an SGT according to a fourth embodiment.

FIGS. 5DA to 5DD are a plan view and sectional views illustrating a CMOS inverter circuit for describing a method for producing a semiconductor device including an SGT according to a fifth embodiment.

FIGS. 7CA to 7CD are a plan view and sectional views illustrating a CMOS inverter circuit for describing a method for producing a semiconductor device including an SGT according to a seventh embodiment.

FIGS. 8A to 8D are a plan view and sectional views illustrating a CMOS inverter circuit for describing a method for producing a semiconductor device including an SGT according to an eighth embodiment.

FIGS. 9AA to 9AD are a plan view and sectional views illustrating a CMOS inverter circuit for describing a method for producing a semiconductor device including an SGT according to a ninth embodiment.

FIGS. 10AA to 10AD are a plan view and sectional views illustrating a CMOS inverter circuit for describing a method for producing a semiconductor device including an SGT according to a tenth embodiment.

FIGS. 10CA to 10CD are a plan view and sectional views illustrating a CMOS inverter circuit for describing a method for producing a semiconductor device including an SGT according to a tenth embodiment.

FIGS. 10EA to 10ED are a plan view and sectional views illustrating a CMOS inverter circuit for describing a method for producing a semiconductor device including an SGT according to a tenth embodiment.

FIGS. 10FA to 10FD are a plan view and sectional views illustrating a CMOS inverter circuit for describing a method for producing a semiconductor device including an SGT according to a tenth embodiment.

FIGS. 11CA to 11CD are a plan view and sectional views illustrating a CMOS inverter circuit for describing a method for producing a semiconductor device including an SGT according to an eleventh embodiment.

FIGS. 12AA to 12AD are a plan view and sectional views illustrating a CMOS inverter circuit for describing a method for producing a semiconductor device including an SGT according to a twelfth embodiment.

FIGS. 12CA to 12CD are a plan view and sectional views illustrating a CMOS inverter circuit for describing a method for producing a semiconductor device including an SGT according to a twelfth embodiment.

FIGS. 12DA to 12DD are a plan view and sectional views illustrating a CMOS inverter circuit for describing a method for producing a semiconductor device including an SGT according to a twelfth embodiment.

FIGS. 13BA to 13BD are a plan view and sectional views illustrating a CMOS inverter circuit for describing a method for producing a semiconductor device including an SGT according to a thirteenth embodiment.

FIGS. 14AA to 14AD are a plan view and sectional views illustrating a CMOS inverter circuit for describing a method for producing a semiconductor device including an SGT according to a fourteenth embodiment.

FIGS. 14BA to 14BD are a plan view and sectional views illustrating a CMOS inverter circuit for describing a method for producing a semiconductor device including an SGT according to a fourteenth embodiment.

DESCRIPTION OF THE PREFERRED EMBODIMENTS

Hereafter, a method for producing a semiconductor device including an SGT according to embodiments of the present invention will be described with reference to the attached drawings.

First Embodiment

Figure 1A:
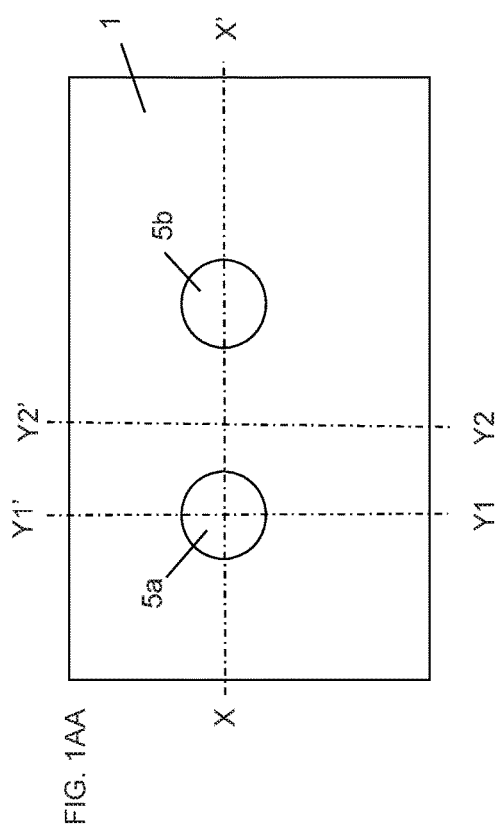
FIGS. 1AA to 1AD are a plan view and sectional views illustrating a CMOS inverter circuit for describing a method for producing a semiconductor device including an SGT according to a first embodiment.
Figure 1A:
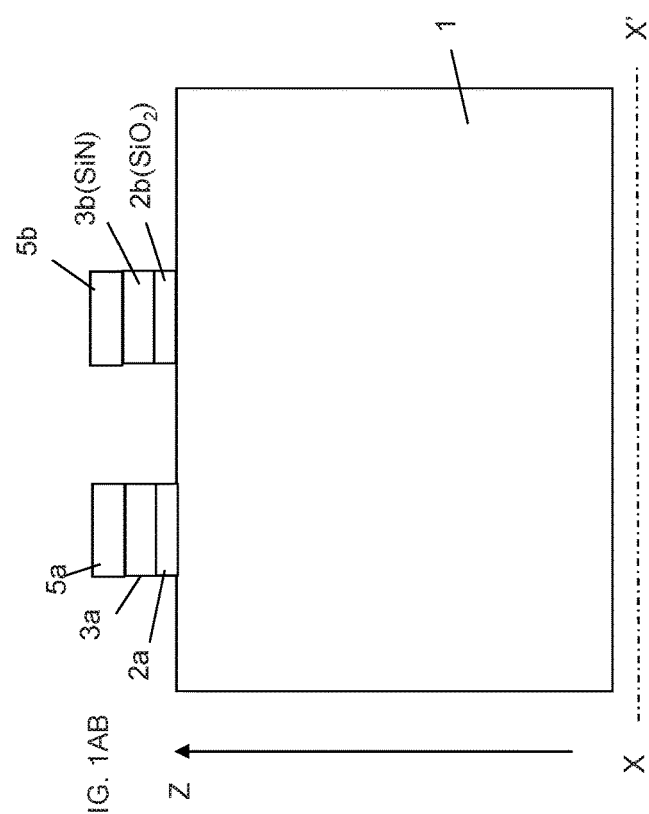
Figure 1A:
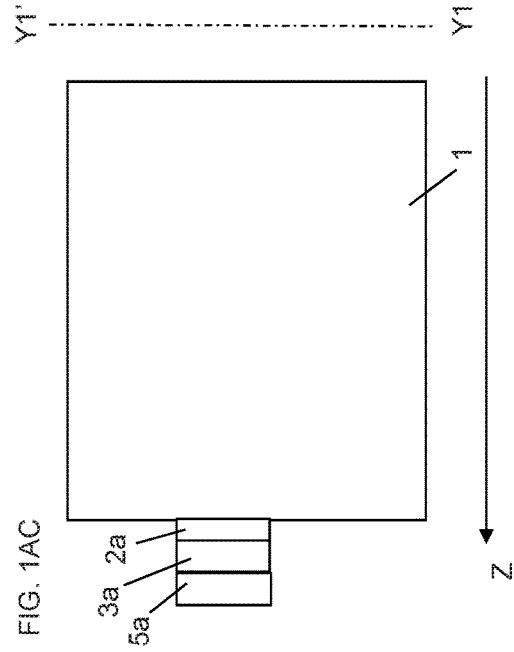
Figure 1A:
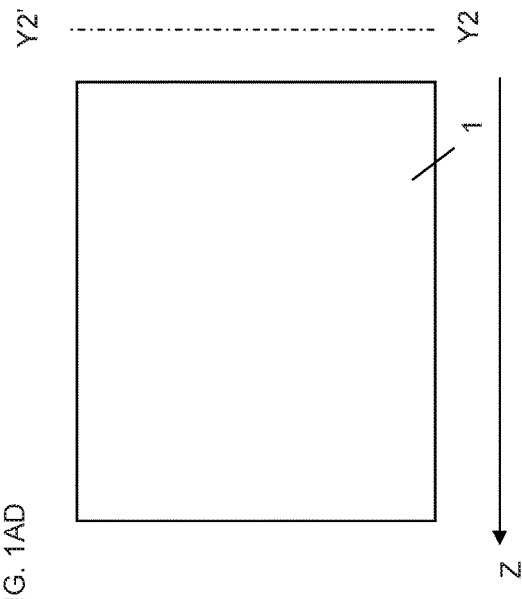
Figure 1C:
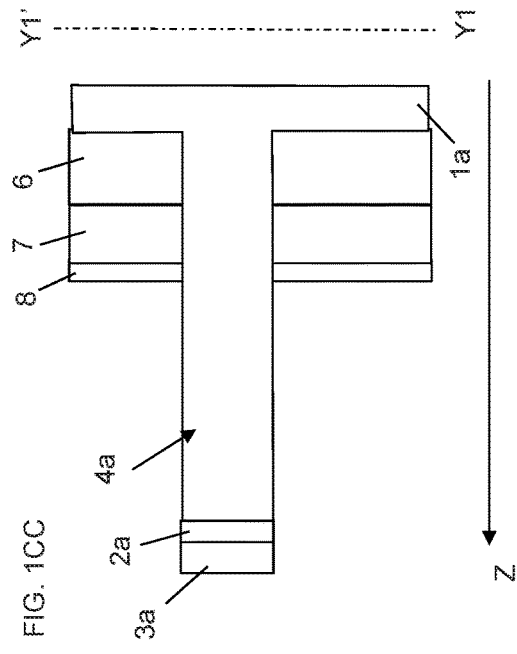
FIGS. 1CA to 1CD are a plan view and sectional views illustrating a CMOS inverter circuit for describing a method for producing a semiconductor device including an SGT according to a first embodiment.
Figure 1C:
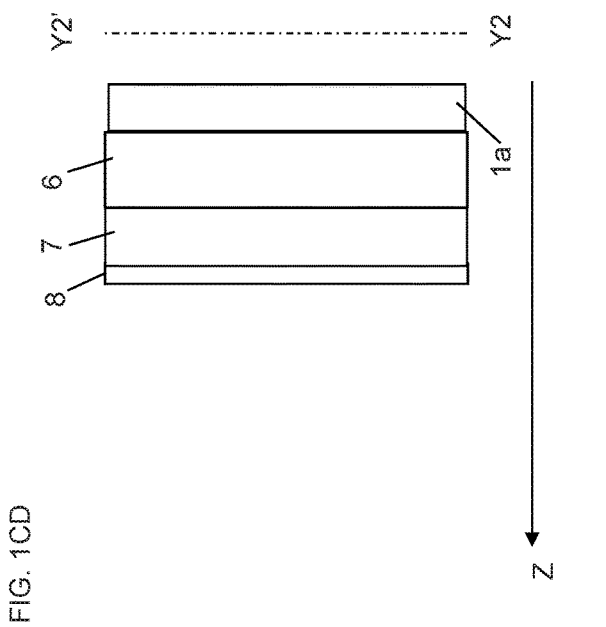
Figure 1C:
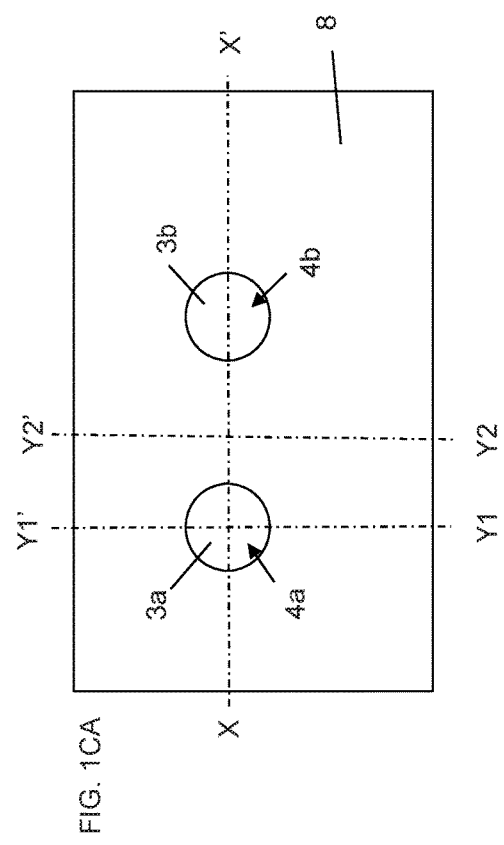
Figure 1C:
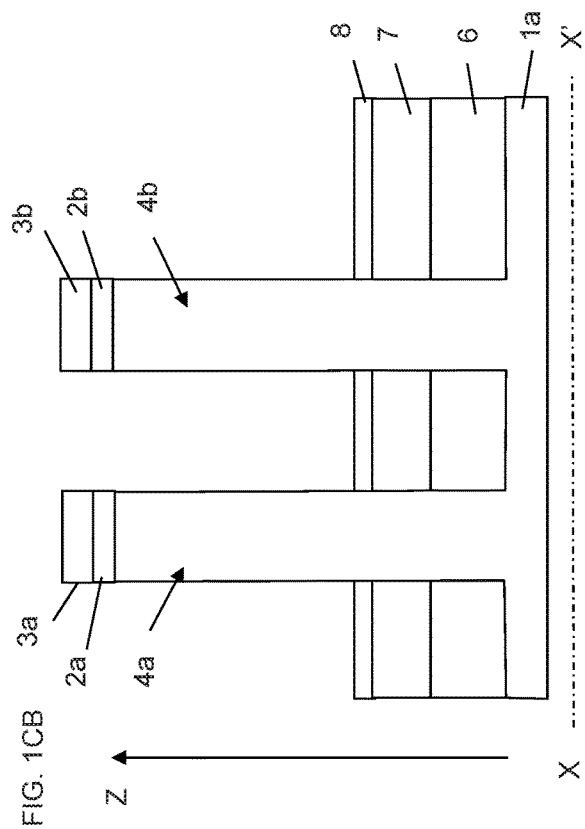
Figure 1D:
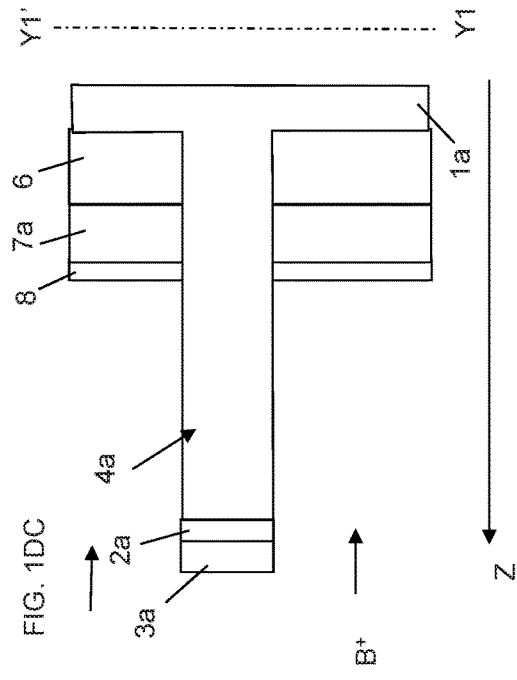
FIGS. 1DA to 1DD are a plan view and sectional views illustrating a CMOS inverter circuit for describing a method for producing a semiconductor device including an SGT according to a first embodiment.
Figure 1D:
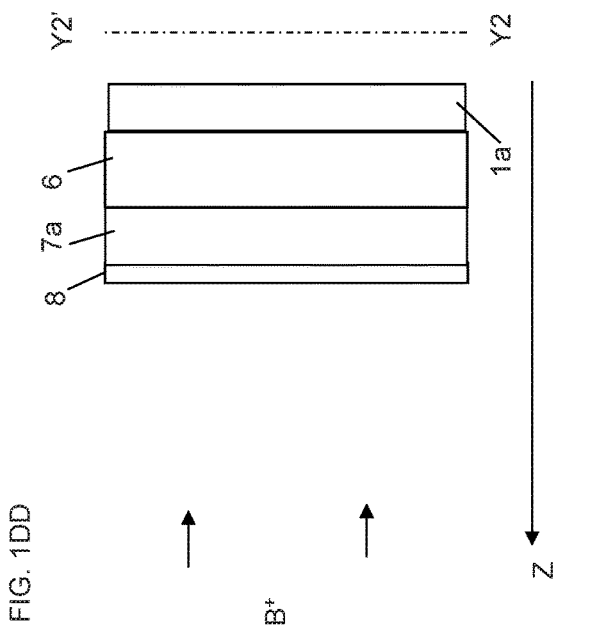
Figure 1D:
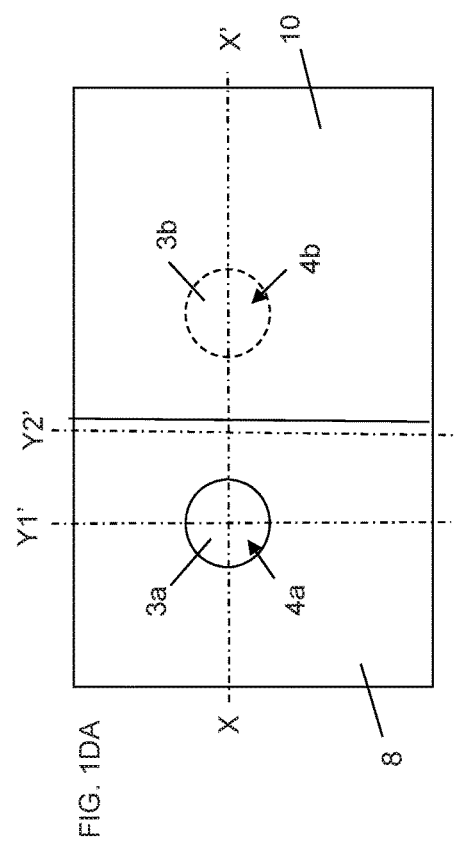
Figure 1D:
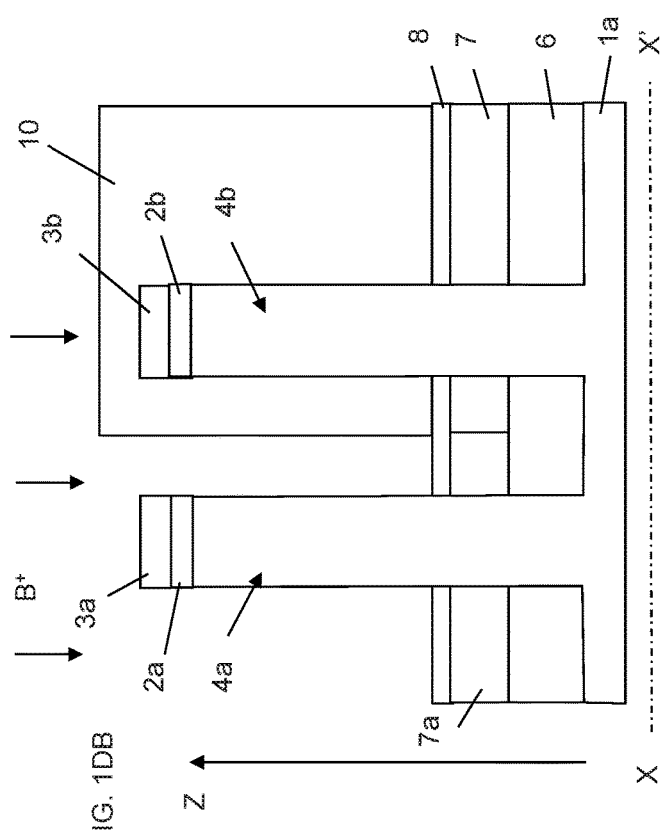
Figure 1F:
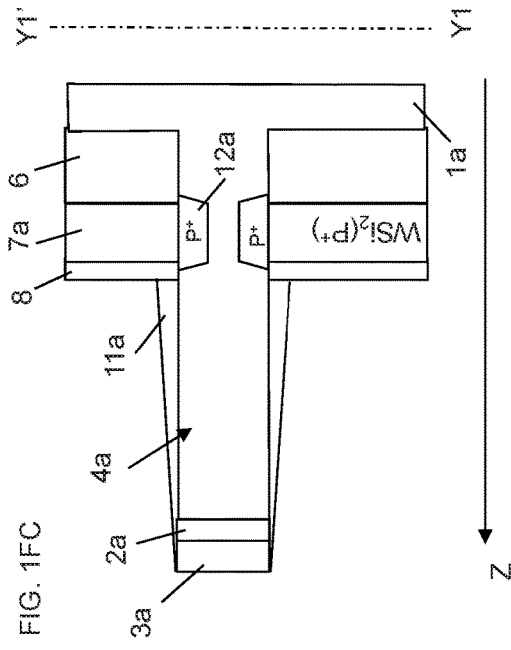
FIGS. 1FA to 1FD are a plan view and sectional views illustrating a CMOS inverter circuit for describing a method for producing a semiconductor device including an SGT according to a first embodiment.
Figure 1F:
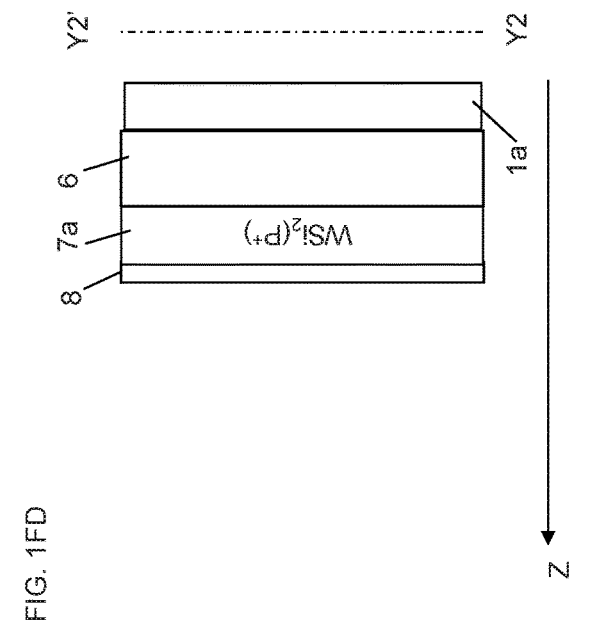
Figure 1F:
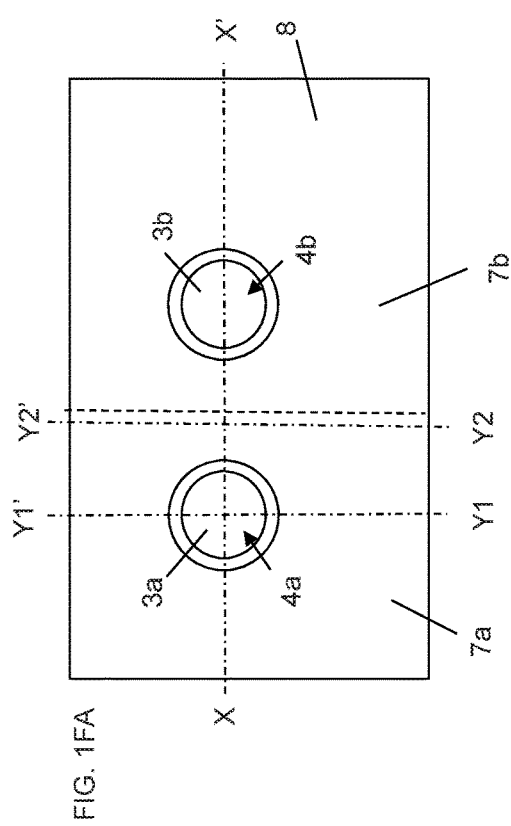
Figure 1F:
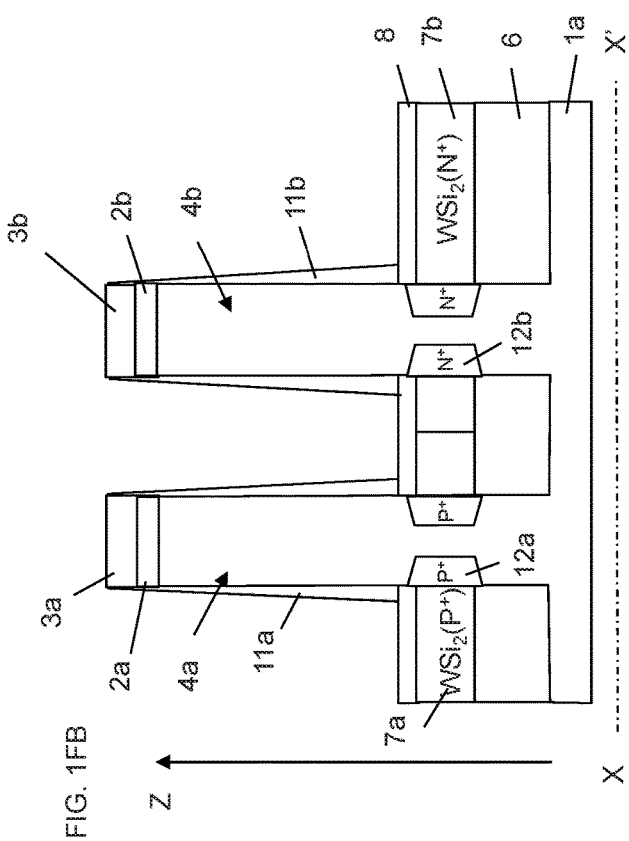
Figure 1G:
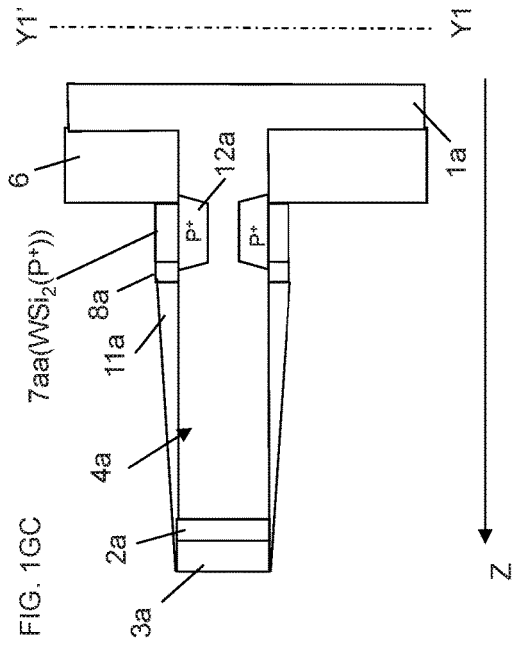
FIGS. 1GA to 1GD are a plan view and sectional views illustrating a CMOS inverter circuit for describing a method for producing a semiconductor device including an SGT according to a first embodiment.
Figure 1G:
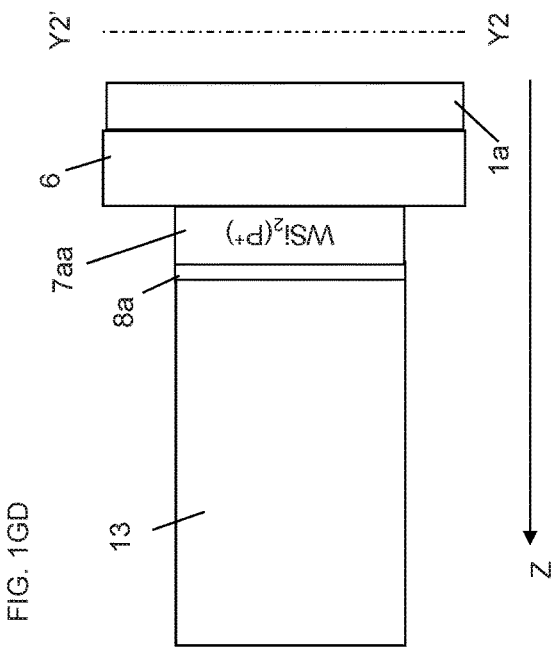
Figure 1G:
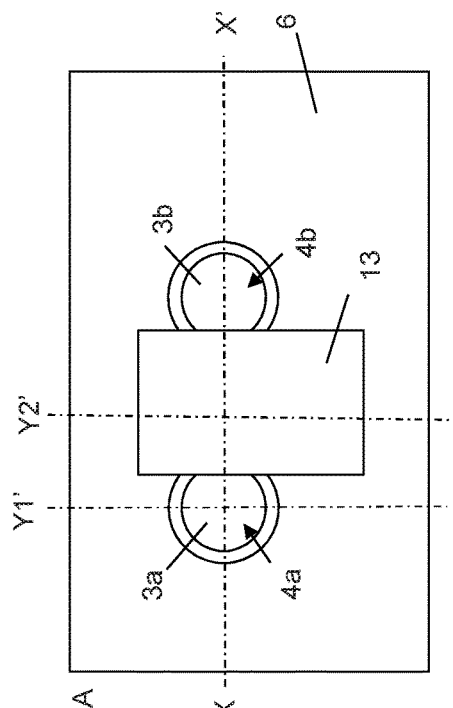
Figure 1G:
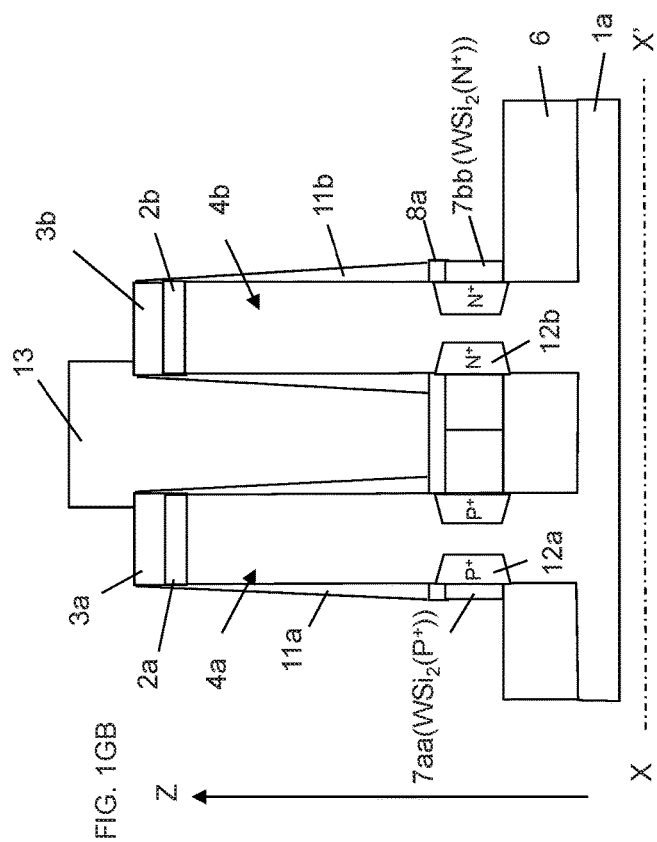
Figure 1H:
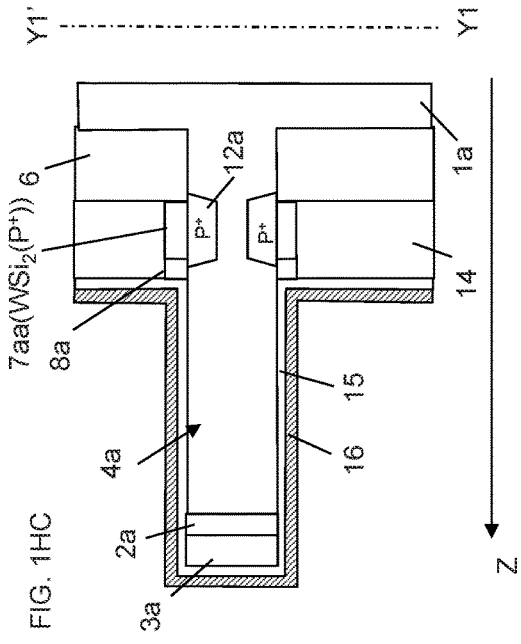
FIGS. 1HA to 1HD are a plan view and sectional views illustrating a CMOS inverter circuit for describing a method for producing a semiconductor device including an SGT according to a first embodiment.
Figure 1H:
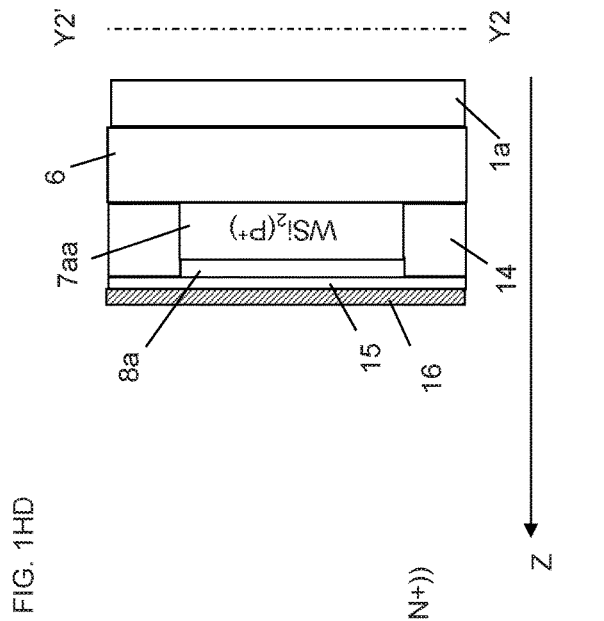
Figure 1H:
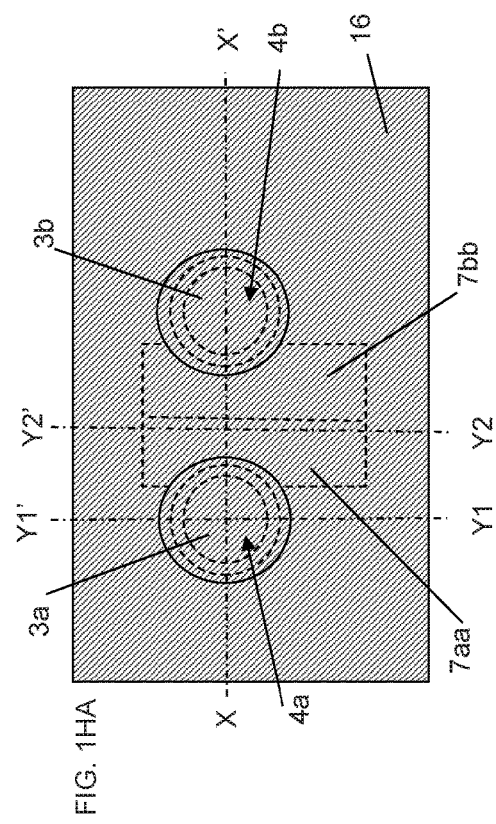
Figure 1H:
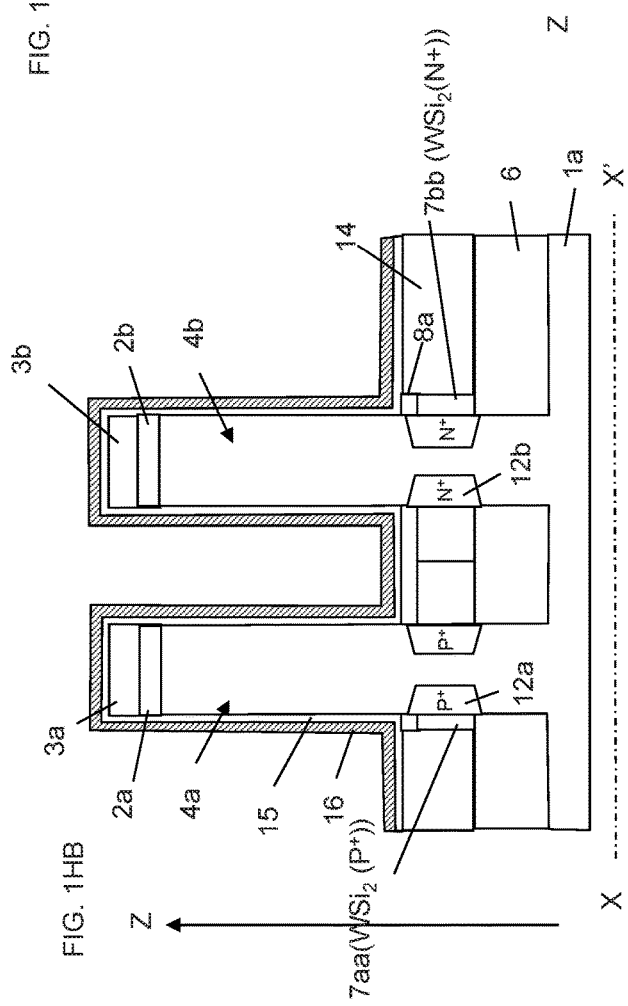
Figure 1I:
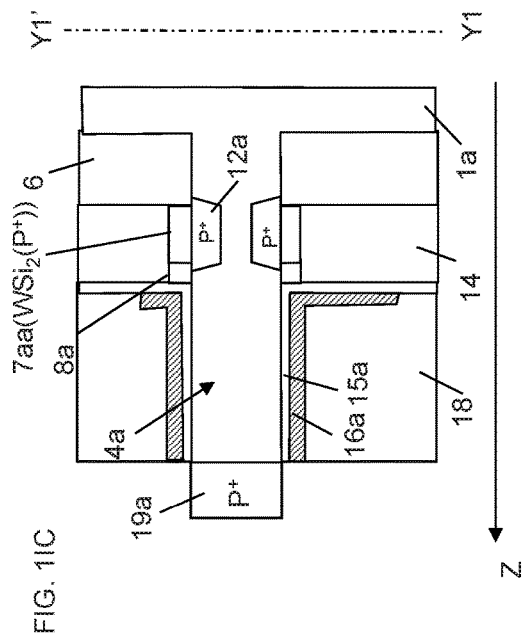
FIGS. 1IA to 1ID are a plan view and sectional views illustrating a CMOS inverter circuit for describing a method for producing a semiconductor device including an SGT according to a first embodiment.
Figure 1I:
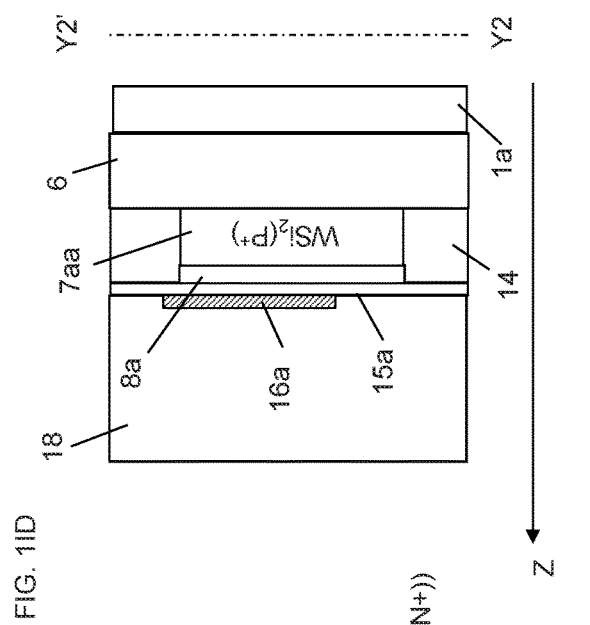
Figure 1I:
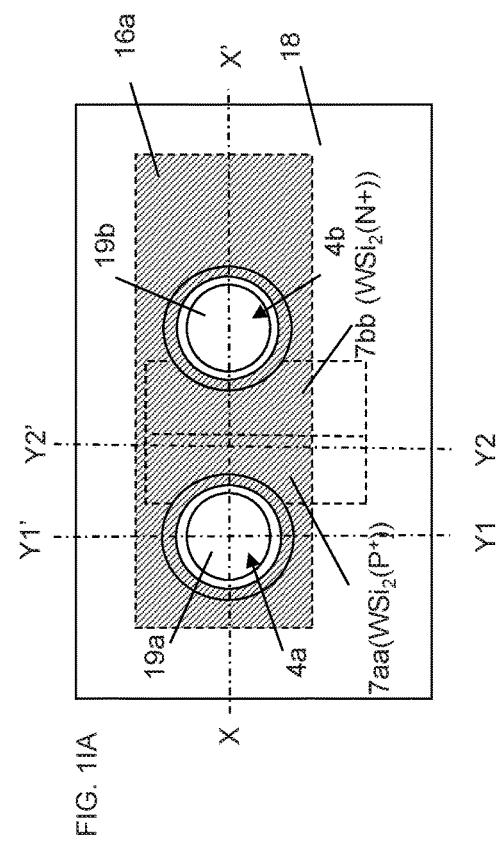
Figure 1I:
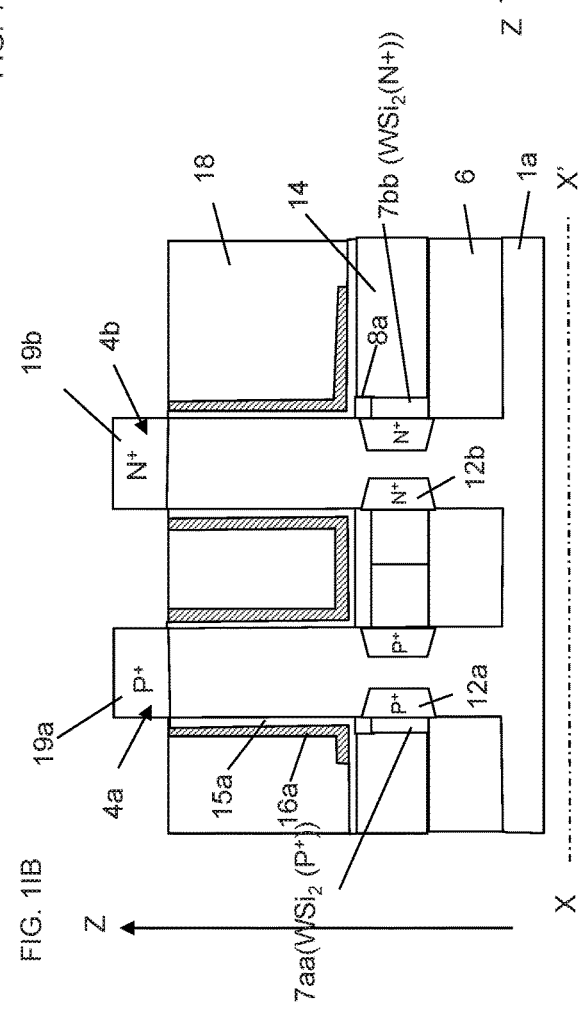
Figure 1J:
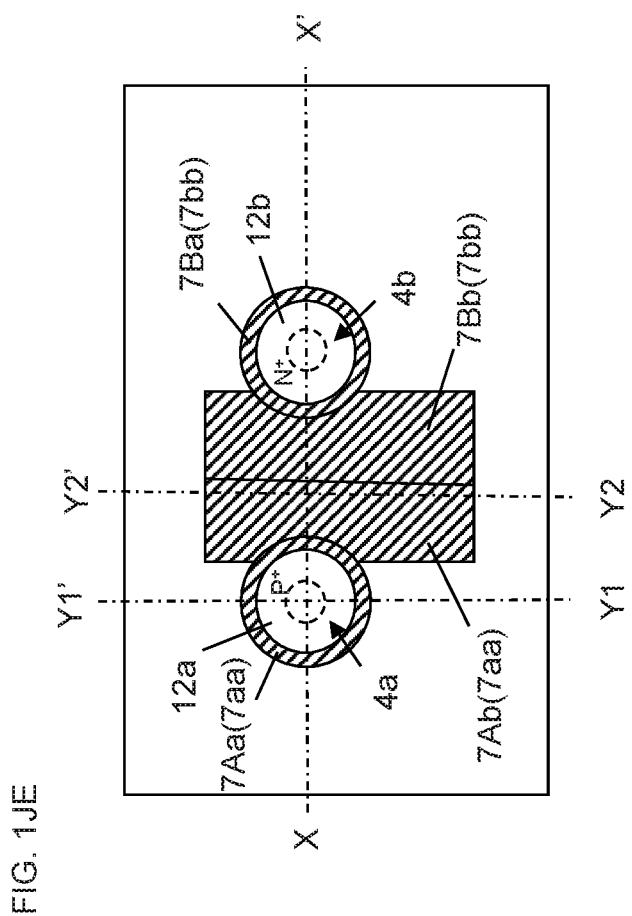
FIGS. 1JA to 1JE are plan views and sectional views illustrating a CMOS inverter circuit for describing a method for producing a semiconductor device including an SGT according to a first embodiment.

FIG. 1AA to FIG. 1JE illustrate a method for producing a CMOS inverter circuit including an SGT according to a first embodiment of the present invention.

FIGS. 1AA to 1AD are a plan view and sectional views for describing the first production process of the CMOS inverter circuit including an SGT. FIG. 1AA is a plan view, FIG. 1AB is a sectional view taken along line X-X' in FIG. 1AA, FIG. 1AC is a sectional view taken along line Y1-Y1' in FIG. 1AA, and FIG. 1AD is a sectional view taken along line Y2-Y2' in FIG. 1AA. In other figures referred to in the description below, the same applies to the relationship of views indicated by the suffixes A, B, C, and D.

As illustrated in FIGS. 1AA to 1AD, $SiO_2$ layers 2a and 2b, SiN layers 3a and 3b, and resist layers 5a and 5b are formed by depositing a $SiO_2$ layer (not illustrated) and a silicon nitride layer (SiN layer, a $Si_3N_4$ film is often used, not illustrated) on an i layer substrate 1 and using a lithography technique and, for example, reactive ion etching (RIE). The $SiO_2$ layer 2a, the SiN layer 3a, and the resist layer 5a are stacked on the i layer substrate 1 in this order. The $SiO_2$ layer 2b, the SiN layer 3b, and the resist layer 5b are stacked on the i layer substrate 1 in this order.

Next, as illustrated in FIGS. 1BA to 1BD, the i layer substrate 1 is etched by, for example, RIE using the $SiO_2$ layers 2a and 2b, the SiN layers 3a and 3b, and the resist layers 5a and 5b as etching masks. Thus, a lower portion of the i layer substrate 1 is left as an i layer substrate 1a and Si pillars 4a and 4b are formed on the i layer substrate 1a. The resist layers 5a and 5b are removed. The Si pillar 4a is located below the $SiO_2$ layer 2a and the SiN layer 3a, and the Si pillar 4b is located below the $SiO_2$ layer 2b and the SiN layer 3b. A thin $SiO_2$ layer (not illustrated) is formed on side surfaces of the Si pillars 4a and 4b and a surface of the i layer substrate 1a by, for example, an atomic layer deposition (ALD) method or an oxidation method.

Next, as illustrated in FIGS. 1CA to 1CD, for example, a bias sputtering process is carried out in the following manner: a substrate metal plate on which the i layer substrate 1a is disposed and a facing metal plate located away from the substrate metal plate are provided; a direct-current voltage is applied to the substrate metal plate, and an RF voltage is applied across these two parallel metal plates, to thereby sputter the material atoms of the facing metal plate onto the i layer substrate 1a. Thus, a $SiO_2$ layer 6, a $WSi_2$ layer 7, and a $SiO_2$ layer 8 are formed. Subsequently, a lower $SiO_2$ layer (not illustrated), a $WSi_2$ layer (not illustrated), and an upper $SiO_2$ layer (not illustrated) formed on the Si pillars 4a and 4b are removed. Since the Si pillars 4a and 4b are formed by RIE, the side surfaces of the Si pillars 4a and 4b are substantially vertical to the plane of the i layer substrate 1a. Therefore, a $SiO_2$ film, a $WSi_2$ film, and a $SiO_2$ film are not formed on the side surfaces of the Si pillars 4a and 4b (for the mechanism in which material atoms do not adhere to the side surfaces, refer to C. Y. Ting, V. J. Vivalda, and H. G. Schaefer: "Study of planarized sputter-deposited $SiO_2$," J. Vac. Sci. Technology, 15(3), May/June (1978)).

Next, as illustrated in FIGS. 1DA to 1DD, a resist layer 10 is formed so as to cover the Si pillar 4b. Boron ions ($B^+$) are implanted in a direction toward the upper surface of the i layer substrate 1a using the resist layer 10 as a mask to form a $WSi_2$ layer 7a containing B atoms on the periphery of the Si pillar 4a. The resist layer 10 is removed.

Subsequently, arsenic ions (AO are implanted using, as a mask, a resist layer (not illustrated) formed so as to cover the Si pillar 4a. Thus, a $WSi_2$ layer 7b containing As atoms is formed on the periphery of the Si pillar 4b. The resist layer is removed. A $SiO_2$ film (not illustrated) is entirely deposited by chemical vapor deposition (CVD). The $SiO_2$ film is etched by RIE so that a part of the $SiO_2$ film is left on the side surfaces of the Si pillars 4a and 4b. Thus, as illustrated in FIGS. 1EA to 1ED, $SiO_2$ layers 11a and 11b are formed on the side surfaces of the Si pillars 4a and 4b.

Next, as illustrated in FIGS. 1FA to 1FD, by performing heat treatment, the B atoms are forced toward the inside of the Si pillar 4a from the $WSi_2$ layer 7a to form a $P^+$ region 12a in the Si pillar 4a, and the As atoms are forced toward the inside of the Si pillar 4b from the $WSi_2$ layer 7b to form an N+ region 12b in the Si pillar 4b (for the mechanism in which the $P^+$ region 12a and the N+ region 12b are formed through the forcing phenomenon of impurity atoms, refer to V. Probst, H. Schaber, A. Mitwalsky, and H. Kabza: "$WSi_2$ and $CoSi_2$ as diffusion sources for shallow-junction formation in silicon", J. Appl. Phys. Vol. 70(2), No. 15, pp. 708-719 (1991)).

Next, as illustrated in FIGS. 1GA to 1GD, a resist layer 13 is formed so as to partly cover the Si pillars 4a and 4b. Then, the $SiO_2$ layer 8 and the $WSi_2$ layers 7a and 7b are etched by RIE using the resist layer 13, the SiN layers 3a and 3b, and the $SiO_2$ layers 11a and 11b as masks to form a $SiO_2$ layer 8a and $WSi_2$ layers 7aa and 7bb. In this case, the $WSi_2$ layers 7aa and 7bb lie below the $SiO_2$ layers 11a and 11b, and are constituted by first alloy layers that surround the entire peripheries of the Si pillars 4a and 4b in plan view and a second alloy layer that is connected to the first alloy layers and lies below the resist layer 13. The first alloy layers of the $WSi_2$ layers 7a and 7b are self-aligned with the $P^+$ region 12a and the $N^+$ region 12b. That is, the first alloy layers of the $WSi_2$ layers 7aa and 7bb that lie below the $SiO_2$ layers 11a and 11b are formed in a tubular shape with an equal width so as to surround the entire peripheries of the $P^+$ region 12a and the $N^+$ region 12b regardless of the mask misalignment in lithography during formation of the resist layer 13.

Next, the resist layer 13 is removed. Then, as illustrated in FIGS. 1HA to 1HD, a $SiO_2$ film (not illustrated) is entirely deposited by CVD and etched back to a position of an upper surface of the $SiO_2$ layer 8a to form a $SiO_2$ layer 14 (the upper surface of the $SiO_2$ layer 14 may be positioned higher than the upper surface of the $SiO_2$ layer 8a). The $SiO_2$ layers 11a and 11b left on the side surfaces of the Si pillars 4a and 4b are removed. A HfO$_2$ layer 15 and a TiN layer 16 are entirely deposited by atomic layer deposition (ALD).

Next, as illustrated in FIGS. 1IA to 1ID, a SiO$_2$ film (not illustrated) is entirely deposited by CVD and etched back until the upper surface of the SiO$_2$ film is positioned lower than the tops of the Si pillars 4a and 4b to form a SiO$_2$ layer 18. Portions of the TiN layer 16, the HfO$_2$ layer 15, the SiN layers 3a and 3b, and the SiO$_2$ layers 2a and 2b positioned higher than the upper surface of the SiO$_2$ layer 18 are removed. The remaining portions of the TiN layer 16 and the HfO$_2$ layer 15 are referred to as a TiN layer 16a and a HfO$_2$ layer 15a. By performing lithography and ion implantation, a P$^+$ region 19a is formed in a top portion of the Si pillar 4a and an N$^+$ region 19b is formed in a top portion of the Si pillar 4b.

Next, as illustrated in FIGS. 1JA to 1JD, a SiO$_2$ layer 21 is formed on the SiO$_2$ layer 18 so as to cover the P$^+$ region 19a and the N$^+$ region 19b. A contact hole 22a is formed on the P$^+$ region 19a, a contact hole 22b is formed on the N$^+$ region 19b, a contact hole 22c is formed on the TiN layer 16a, and a contact hole 22d that is connected to the upper surfaces and side surfaces of the WSi$_2$ layers 7aa and 7bb is formed. A power supply wiring metal layer Vdd connected to the P$^+$ region 19a through the contact hole 22a is formed on the SiO$_2$ layer 21. A ground wiring metal layer Vss connected to the N$^+$ region 19b through the contact hole 22b is formed on the SiO$_2$ layer 21. An input wiring metal layer Vin connected to the TiN layer 16a through the contact hole 22c is formed on the SiO$_2$ layer 21. An output wiring metal layer Vout connected to the WSi$_2$ layers 7aa and 7bb through the contact hole 22d is formed on the SiO$_2$ layer 21. The thickness of the WSi$_2$ layers 7aa and 7bb is desirably larger than the length of one side of the contact hole 22d in plan view. This reduces the contact resistance, on the side surfaces of the WSi$_2$ layers 7aa and 7bb, between the WSi$_2$ layers 7aa and 7bb and the output wiring metal layer Vout that is connected to the WSi$_2$ layers 7aa and 7bb through the contact hole 22d.

Thus, a CMOS inverter circuit constituted by a P-channel SGT for load and an N-channel SGT for drive is formed. The P-channel SGT for load includes the P$^+$ region 12a as a source, the P$^+$ region 19a as a drain, the HfO$_2$ layer 15a as a gate insulating layer, the TiN layer 16a as a gate conductor layer, and a portion of the Si pillar 4a between the P$^+$ regions 12a and 19a as a channel. The N-channel SGT for drive includes the N$^+$ region 12b as a source, the N$^+$ region 19b as a drain, the HfO$_2$ layer 15a as a gate insulating layer, the TiN layer 16a as a gate conductor layer, and a portion of the Si pillar 4b between the N$^+$ regions 12b and 19b as a channel.

FIG. 1JE illustrates the relationship between the Si pillars 4a and 4b, the P$^+$ region 12a, the N$^+$ region 12b, and the WSi$_2$ layers 7aa and 7bb in plan view. The diagonally shaded area indicates the WSi$_2$ layers 7aa and 7bb. The WSi$_2$ layer 7aa is constituted by a WSi$_2$ layer 7Aa serving as a first alloy layer that surrounds the entire periphery of the Si pillar 4a in a tubular shape with an equal width and is formed in a self-aligned manner with the P$^+$ region 12a and a WSi$_2$ layer 7Ab serving as a second alloy layer that is partly in contact with the periphery of the WSi$_2$ layer 7Aa in a connected manner. Similarly, the WSi$_2$ layer 7bb is constituted by a WSi$_2$ layer 7Ba serving as a first alloy layer that surrounds the entire periphery of the Si pillar 4b in a tubular shape with an equal width and is formed in a self-aligned manner with the N$^+$ region 12b and a WSi$_2$ layer 7Bb serving as a second alloy layer that is partly in contact with the periphery of the WSi$_2$ layer 7Ba in a connected manner. The WSi$_2$ layers 7Ab and 7Bb are in contact with each other.

The first embodiment provides the following advantages.

1. In the production method according to this embodiment, as illustrated in FIG. 1JE, the WSi$_2$ layers 7Aa and 7Ba are formed as first alloy layers that are directly in contact with the side surfaces of the Si pillars 4a and 4b, that surround the entire peripheries of the Si pillars 4a and 4b in a tubular shape with an equal width in plan view, and that are in contact with the P$^+$ region 12a and the N$^+$ region 12b in a self-aligned manner. The presence of the WSi$_2$ layers 7Aa and 7Ba serving as low-resistance first alloy layers that surround the entire peripheries of the Si pillars 4a and 4b can generate a uniform electric field in the P$^+$ region 12a and the N$^+$ region 12b during circuit operation. This uniform electric field can be generated regardless of the planar shape of the WSi$_2$ layers 7Ab and 7Bb serving as second alloy layers. The WSi$_2$ layers 7Ab and 7Bb serving as second alloy layers may be connected to any parts of the peripheries of the WSi$_2$ layers 7Aa and 7Ba serving as first alloy layers. Thus, in terms of design, the WSi$_2$ layers 7Ab and 7Bb serving as second alloy layers may be formed without surrounding the Si pillars 4a and 4b. This can increase the density of a circuit and improve the performance of the circuit.

Figure 15:
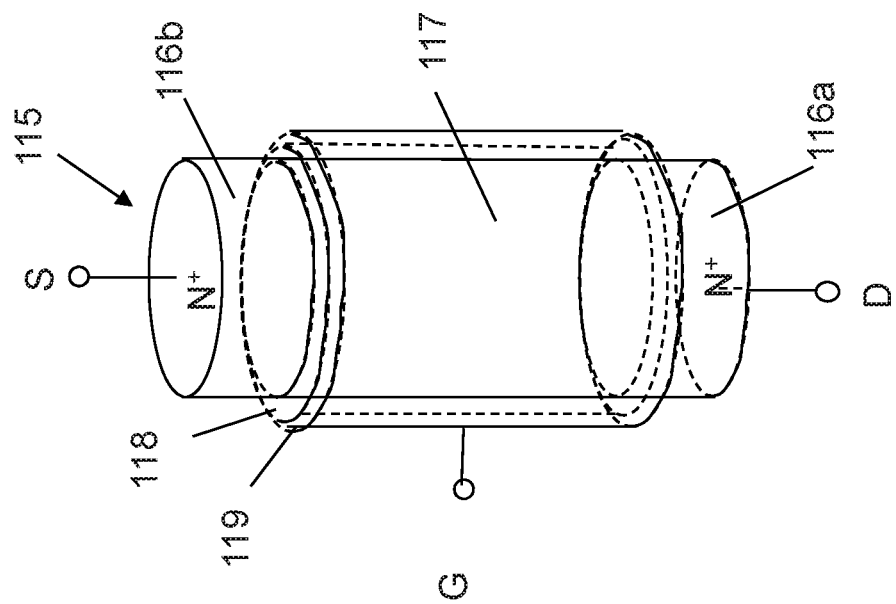
FIG. 15 schematically illustrates a structure of a known SGT.
Figure 16:
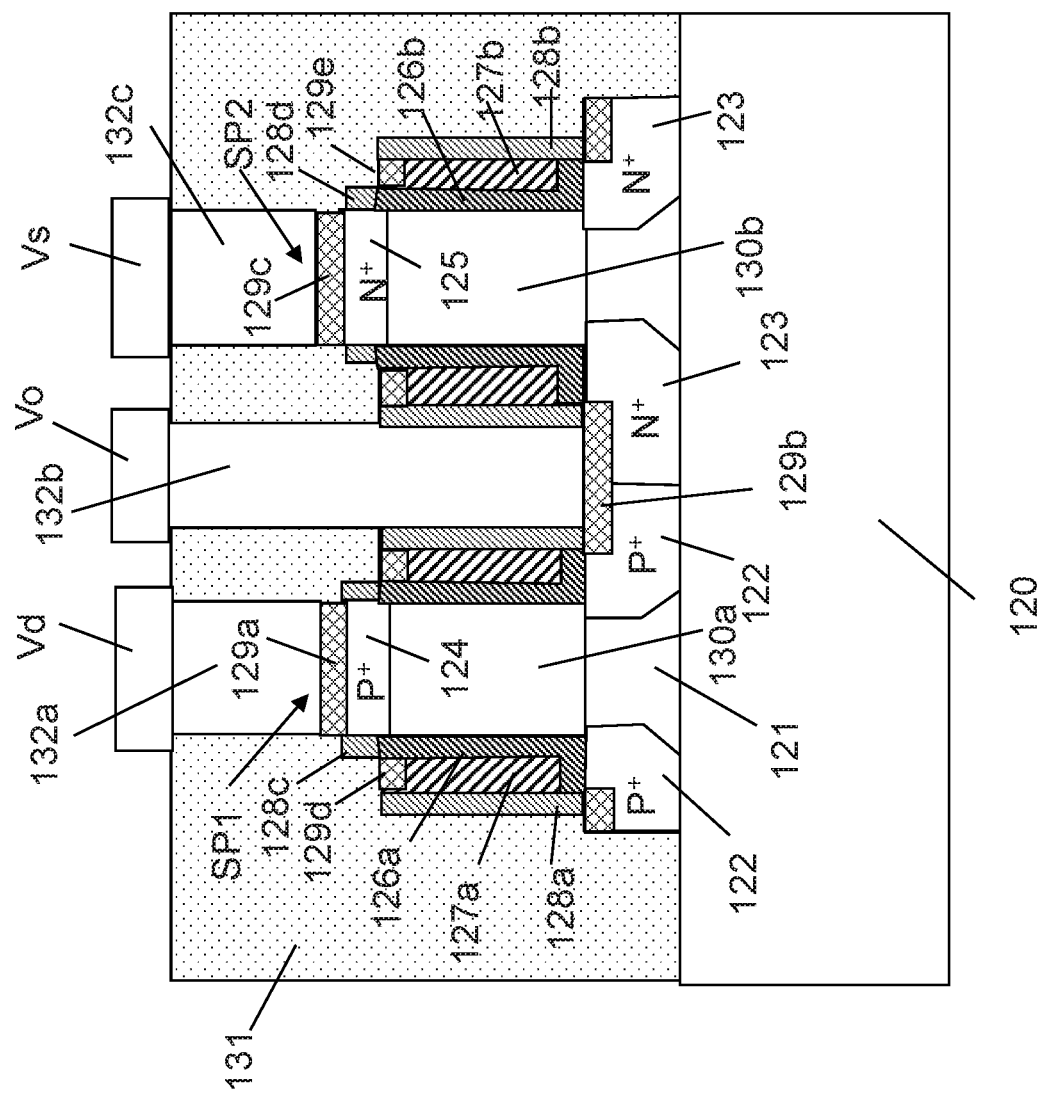
FIG. 16 is a sectional view of a CMOS inverter circuit including a known SGT.

2. In the related art, there has been a need to form the Si pillars SP1 and SP2 on the i layer 121 and introduce an impurity into the i layer 121 to form the P$^+$ region 122 and the N$^+$ region 123 as illustrated in FIG. 15. Therefore, in the mask design for the Si pillars SP1 and SP2 and the i layer 121, margins need to be left in terms of shape and positional relationship to accurately form the Si pillars SP1 and SP2 on the i layer 121 with certainty. This inhibits the increase in the density of the circuit. In contrast, in this embodiment, a region that corresponds to the i layer 121 and has been required in the related art is unnecessary. This can further increase the density of a circuit.

3. In this embodiment, the WSi$_2$ layers 7a and 7b containing acceptor and donor impurities, which will be changed into the WSi$_2$ layers 7aa and 7bb in a process performed later, are source layers for supplying acceptor and donor impurities used for forming the P$^+$ regions 12a and the N$^+$ region 12b in the Si pillars 4a and 4b. The WSi$_2$ layers 7aa and 7bb in a completed circuit are formed in a self-aligned manner with the P$^+$ region 12a and the N$^+$ region 12b and serve as wiring conductor layers directly connected to the P$^+$ region 12a and the N$^+$ region 12b. This simplifies the production process of a circuit.

4. In the related art, as illustrated in FIG. 15, the P$^+$ region 122 and the N$^+$ region 123 formed in the i layer 121 are formed so as to expand to the bottom portions of the Si pillars SP1 and SP2 and are connected to the output wiring metal layer Vo through the contact hole 132b formed on the low-resistance silicide layer 129b formed on the upper surface of the i layer 121. Therefore, a resistance is generated in a portion of the P$^+$ region 122 between the end of the silicide layer 129b and a position directly below the Si pillar SP1 and in a portion of the N$^+$ region 123 between the end of the silicide layer 129b and a position directly below the Si pillar SP2, which reduces the driving current and the driving speed. In contrast, in this embodiment, the WSi$_2$ layers 7aa and 7bb serving as low-resistance silicide layers are directly connected to the P$^+$ region 12a and the N$^+$ region 12b on the side surfaces of the Si pillars 4a and 4b. This prevents formation of a resistance region formed in a portion of the P$^+$ region 122 between the end of the silicide layer 129b and a position directly below the Si pillar SP1 and in a portion of the N$^+$ region 123 between the end of the silicide layer 129b and a position directly below the Si pillar SP2 in the related art.

5. In the related art, as is clear from FIG. 15, the planar area of the contact hole 132b that connects the output wiring metal layer Vo and the P+ region 122 and N+ region 123 decreases with increasing the density of the circuit, which increases the contact resistance. In particular, when a high-density semiconductor circuit is formed, the contact hole is formed with a minimum size in plan view to increase the density. Therefore, the increase in the contact resistance is disadvantageous. In contrast, in this embodiment, the output wiring metal layer Vout is connected to the upper surfaces and side surfaces of the $WSi_2$ layers 7aa and 7bb in the contact hole 22d. Since the entire $WSi_2$ layers 7aa and 7bb are formed of a low-resistance silicide material, the contact resistance can be reduced by increasing the thicknesses of the $WSi_2$ layers 7aa and 7bb in the vertical direction without enlarging the shape of the contact hole 22d in plan view.

6. In the description of this embodiment, the contact hole 22d through which the output wiring metal layer Vout is connected is formed so as to be in contact with both the $WSi_2$ layers 7aa and 7bb. However, the $WSi_2$ layer 7aa containing an acceptor impurity atom and the $WSi_2$ layer 7bb containing a donor impurity atom are both low-resistance silicide layers, and therefore even if the contact hole 22d is formed on only one of the $WSi_2$ layers 7aa and 7bb, the P+ region 12a and N+ region 12b can be connected to the output wiring metal layer Vout at a low resistance. This can increase the degree of freedom of the position of the contact hole 22d in the circuit design, which increases the density of the circuit.

Modification of First Embodiment

A SiN layer may be disposed as an etching stop layer between the $WSi_2$ layer 7 and the $SiO_2$ layer 8. This can prevent etching of the $WSi_2$ layer with certainty when the $SiO_2$ layer entirely deposited to form the $SiO_2$ layers 11a and 11b is etched. This structure is applicable to other embodiments below.

Second Embodiment

Figure 2A:
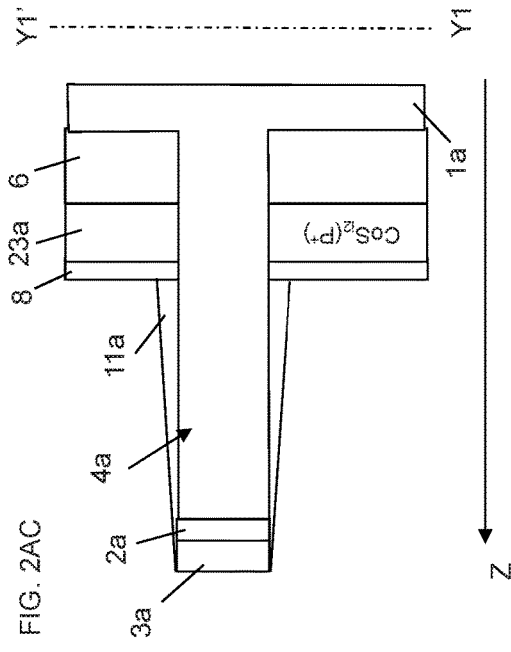
FIGS. 2AA to 2AD are a plan view and sectional views illustrating a CMOS inverter circuit for describing a method for producing a semiconductor device including an SGT according to a second embodiment.
Figure 2A:
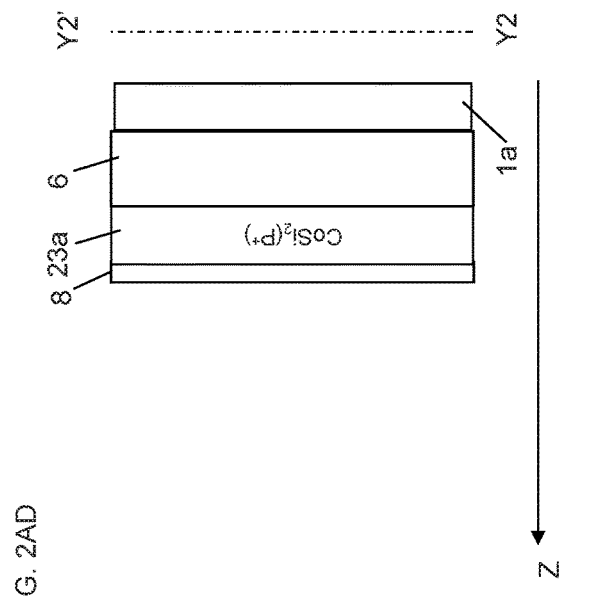
Figure 2A:
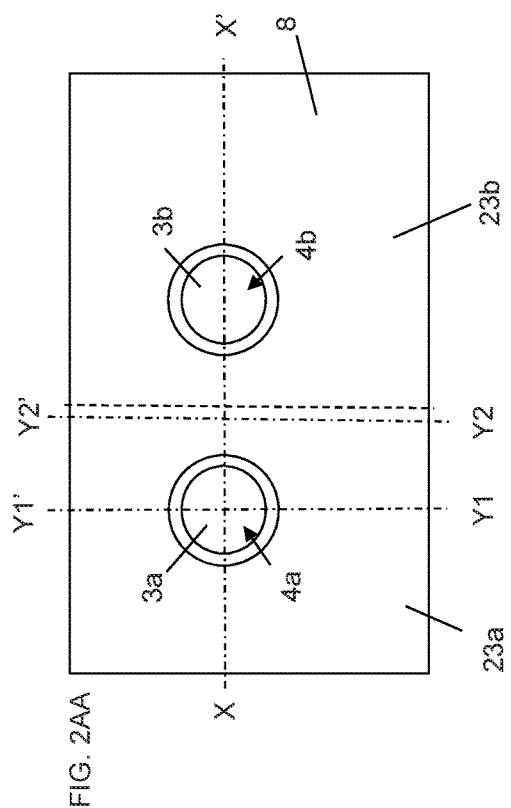
Figure 2A:
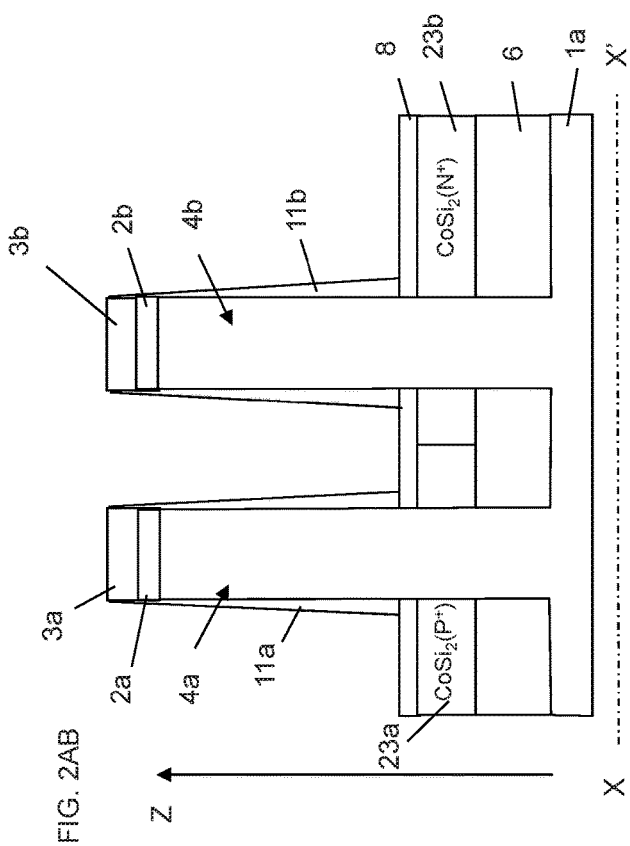
Figure 2B:
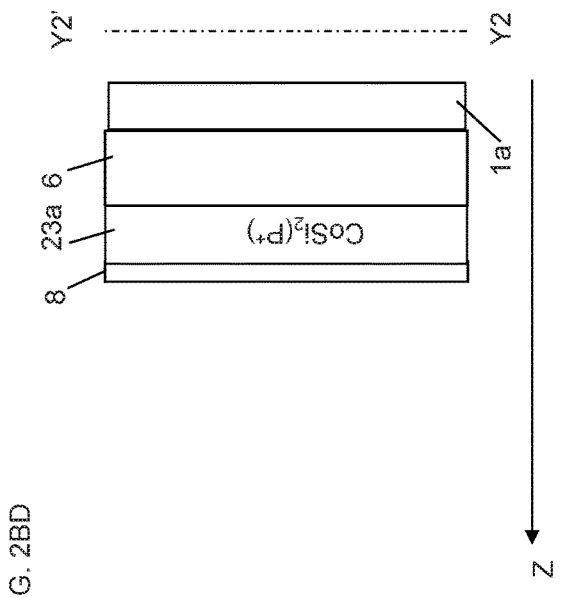
FIGS. 2BA to 2BD are a plan view and sectional views illustrating a CMOS inverter circuit for describing a method for producing a semiconductor device including an SGT according to a second embodiment.
Figure 2B:
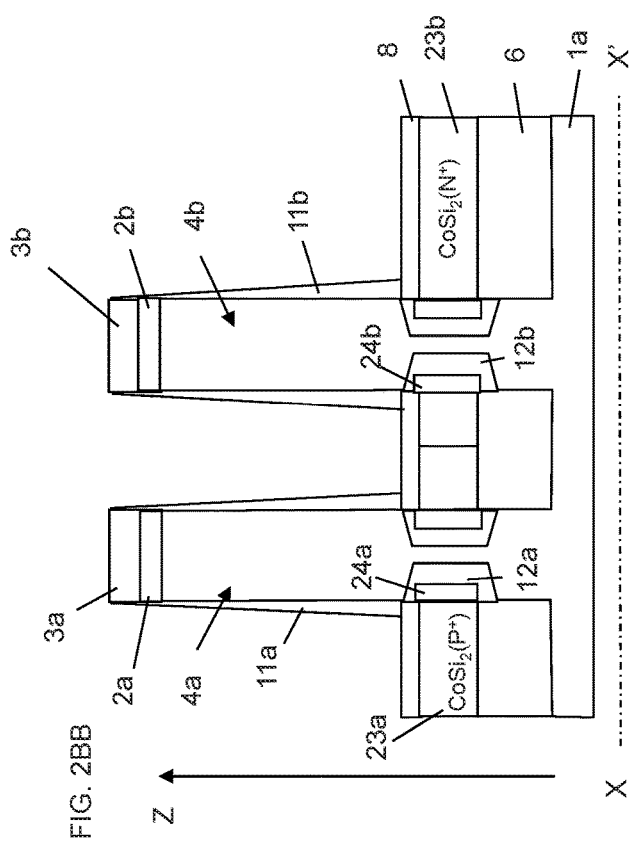
Figure 2B:
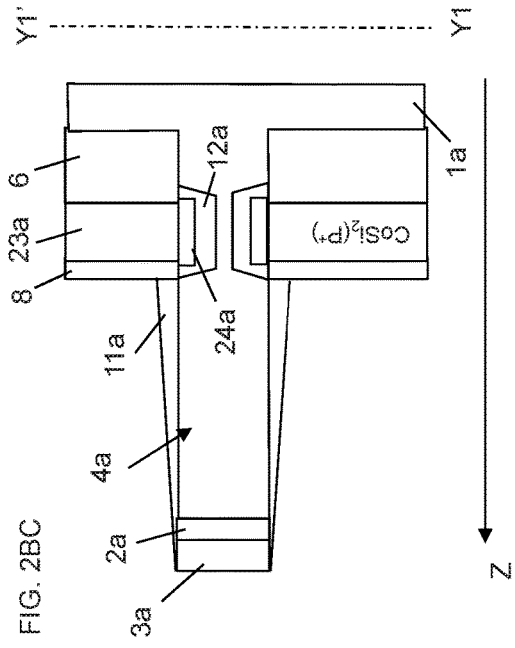
Figure 2B:
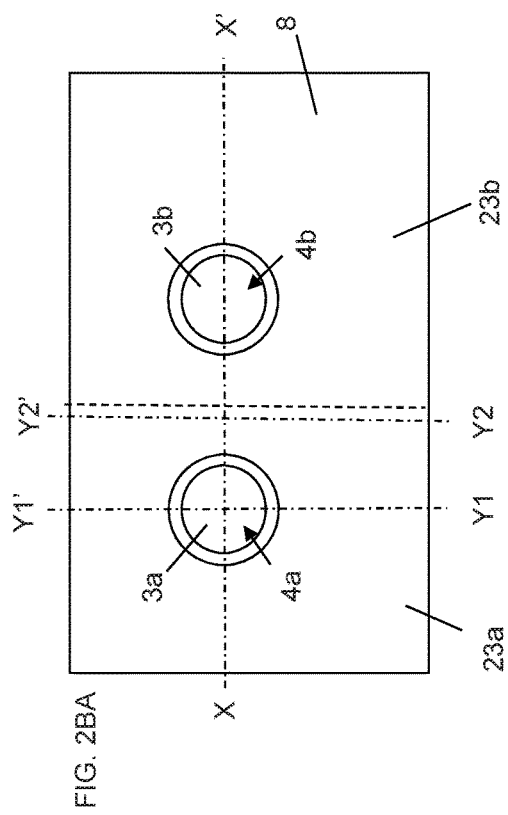
Figure 2C:
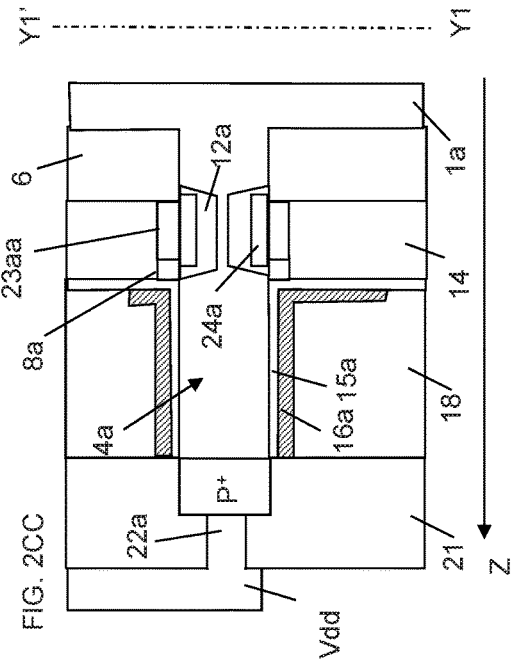
FIGS. 2CA to 2CE are plan views and sectional views illustrating a CMOS inverter circuit for describing a method for producing a semiconductor device including an SGT according to a second embodiment.
Figure 2C:
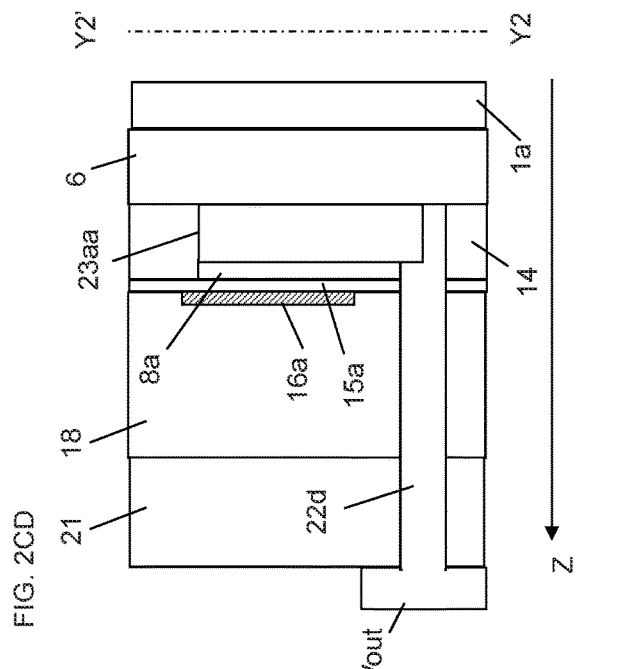
Figure 2C:
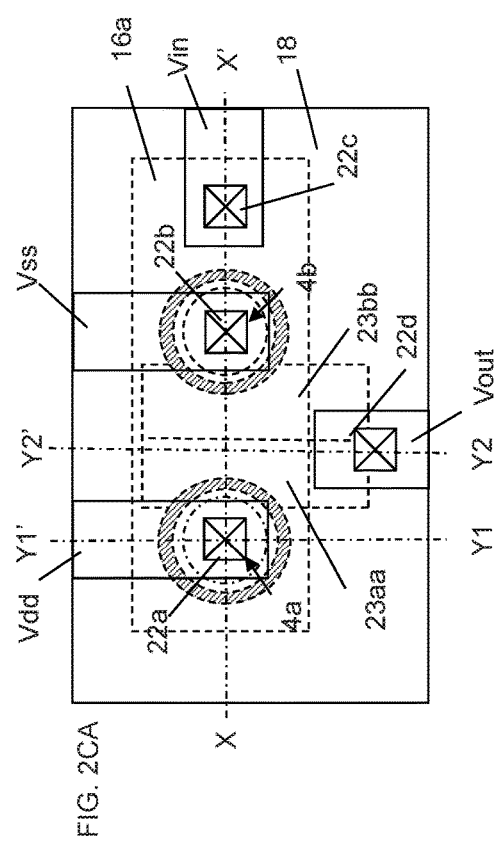
Figure 2C:
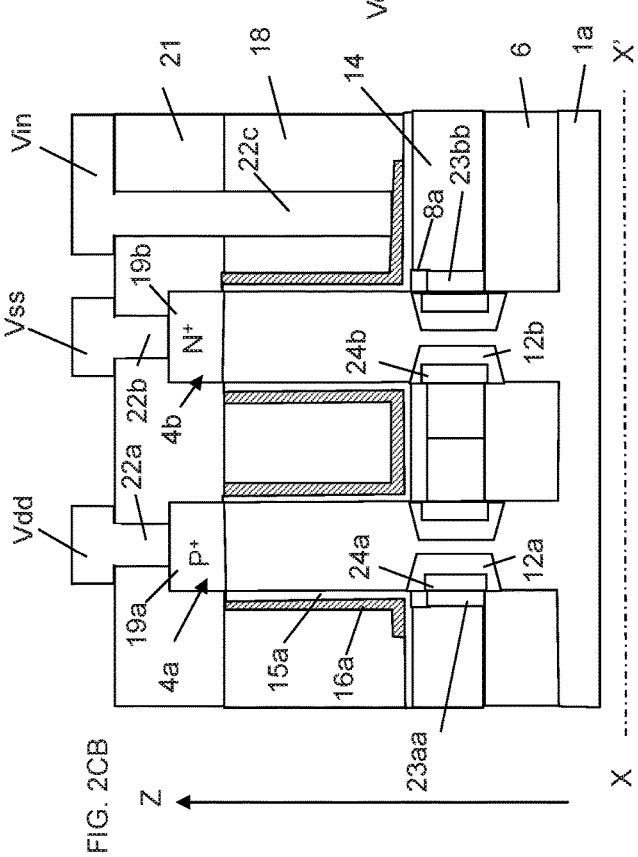
Figure 2C:
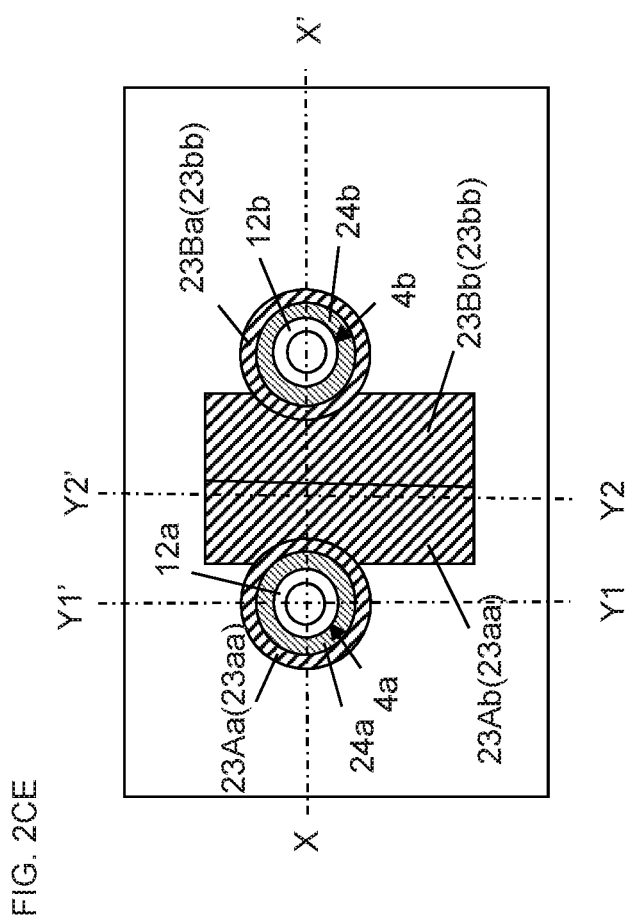

FIG. 2AA to FIG. 2CE illustrate a method for producing a CMOS inverter circuit including an SGT according to a second embodiment of the present invention. Among FIG. 2AA to FIG. 2CD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A. FIG. 2CE illustrates the relationship between Si pillars 4a and 4b, a P+ region 12a, an N+ region 12b, and $CoSi_2$ layers 23aa and 23bb in plan view.

As illustrated in FIGS. 2AA to 2AD, instead of the $WSi_2$ layers 7a and 7b in FIGS. 1EA to 1ED of the first embodiment, a $CoSi_2$ layer 23a containing an acceptor impurity is formed on the periphery of the Si pillar 4a and a $CoSi_2$ layer 23b containing a donor impurity is formed on the periphery of the Si pillar 4b.

Next, as illustrated in FIGS. 2BA to 2BD, by performing heat treatment, $CoSi_2$ layers 24a and 24b are formed on the side surfaces of the Si pillars 4a and 4b through silicidation. A P+ region 12a is formed in the Si pillar 4a through the forcing phenomenon of B atoms from the $CoSi_2$ layers 23a and 24a. An N+ region 12b is formed in the Si pillar 4b through the forcing phenomenon of As atoms from the $CoSi_2$ layers 23b and 24b (for the mechanism in which the $CoSi_2$ layers 24a and 24b, the P+ region 12a, and the N+ region 12b are formed through the forcing phenomenon of impurity atoms, refer to V. Probst, H. Schaber, A. Mitwalsky, and H. Kabza: "$WSi_2$ and $CoSi_2$ as diffusion sources for shallow-junction formation in silicon", J. Appl. Phys. Vol. 70(2), No. 15, pp. 708-719 (1991)).

Then, by performing the same processes as those in the first embodiment, a CMOS inverter circuit illustrated in FIGS. 2CA to 2CD is formed. The P+ region 12a and the N+ region 12b are formed in lower portions of the Si pillars 4a and 4b. The $CoSi_2$ layers 24a and 24b are formed on the side surfaces of the Si pillars 4a and 4b so as to surround the entire peripheries of the P+ region 12a and the N+ region 12b. The $CoSi_2$ layers 23aa and 23bb are formed so as to surround the entire peripheries of the $CoSi_2$ layers 24a and 24b.

FIG. 2CE illustrates the relationship between the Si pillars 4a and 4b, the P+ region 12a, the N+ region 12b, the $CoSi_2$ layers 24a and 24b formed inside the Si pillars 4a and 4b, and the $CoSi_2$ layers 23aa and 23bb that surround the entire peripheries of the Si pillars 4a and 4b in plan view. The diagonally shaded area indicates the $CoSi_2$ layers 23aa and 23bb. The $CoSi_2$ layer 23aa is constituted by a $CoSi_2$ layer 23Aa serving as a first alloy layer that surrounds the entire periphery of the Si pillar 4a in a tubular shape with an equal width and is formed in a self-aligned manner with the P+ region 12a and a $CoSi_2$ layer 23Ab serving as a second alloy layer that is partly connected to the periphery of the $CoSi_2$ layer 23Aa. The $CoSi_2$ layer 23bb is constituted by a $CoSi_2$ layer 23Ba serving as a first alloy layer that surrounds the entire periphery of the Si pillar 4b in a tubular shape with an equal width and is formed in a self-aligned manner with the N+ region 12b and a $CoSi_2$ layer 23Bb serving as a second alloy layer that is partly connected to the periphery of the $CoSi_2$ layer 23Ba. The $CoSi_2$ layer 24a serving as a third alloy layer is formed inside the Si pillar 4a so as to be connected to the entire inner periphery of the $CoSi_2$ layer 23Aa serving as a first alloy layer. At the same time, the $CoSi_2$ layer 24b serving as a third alloy layer is formed inside the Si pillar 4b so as to be connected to the entire inner periphery of the $CoSi_2$ layer 23Ba.

This embodiment provides the following advantage.

In this embodiment, the $CoSi_2$ layer 24a and the $CoSi_2$ layer 23Aa serving as a first alloy layer are formed so as to surround the entire periphery of the P+ region 12a in a tubular shape with an equal width. Similarly, the $CoSi_2$ layer 24b serving as a third alloy layer and the $CoSi_2$ layer 23Ba serving as a first alloy layer are formed so as to surround the entire periphery of the N+ region 12b in a tubular shape with an equal width. Thus, an electric field is uniformly applied to the P+ region 12a and the N+ region 12b, and the source or drain resistance in the bottom portion of the Si pillar can be reduced compared with in the first embodiment.

Third Embodiment

FIG. 3AA to FIG. 3FD illustrate a method for producing a CMOS inverter circuit including an SGT according to a third embodiment of the present invention. Among FIG. 3AA to FIG. 3FD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 3AA to 3AD, Si pillars 4a and 4b are formed on the i layer substrate 1a by RIE using a resist layer (not illustrated), the SiN layers 3a and 3b, and the $SiO_2$ layers 2a and 2b as masks. Then, a $SiO_2$ layer 26 is entirely deposited by ALD. A SiN layer 27 is formed on the peripheries of the Si pillars 4a and 4b.

Figure 3B:
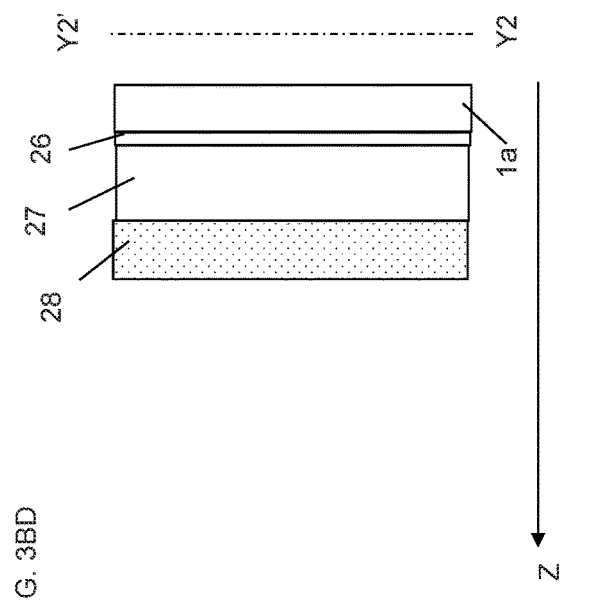
FIGS. 3BA to 3BD are a plan view and sectional views illustrating a CMOS inverter circuit for describing a method for producing a semiconductor device including an SGT according to a third embodiment.
Figure 3B:
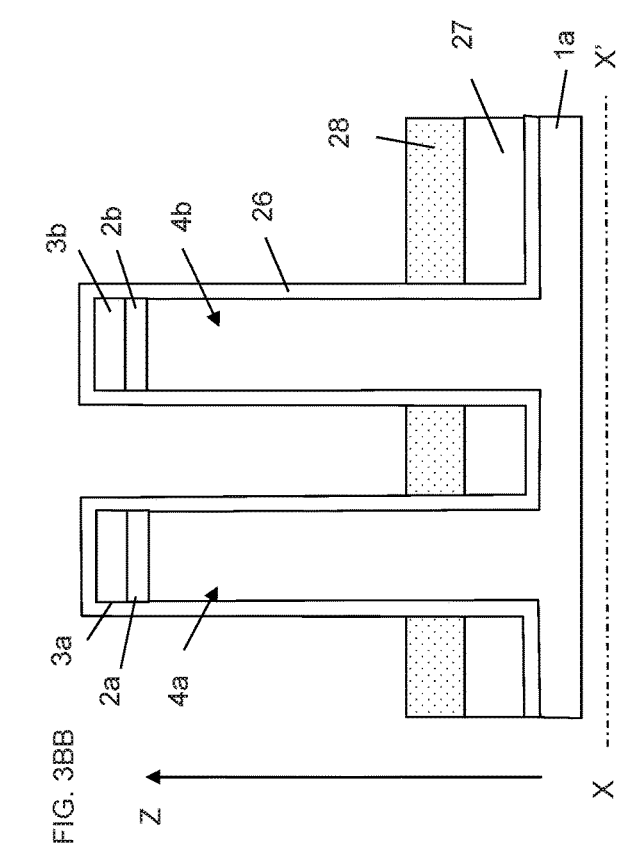
Figure 3B:
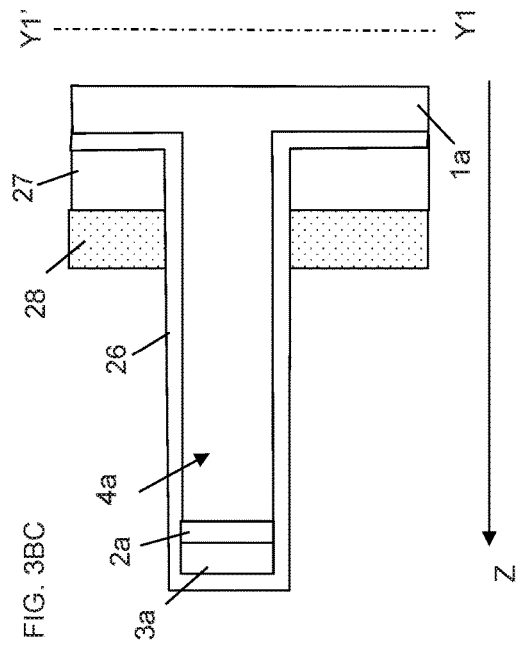
Figure 3B:
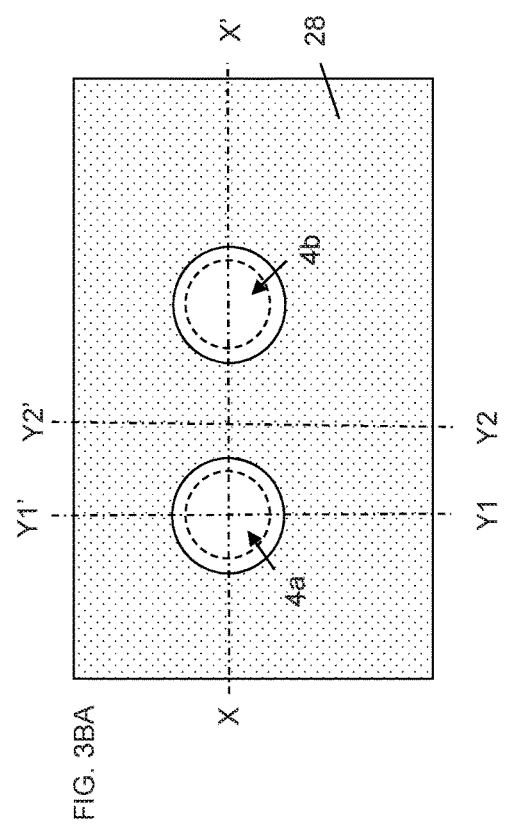

Next, as illustrated in FIGS. 3BA to 3BD, a resist layer 28 is formed on the SiN layer 27. Hydrogen fluoride (HF) gas is caused to flow throughout the substrate to etch the $SiO_2$ layer 26 that is in contact with the resist layer 28 (for the etching mechanism, refer to Tadashi Shibata, Susumu Kohyama, and Hisakazu Iizuka: "A New Field Isolation Technology for High Density MOS LSI", Japanese Journal of Applied Physics, Vol. 18, pp. 263-267 (1979)).

Figure 3C:
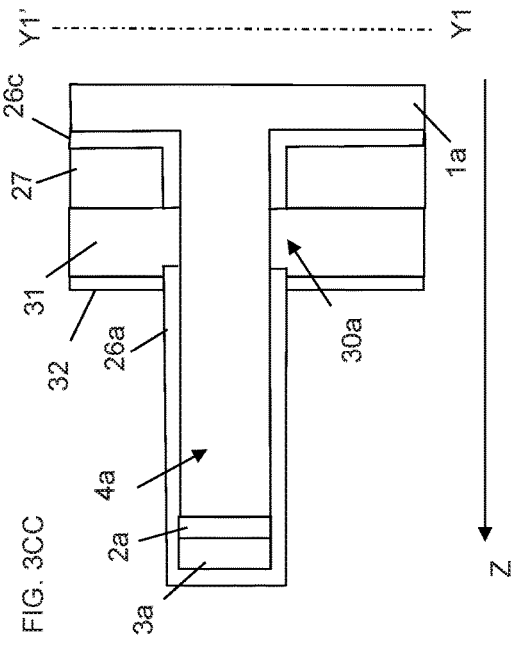
FIGS. 3CA to 3CD are a plan view and sectional views illustrating a CMOS inverter circuit for describing a method for producing a semiconductor device including an SGT according to a third embodiment.
Figure 3C:
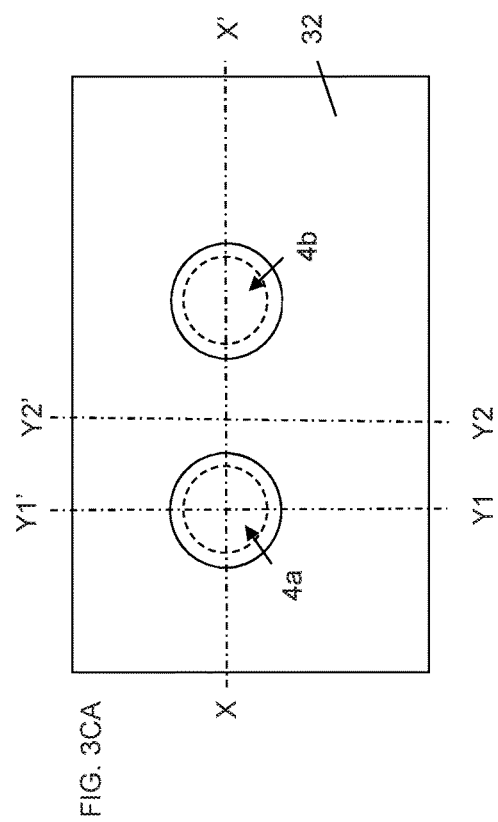
Figure 3C:
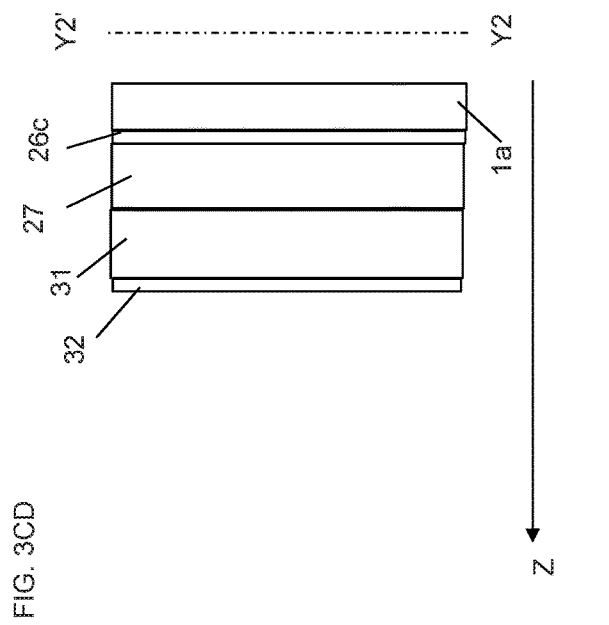
Figure 3C:
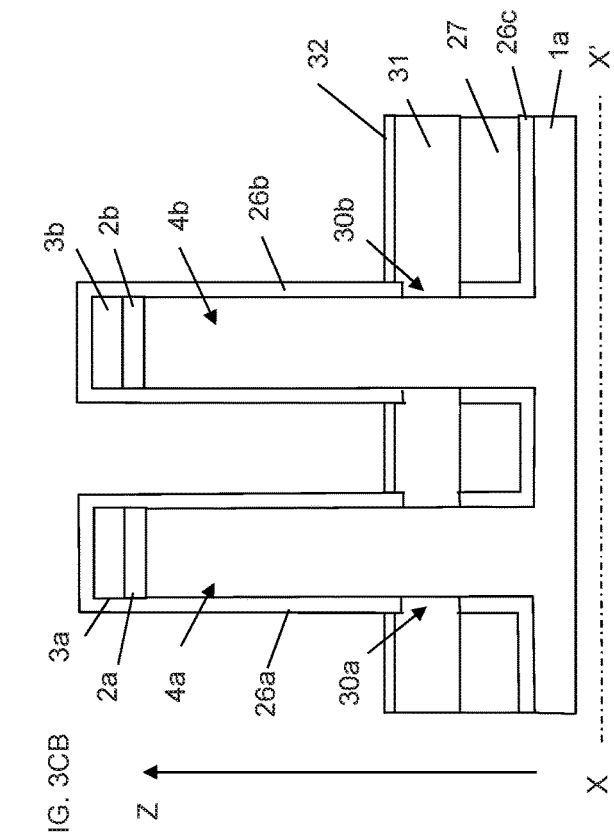

Next, as illustrated in FIG. 3CA to 3CD, as a result of the etching of the $SiO_2$ layer 26, holes 30a and 30b are formed in lower portions of the Si pillars 4a and 4b in a tubular shape. Thus, the $SiO_2$ layer 26 is divided into $SiO_2$ layers 26a and 26b that surround upper portions of the Si pillars 4a and 4b and a $SiO_2$ layer 26c that surrounds lower portions of the Si pillars 4a and 4b and lies on the i layer substrate 1a. The resist layer 28 is removed. A $WSi_2$ layer 31 is formed on the SiN layer 27 so as to have an upper surface positioned higher than the holes 30a and 30b formed as a result of the etching of the $SiO_2$ layer 26. A $SiO_2$ layer 32 is formed on the $WSi_2$ layer 31.

Figure 3D:
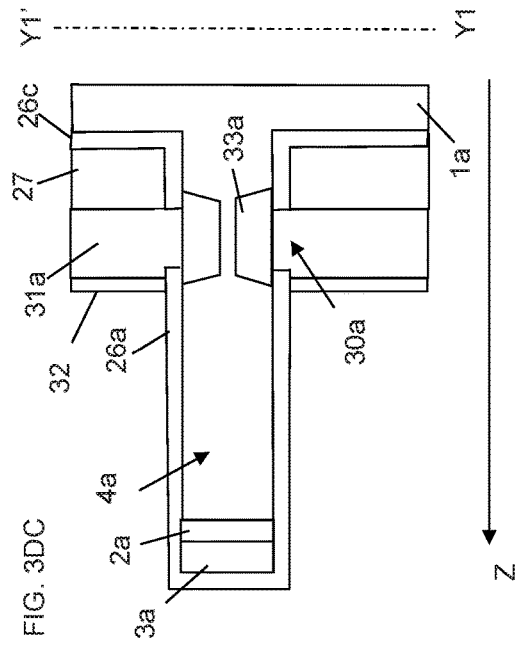
FIGS. 3DA to 3DD are a plan view and sectional views illustrating a CMOS inverter circuit for describing a method for producing a semiconductor device including an SGT according to a third embodiment.
Figure 3D:
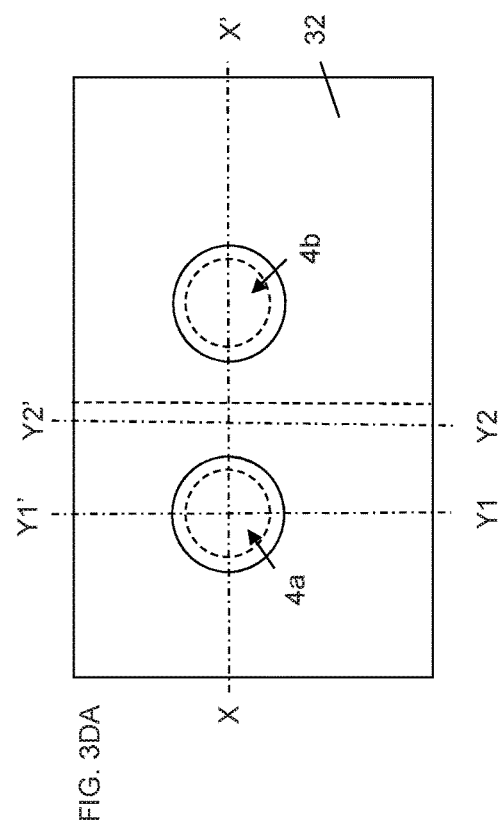
Figure 3D:
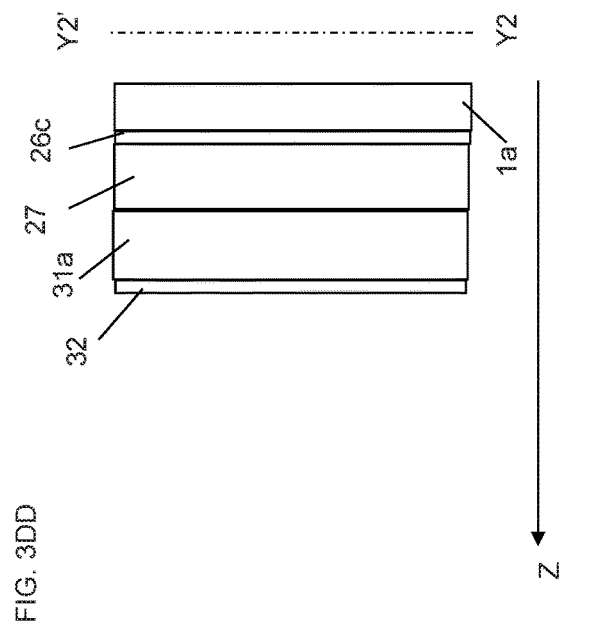
Figure 3D:
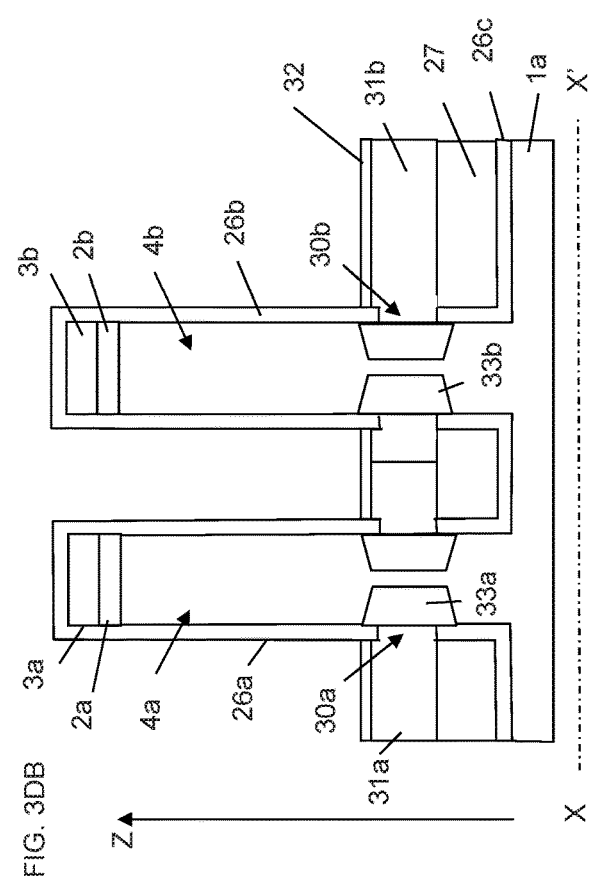

Next, as illustrated in FIGS. 3DA to 3DD, a $WSi_2$ layer 31a containing B atoms and a $WSi_2$ layer 31b containing As atoms are formed through the same processes as those described in FIG. 1DA to FIG. 1ED of the first embodiment. By performing heat treatment, the B atoms in the $WSi_2$ layer 31a are forced toward the inside of the Si pillar 4a to form a $P^+$ region 33a and the As atoms in the $WSi_2$ layer 31b are forced toward the inside of the Si pillar 4b to form an $N^+$ region 33b.

Next, as illustrated in FIG. 3EA to 3ED, a resist layer 13 that partly covers the Si pillars 4a and 4b in plan view is formed through the same process as that described in FIGS. 1GA to 1GD of the first embodiment. The $SiO_2$ layer 32 and the $WSi_2$ layers 31a and 31b are etched by RIE using, as masks, the resist layer 13 and the $SiO_2$ layers 26a and 26b that cover the entire peripheries of the Si pillars 4a and 4b in plan view. Thus, $WSi_2$ layers 31aa and 31bb are formed below the $SiO_2$ layers 26a and 26b and the resist layer 13. A $SiO_2$ layer 32a is left below the resist layer 13.

Next, as illustrated in FIGS. 3FA to 3FD, the resist layer 13 and the $SiO_2$ layers 26a, 26b, and 32a are removed. A $SiO_2$ layer 35, a $HfO_2$ layer 36, and a TiN layer 37 are formed as in the case of the $SiO_2$ layer 14, the $HfO_2$ layer 15, and the TiN layer 16. Then, a CMOS inverter circuit is formed on the i layer substrate 1a by performing the same processes as those in FIG. 1HA to FIG. 1JD of the first embodiment.

In this embodiment, the $WSi_2$ layers 31aa and 31bb, which are similar to the $WSi_2$ layers 7aa and 7bb, can be formed without forming the $SiO_2$ layers 11a and 11b on the side surfaces of the Si pillars 4a and 4b unlike in the first embodiment. Thus, the same advantages as those of the first embodiment are obtained.

Fourth Embodiment

FIG. 4AA to FIG. 4DD illustrate a method for producing a CMOS inverter circuit including an SGT according to a fourth embodiment of the present invention. Among FIG. 4AA to FIG. 4DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

In the third embodiment, as illustrated in FIGS. 3CA to 3CD, the holes 30a and 30b are formed, in a tubular shape, in the lower portions of the $SiO_2$ layers 26a and 26b that cover the Si pillars 4a and 4b. On the other hand, in this embodiment, as illustrated in FIGS. 4AA to 4AD, a $HfO_2$ layer (not illustrated), a TiN layer (not illustrated), and a $SiO_2$ layer (not illustrated) formed on the SiN layer 27 so as to cover the Si pillars 4a and 4b are etched using HF gas in the same manner as in the third embodiment to form tubular holes 30A and 30B in lower portions of the Si pillars 4a and 4b. Thus, $HfO_2$ layers 15A and 15B, TiN layers 16A and 16B, and $SiO_2$ layers 38a and 38b are formed so as to cover the Si pillars 4a and 4b. Titanium oxide (TiO) layers 39a and 39b are formed on surfaces of the TiN layers 16A and 16B, the surfaces facing the holes 30A and 30B.

Next, as illustrated in FIGS. 4BA to 4BD, for example, a $CoSi_2$ layer (not illustrated) and a $SiO_2$ layer 40 are formed on the SiN layer 27 so as to each have an upper surface positioned higher than the holes 30A and 30B. As in the second embodiment, a $CoSi_2$ layer 41a that surrounds the Si pillar 4a and contains B atoms and a $CoSi_2$ layer 41b that surrounds the Si pillar 4b and contains As atoms are formed by ion implantation. By performing heat treatment, the B atoms in the $CoSi_2$ layer 41a are forced toward the inside of the Si pillar 4a to form a $P^+$ region 42a, and the As atoms in the $CoSi_2$ layer 41b are forced toward the inside of the Si pillar 4b to form an $N^+$ region 42b. At the same time, $CoSi_2$ layers 43a and 43b are formed in the peripheral portions of the Si pillars 4a and 4b that are in contact with the $CoSi_2$ layers 41a and 41b.

Next, as illustrated in FIGS. 4CA to 4CD, a resist layer 13 that partly overlaps the top portions of the $SiO_2$ layers 38a and 38b that cover the Si pillars 4a and 4b is formed as in the first embodiment. The $SiO_2$ layer 40 and the $CoSi_2$ layers 41a and 41b are etched by RIE using the resist layer 13 and the $SiO_2$ layers 38a and 38b as masks to form a $SiO_2$ layer 40a and $CoSi_2$ layers 41aa and 41bb.

Subsequently, the resist layer 13 is removed. As illustrated in FIGS. 4DA to 4DD, a SiN layer 45 is then formed on the peripheries of the Si pillars 4a and 4b so as to have an upper surface positioned higher than the $P^+$ region 42a and the $N^+$ region 42b. Holes that surround the TiN layers 16A and 16B are formed in the $SiO_2$ layers 38A and 38B such that the upper surface of the SiN layer 45 is flush with the lower ends of the holes. For example, a NiSi layer 46 is formed on the SiN layer 45 so as to be connected to the TiN layers 16A and 16B. A $SiO_2$ layer 47 is formed on the SiN layer 45 and the NiSi layer 46 so as to have an upper surface positioned lower than the tops of the Si pillars 4a and 4b. A $P^+$ region 19a is formed in a top portion of the Si pillar 4a and an $N^+$ region 19b is formed in a top portion of the Si pillar 4b. A $SiO_2$ layer 21 is entirely formed. A contact hole 22a is formed on the $P^+$ region 19a. A contact hole 22b is formed on the $N^+$ region 19b. A contact hole 22C is formed on the NiSi layer 46. A contact hole 22d that is connected to the upper surfaces and side surfaces of the $CoSi_2$ layers 41aa and 41bb is formed. A power supply wiring metal layer Vdd connected to the $P^+$ region 19a through the contact hole 22a, a ground wiring metal layer Vss connected to the $N^+$ region 19b through the contact hole 22b, an input wiring metal layer Vin connected to the NiSi layer 46 through the contact hole 22C, and an output wiring metal layer Vout connected to the $CoSi_2$ layers 41aa and 41bb through the contact hole 22d are formed on the SiO$_2$ layer 21. Thus, a CMOS inverter circuit is formed on the i layer substrate 1a.

This embodiment provides the following advantages.

1. In this embodiment, as described with reference to FIGS. 4CA to 4CD, the CoSi$_2$ layers 41a and 41b are etched using, as masks, the HfO$_2$ layers 15a and 15b, the TiN layers 16A and 16B, and the SiO$_2$ layers 38a and 38b that surround the Si pillars 4a and 4b to form CoSi$_2$ layers 41aa and 41bb that surround the entire peripheries of the Si pillars 4a and 4b in a tubular shape with an equal width. By using, as mask material layers, the HfO$_2$ layers 15a and 15b serving as gate insulating layers, the TiN layers 16A and 16B serving as gate conductor layers, and the SiO$_2$ layers 38a and 38b serving as gate protection layers, the process can be simplified.

2. In the first embodiment, the thin SiO$_2$ layer 8a and the thin HfO$_2$ layer 15a lie between the WSi$_2$ layers 7aa and 7bb connected to the P$^+$ region 12a and the N$^+$ region 12b serving as drain layers and the TiN layer 16a serving as a gate conductor layer. Therefore, there is a large capacitance between the drain P$^+$ region 12a and N$^+$ region 12b and the gate TiN layer 16a. This inhibits the increase in the speed of the CMOS inverter circuit. In contrast, in this embodiment, a thick SiN layer 45 is formed between the NiSi layer 46 connected to the gate TiN layers 16A and 16B and the CoSi$_2$ layers 41aa and 41bb connected to the drain P$^+$ region 42a and N$^+$ region 42b. This can reduce the capacitance between the NiSi layer 46 connected to the gate TiN layers 16A and 16B and the drain P$^+$ region 42a and N$^+$ region 42b. This increases the speed of the CMOS inverter circuit.

Modification of Fourth Embodiment

In this embodiment, the SiO$_2$ layer 40 and the CoSi$_2$ layers 41a and 41b are etched by RIE using the resist layer 13 and the SiO$_2$ layers 38a and 38b as masks to form the SiO$_2$ layer 40a and the CoSi$_2$ layers 41aa and 41bb. Instead of the formation of the SiO$_2$ layers 38a and 38b, an appropriate etchant such as an etchant that etches TiN but not SiO$_2$ or CoSi$_2$ may be used in RIE. In this case, the SiO$_2$ layer 40a and the CoSi$_2$ layers 41aa and 41bb can be formed using, as masks, the resist layer 13 and the TiN layers 16A and 16B serving as gate conductor layers.

Fifth Embodiment

Figure 5A:
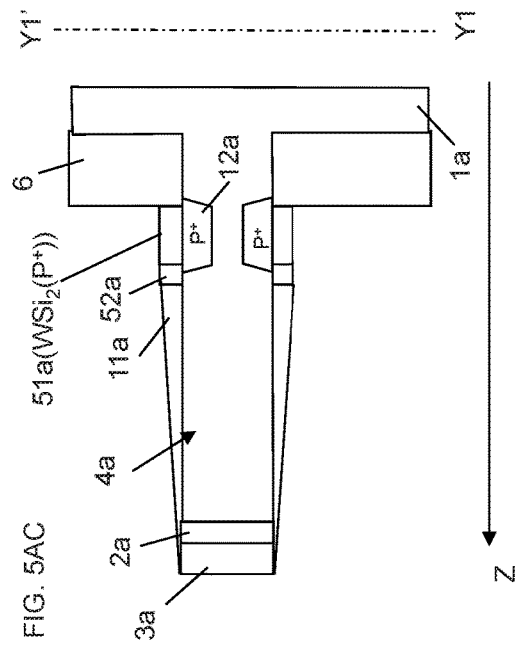
FIGS. 5AA to 5AD are a plan view and sectional views illustrating a CMOS inverter circuit for describing a method for producing a semiconductor device including an SGT according to a fifth embodiment.
Figure 5A:
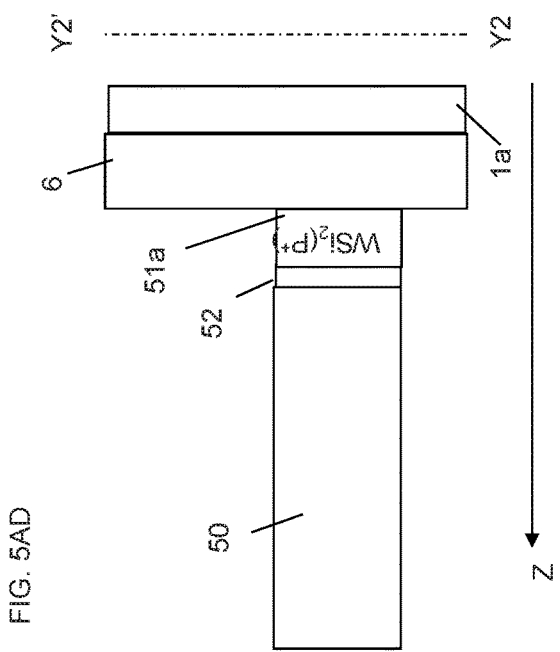
Figure 5A:
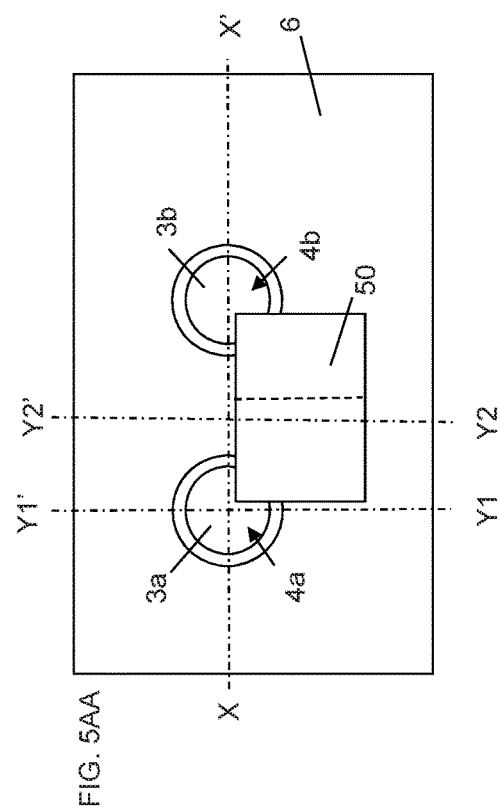
Figure 5A:
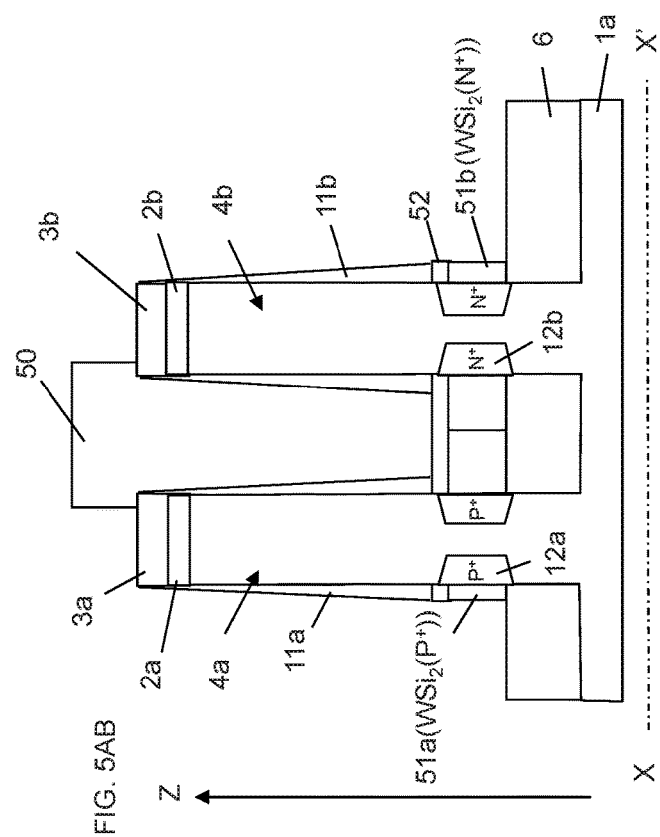

FIG. 5AA to FIG. 5DD illustrate a method for producing a CMOS inverter circuit including an SGT according to a fifth embodiment of the present invention. Among FIG. 5AA to FIG. 5DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 5AA to 5AD, a resist layer 50 is formed, in plan view, at a lower position in FIG. 5AA than the resist layer 13 in FIGS. 1GA to 1GD of the first embodiment so as to partly cover the Si pillars 4a and 4b. In the same manner as in the first embodiment, RIE is performed using, as masks, the resist layer 50 and the SiO$_2$ layers 11a and 11b formed on the side surfaces of the peripheries of the Si pillars 4a and 4b to form a WSi$_2$ layer 51a containing B atoms, a WSi$_2$ layer 51b containing As atoms, and a SiO$_2$ layer 52. The resist layer 50 is removed.

Figure 5B:
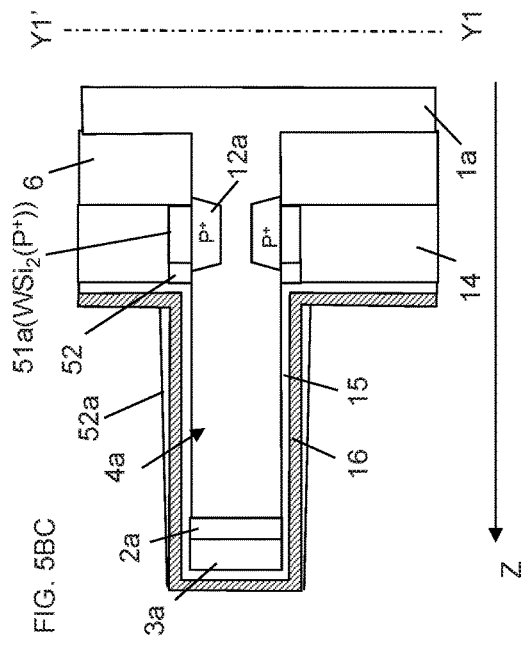
FIGS. 5BA to 5BD are a plan view and sectional views illustrating a CMOS inverter circuit for describing a method for producing a semiconductor device including an SGT according to a fifth embodiment.
Figure 5B:
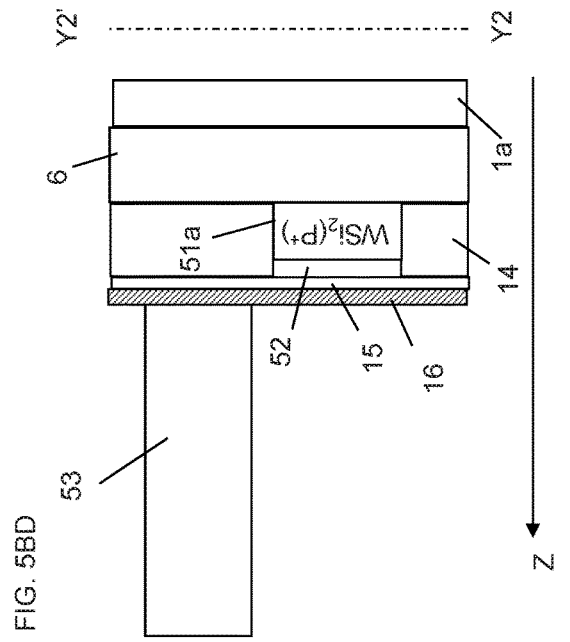
Figure 5B:
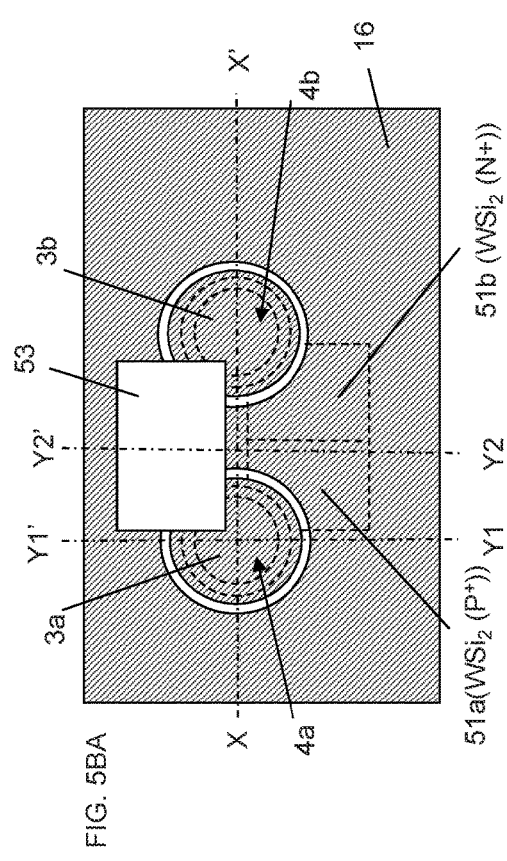
Figure 5B:
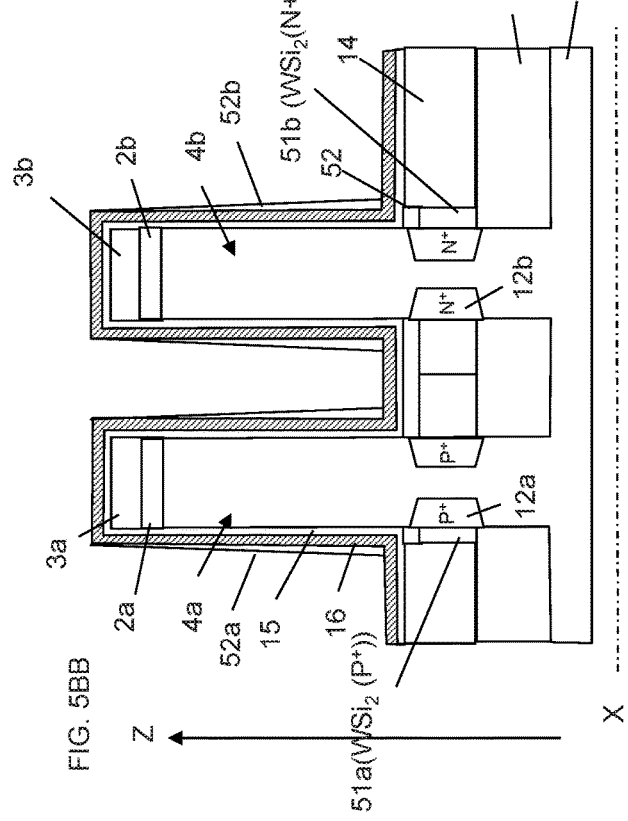

Next, as illustrated in FIGS. 5BA to 5BD, a SiO$_2$ layer 14 is formed on the SiO$_2$ layer 6 so as to have an upper surface that is flush with the upper surface of the SiO$_2$ layer 52. A HfO$_2$ layer 15, a TiN layer 16, and a SiO$_2$ layer (not illustrated) are entirely deposited. SiO$_2$ layers 52a and 52b are formed on the side surface of the TiN layer 16 that surrounds the Si pillars 4a and 4b by performing an etchback process. A resist layer 53 that is connected to the Si pillars 4a and 4b in the upper part of FIG. 5BA so as to partly cover the Si pillars 4a and 4b in plan view is formed.

Figure 5C:
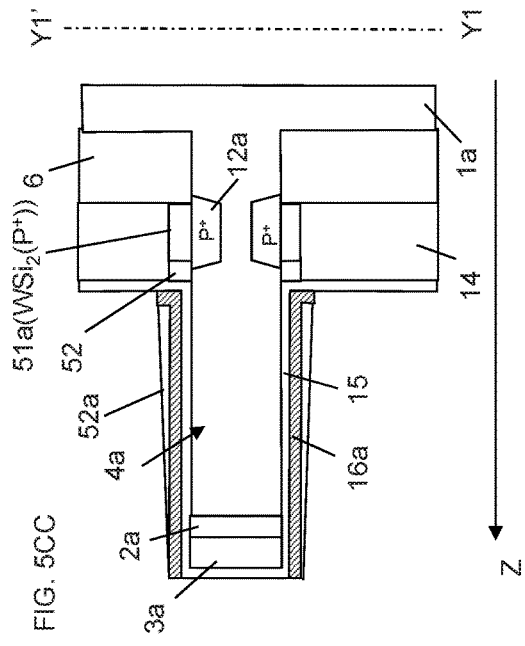
FIGS. 5CA to 5CD are a plan view and sectional views illustrating a CMOS inverter circuit for describing a method for producing a semiconductor device including an SGT according to a fifth embodiment.
Figure 5C:
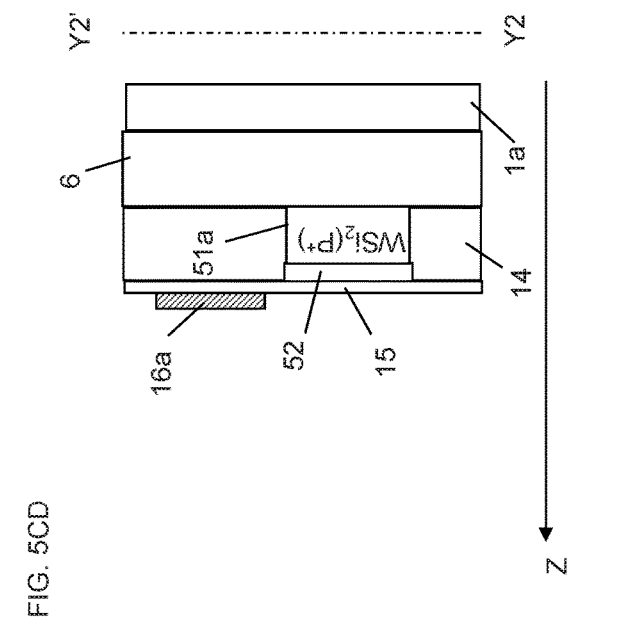
Figure 5C:
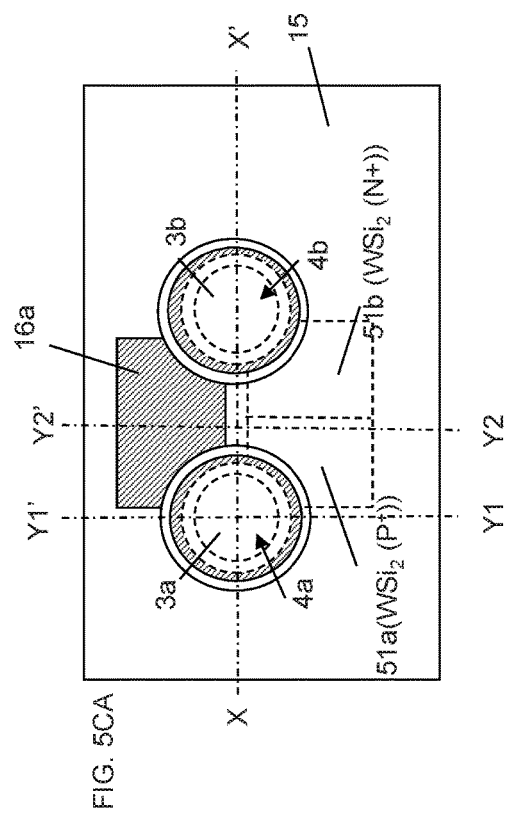
Figure 5C:
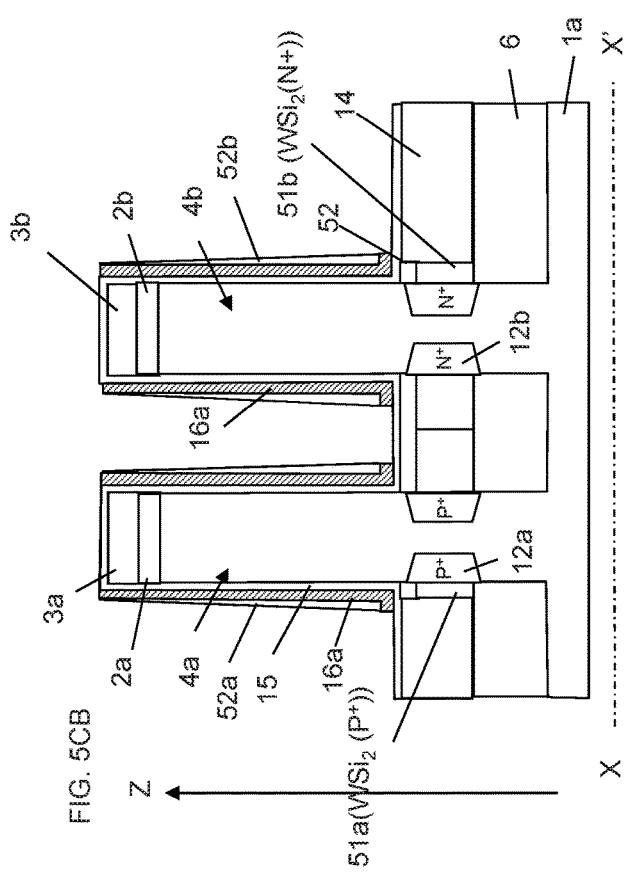

Next, as illustrated in FIGS. 5CA to 5CD, the TiN layer 16 is etched by RIE using, as masks, the resist layer 53 and the SiO$_2$ layers 52a and 52b formed on the side surfaces of the peripheries of the Si pillars 4a and 4b. Thus, a TiN layer 16a is formed that is connected to the side surface of the HfO$_2$ layer 15 on the side surfaces of the Si pillars 4a and 4b and the surface of the HfO$_2$ layer 15 on the SiO$_2$ layer 14. The resist layer 53 is removed.

Next, as illustrated in FIGS. 5DA to 5DD, a SiO$_2$ layer 18, a P$^+$ region 19a, an N$^+$ region 19b, a HfO$_2$ layer 15a, and a SiO$_2$ layer 21 are formed in the same manner as in the first embodiment. A contact hole 22a is formed on the P$^+$ region 19a. A contact hole 22b is formed on the N$^+$ region 19b. A contact hole 22e is formed on the TiN layer 16a. A contact hole 22d is formed so as to be connected to the upper and side surfaces of the WSi$_2$ layers 51a and 51b. A power supply wiring metal layer VDD connected to the P$^+$ region 19a through the contact hole 22a, a ground wiring metal layer VSS connected to the N$^+$ region 19b through the contact hole 22b, an input wiring metal layer VIN connected to the TiN layer 16a through the contact hole 22e, and an output wiring metal layer VOUT connected to the WSi$_2$ layers 51a and 51b through the contact hole 22d are formed on the SiO$_2$ layer 21. Thus, a CMOS inverter circuit is formed on the i layer substrate 1a.

This embodiment provides the following advantages.

1. In the first embodiment, the majority of the WSi$_2$ layers 7aa and 7bb overlaps the TiN layer 16a in plan view. On the other hand, in this embodiment, the WSi$_2$ layers 51a and 51b and the TiN layer 16a do not overlap each other in plan view except for regions in which they surround the entire peripheries of the Si pillars 4a and 4b with an equal width. Thus, the capacitance between the gate TiN layer 16a and the drain P$^+$ region 12a and N$^+$ region 12b can be reduced. This increases the speed of the CMOS inverter circuit.

2. It has been described in this embodiment that the WSi$_2$ layers 51a and 51b and the TiN layer 16a are formed so as not to overlap each other in plan view except for regions in which the WSi$_2$ layers 51a and 51b and the TiN layer 16a surround the entire peripheries of the Si pillars 4a and 4b with an equal width. However, even when the WSi$_2$ layers 51a and 51b and the TiN layer 16a partly overlap each other in plan view in a region other than the regions in which they surround the entire peripheries of the Si pillars 4a and 4b with an equal width, the capacitance between the WSi$_2$ layers 51a and 51b and the TiN layer 16a can be reduced. In terms of design, the overlap dimensions are determined in consideration of, for example, performance and cost.

3. The feature of this embodiment is that the overlapping of the WSi$_2$ layers 51a and 51b and the TiN layer 16a is determined by both the rectangular pattern of the resist layer 50 used for forming the WSi$_2$ layers 51a and 51b and the rectangular pattern of the resist layer (not illustrated) for forming the TiN layer 16a. The WSi$_2$ layers 51a and 51b and the TiN layer 16a that surround the peripheries of the Si pillars 4a and 4b with an equal width are formed in a self-aligned manner with the SiO$_2$ layers 11a, 11b, 52a, and 52b. This indicates that the overlapping of the WSi$_2$ layers 51a and 51b and the TiN layer 16a can be easily controlled. In addition to the overlapping, the shapes of the WSi$_2$ layers 51a and 51b and the TiN layer 16a can also be easily controlled in consideration of, for example, performance and cost.

Sixth Embodiment

Figure 6A:
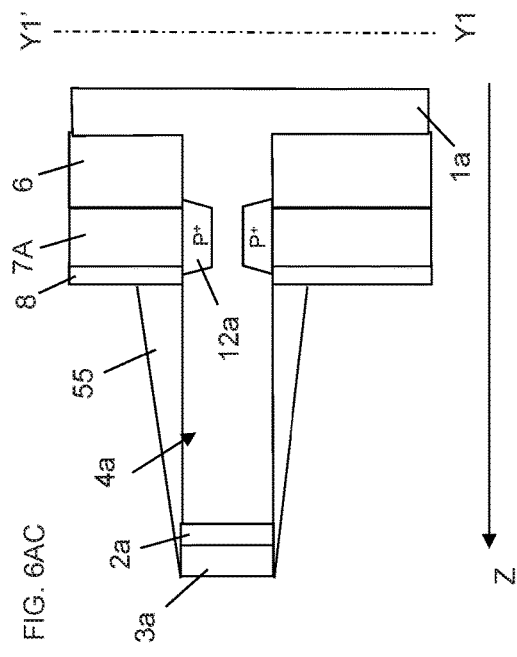
FIGS. 6AA to 6AD are a plan view and sectional views illustrating a CMOS inverter circuit for describing a method for producing a semiconductor device including an SGT according to a sixth embodiment.
Figure 6A:
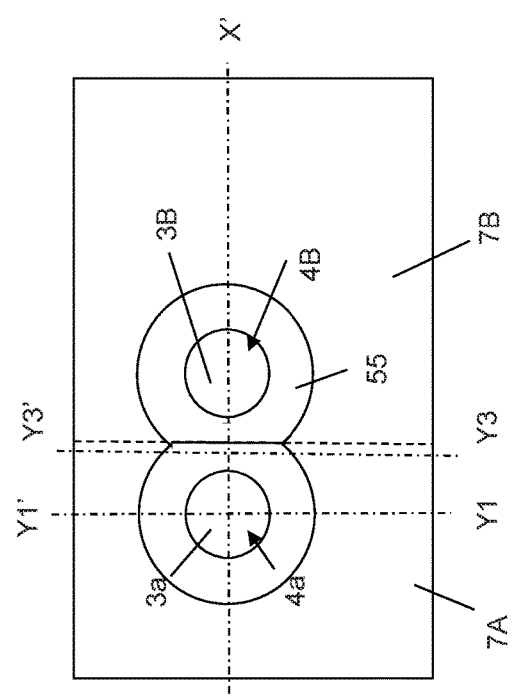
Figure 6A:
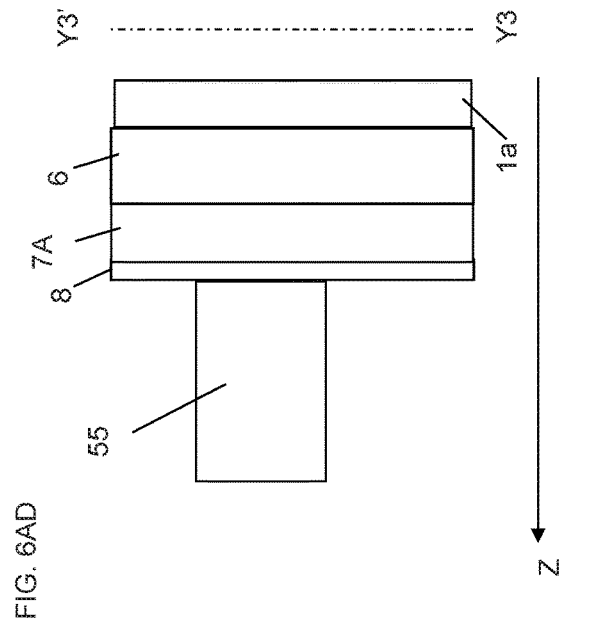
Figure 6A:
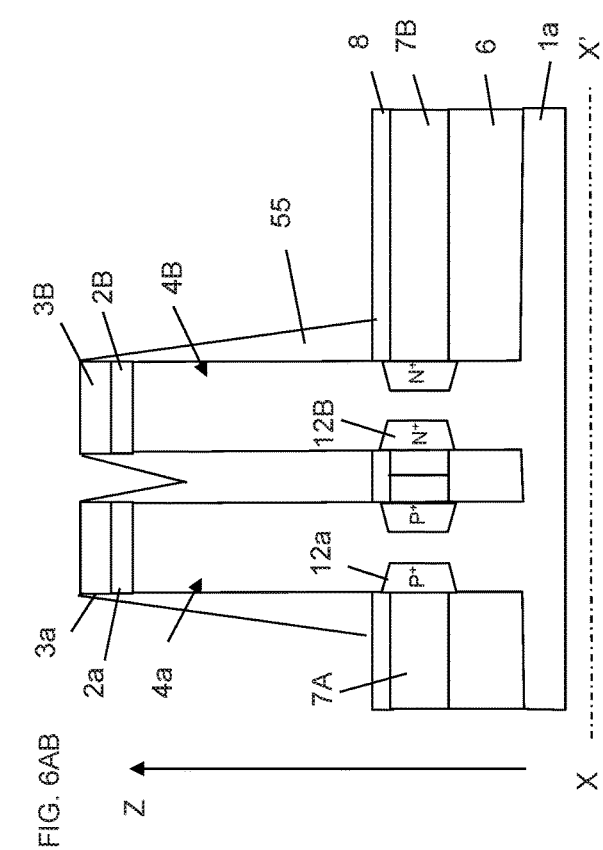
Figure 6B:
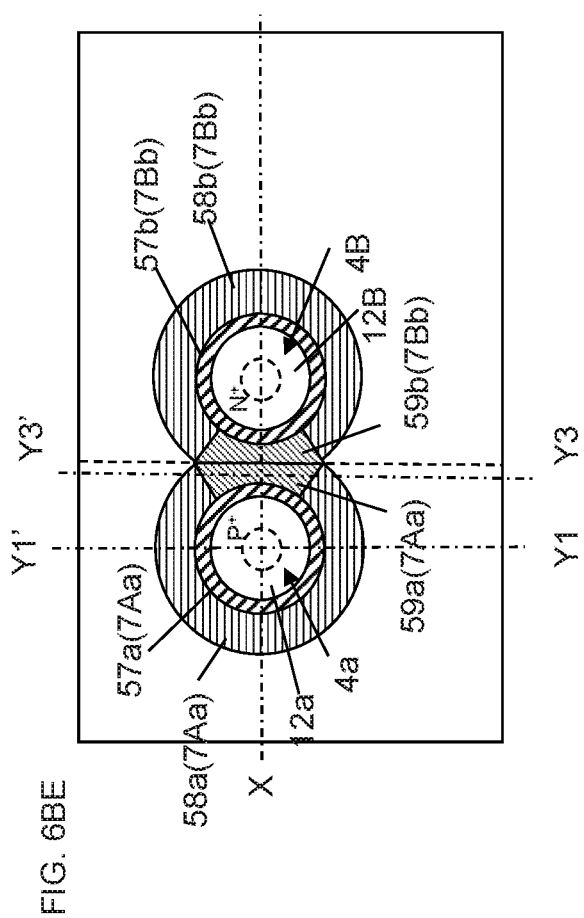
FIGS. 6BA to 6BE are plan views and sectional views illustrating a CMOS inverter circuit for describing a method for producing a semiconductor device including an SGT according to a sixth embodiment.

FIG. 6A to FIG. 6BE illustrate a method for producing a CMOS inverter circuit including an SGT according to a sixth embodiment of the present invention. Among FIG. 6AA to FIG. 6BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 6AA to 6AD, Si pillars 4a and 4B are formed on the i layer substrate 1a. The Si pillar 4B is formed closer to the Si pillar 4a than the Si pillar 4b in the first embodiment. A SiO$_2$ layer 2a and a SiN layer 3a are formed on the Si pillar 4a. A SiO$_2$ layer 2B and a SiN layer 3B are formed on the Si pillar 4B. A SiO$_2$ layer 6, a WSi$_2$ layer 7A containing B atoms, a WSi$_2$ layer 7B containing As atoms, and a SiO$_2$ layer 8 are formed on the peripheries of the Si pillars 4a and 4B. By performing heat treatment, a P$^+$ region 12a is formed in a portion of the Si pillar 4a that is in contact with the WSi$_2$ layer 7A, and an N$^+$ region 12B is formed in a portion of the Si pillar 4B that is in contact with the WSi$_2$ layer 7B. A SiO$_2$ film (not illustrated) is entirely deposited by CVD and then etched back by RIE to form SiO$_2$ layers 55 on the side surfaces of the Si pillars 4a and 4B. The SiO$_2$ layers 55 are formed so as to be connected to each other in a portion between the Si pillars 4a and 4B.

Next, as illustrated in FIGS. 6BA to 6BD, the SiO$_2$ layer 8 and the WSi$_2$ layers 7A and 7B are etched using the SiO$_2$ layer 55 as a mask to form a SiO$_2$ layer 8A and WSi$_2$ layers 7Aa and 7Bb. Subsequently, the same processes as those in the first embodiment are performed to form a CMOS inverter circuit.

FIG. 6BE illustrates the relationship between the Si pillars 4a and 4B, the P$^+$ region 12a, the N$^+$ region 12B, and the WSi$_2$ layers 7Aa and 7Bb in plan view. The diagonally shaded area indicates the WSi$_2$ layers 7Aa and 7Bb. The WSi$_2$ layer 7Aa is constituted by a WSi$_2$ layer 57a serving as a first alloy layer that is formed in a self-aligned manner with the P$^+$ region 12a so as to surround the entire periphery of the Si pillar 4a, a WSi$_2$ layer 59a serving as a second alloy layer that is partly in contact with the periphery of the WSi$_2$ layer 57a in a connected manner, and a WSi$_2$ layer 58a serving as a fourth alloy layer that partly surrounds the periphery of the WSi$_2$ layer 57a and is connected to the WSi$_2$ layer 59a (in the second embodiment, the CoSi$_2$ layers 24a and 24b serving as third alloy layers are formed in the surface layers of the Si pillars 4a and 4b). The WSi$_2$ layer 7Bb is constituted by a WSi$_2$ layer 57b serving as a first alloy layer that is formed in a self-aligned manner with the N$^+$ region 12B so as to surround the entire periphery of the Si pillar 4B, a WSi$_2$ layer 59b serving as a second alloy layer that is partly in contact with the periphery of the WSi$_2$ layer 57b in a connected manner, and a WSi$_2$ layer 58b serving as a fourth alloy layer that partly surrounds the periphery of the WSi$_2$ layer 57b and is connected to the WSi$_2$ layer 59b.

In this embodiment, the WSi$_2$ layers 7Aa and 7Bb can be formed without using the resist layer 13 unlike in the first embodiment. This simplifies the process. Furthermore, the Si pillars 4a and 4B are located close to each other and thus the density of the circuit is increased.

Seventh Embodiment

Figure 7A:
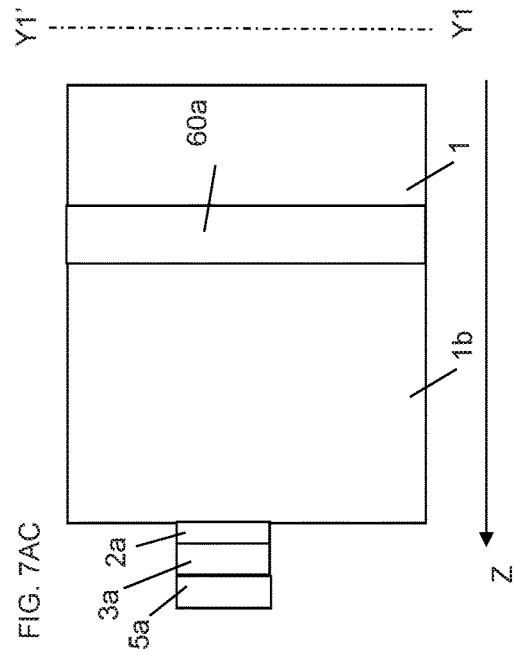
FIGS. 7AA to 7AD are a plan view and sectional views illustrating a CMOS inverter circuit for describing a method for producing a semiconductor device including an SGT according to a seventh embodiment.
Figure 7A:
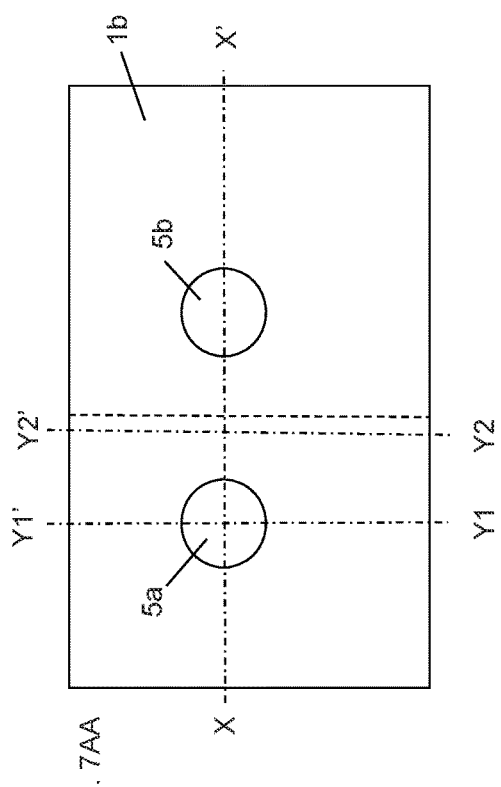
Figure 7A:
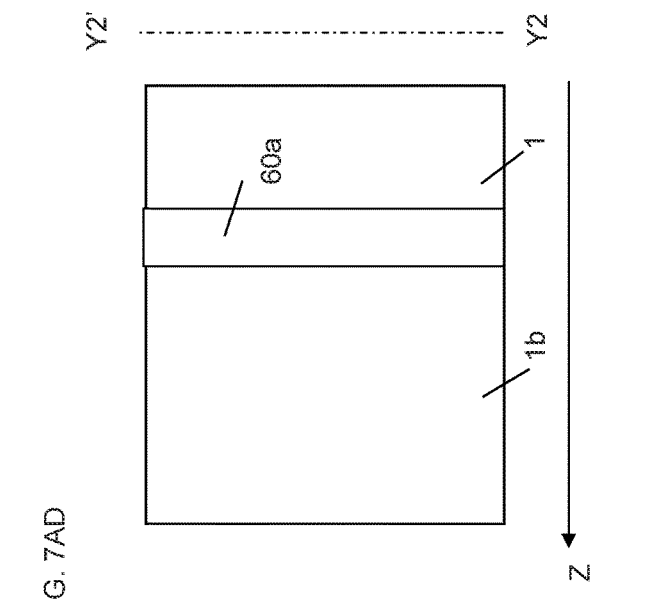
Figure 7A:
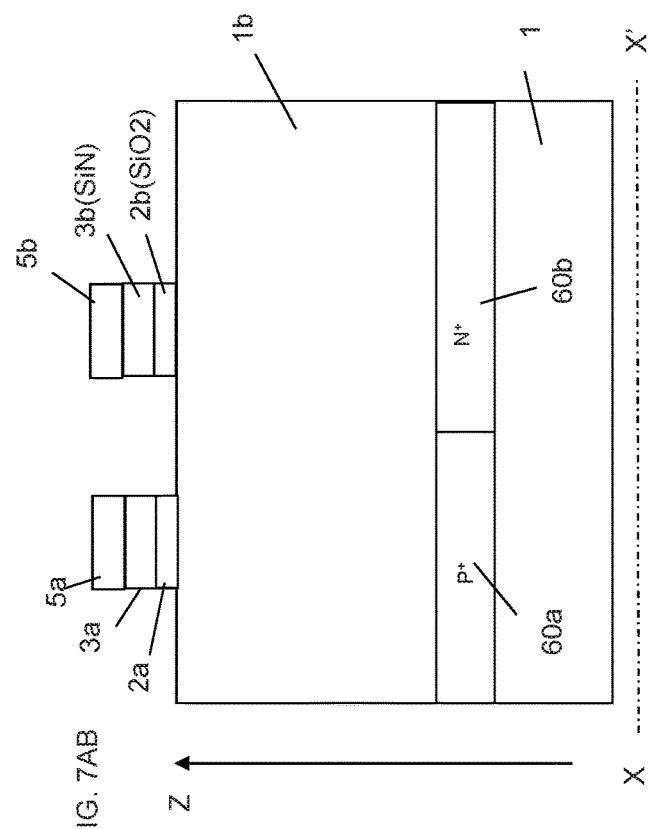

FIG. 7AA to FIG. 7CD illustrate a method for producing a CMOS inverter circuit including an SGT according to a seventh embodiment of the present invention. Among FIG. 7AA to FIG. 7CD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 7AA to 7AD, a P$^+$ region 60a and an N$^+$ region 60b are formed in a surface layer of an i layer substrate 1 by, for example, ion implantation. An i layer 1b is formed on the P$^+$ region 60a and the N$^+$ region 60b by, for example, a Si epitaxial process. As in the first embodiment, a SiO$_2$ layer 2a, a SiN layer 3a, and a resist layer 5a are formed on the i layer 1b above the P$^+$ region 60a, and a SiO$_2$ layer 2b, a SiN layer 3b, and a resist layer 5b are formed on the i layer 1b above the N$^+$ region 60b.

Figure 7B:
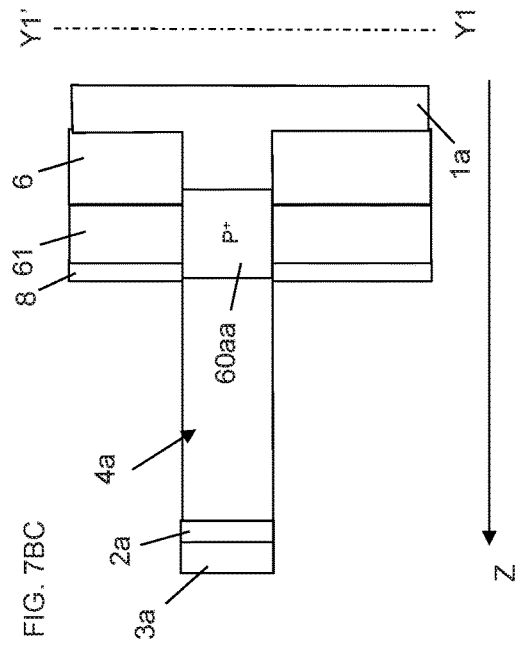
FIGS. 7BA to 7BD are a plan view and sectional views illustrating a CMOS inverter circuit for describing a method for producing a semiconductor device including an SGT according to a seventh embodiment.
Figure 7B:
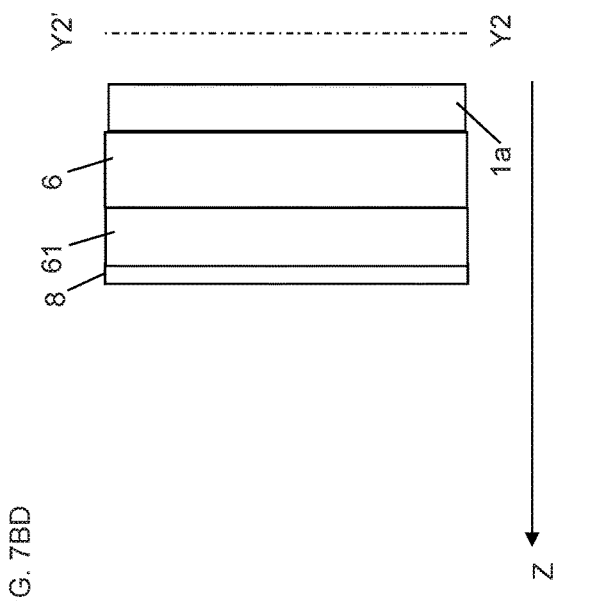
Figure 7B:
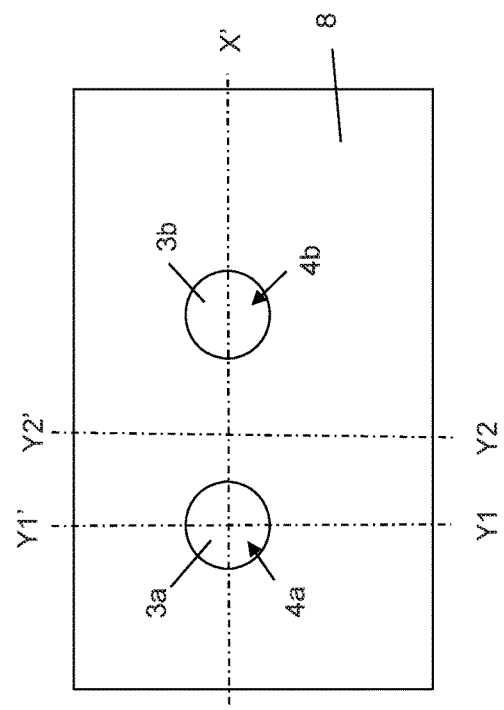
Figure 7B:
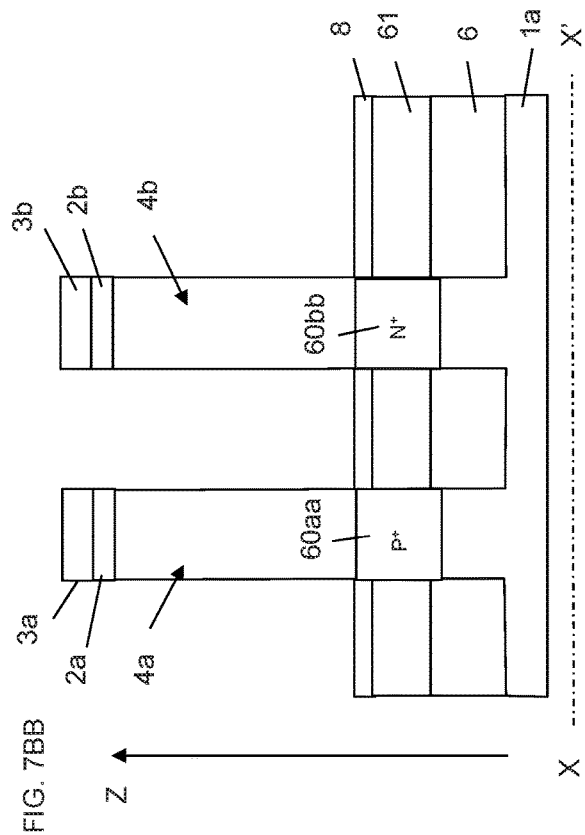

Next, as illustrated in FIGS. 7BA to 7BD, the i layer 1b, the P$^+$ region 60a, the N$^+$ region 60b, and the i layer substrate 1 are etched by RIE using, as masks, the SiO$_2$ layers 2a and 2b, the SiN layers 3a and 3b, and the resist layers 5a and 5b formed on the i layer 1b. Thus, as in the first embodiment, a lower portion of the i layer substrate 1 is left as an i layer substrate 1a and Si pillars 4a and 4b are formed on the i layer substrate 1a. As a result, a P$^+$ region 60aa and an N$^+$ region 60bb are formed in lower portions of the Si pillars 4a and 4b. Then, a SiO$_2$ layer 6, a WSi$_2$ layer 61, and a SiO$_2$ layer 8 including a SiO$_2$ layer and a SiN layer from the bottom is formed on the i layer substrate 1a on the peripheries of the Si pillars 4a and 4b.

Next, as illustrated in FIGS. 7CA to 7CD, the same processes as those in the first embodiment are performed. First, SiO$_2$ layers 11a and 11b are formed on the side surfaces of the peripheries of the Si pillars 4a and 4b. A resist layer 13 that partly covers the top portions of the Si pillars 4a and 4b in a connected manner is formed. The SiO$_2$ layer 8 and the WSi$_2$ layer 61 are etched by RIE using the SiO$_2$ layers 11a and 11b and the resist layer 13 as masks to form a SiO$_2$ layer 8a and a WSi$_2$ layer 61a.

Finally, the resist layer 13 is removed. Subsequently, by performing the same processes as those in the first embodiment, a CMOS inverter circuit is formed.

This embodiment provides the following advantages.

1. In this embodiment, before the formation of the WSi$_2$ layer 61, the P$^+$ region 60aa and the N$^+$ region 60bb are formed in the Si pillars 4a and 4b. Thus, the WSi$_2$ layer 61a constituted by the first alloy layers that surround the entire peripheries of the P$^+$ region 60aa and the N$^+$ region 60bb and the second alloy layer that is partly in contact with the peripheries of the first alloy layers in a connected manner can be formed without forming the WSi$_2$ layer 7a containing B atoms or the WSi$_2$ layer 7b containing As atoms unlike in the first embodiment.

2. In the first embodiment, by performing heat treatment, donor or acceptor impurity atoms are forced toward the inside of the Si pillars 4a and 4b from the WSi$_2$ layer 7a containing B atoms and the WSi$_2$ layer 7b containing As atoms. Thus, the P$^+$ region 12a and the N$^+$ region 12b are formed. In this case, the heat treatment conditions such as temperature and time need to be set in consideration of, for example, separation of the WSi$_2$ layers 7a and 7b caused by generation of stress. In contrast, in this embodiment, such a problem does not arise because the P$^+$ region 60aa and the N$^+$ region 60bb are formed before the formation of the WSi$_2$ layer 61. Furthermore, the impurity concentration of the P$^+$ region 60aa and the N$^+$ region 60bb can be sufficiently increased. This can reduce the resistance of the drain P$^+$ region 60aa and N$^+$ region 60bb.

Herein, as in the first embodiment, a WSi$_2$ layer region containing B atoms (corresponding to the WSi$_2$ layer 7a in the first embodiment) and a WSi$_2$ layer region containing As atoms (corresponding to the WSi$_2$ layer 7b in the first embodiment) may be formed. In this case, the B atoms and the As atoms are forced toward the side surfaces of the peripheries of the P$^+$ region 60aa and the N$^+$ region 60bb from the WSi$_2$ layer regions. Thus, the P$^+$ region 12a and the N$^+$ region 12b are formed as in the first embodiment, which can further reduce the contact resistances between the P$^+$ region 60aa and the WSi$_2$ layer 61a and between the N$^+$ region 60bb and the WSi$_2$ layer 61a. Furthermore, even if the P$^+$ region 12a and the N$^+$ region 12b are formed to positions close to the centers of the P$^+$ region 60aa and the N$^+$ region 60bb and thus the P$^+$ region 12a and the N$^+$ region 12b overlap the P$^+$ region 60aa and the N$^+$ region 60bb, no problems arise because a high-concentration donor or acceptor impurity region is formed in the Si pillars 4a and 4b. The same applies to other embodiments according to the present invention.

Eighth Embodiment

FIGS. 8A to 8D illustrate a method for producing a CMOS inverter circuit including an SGT according to an eighth embodiment of the present invention. FIG. 8A is a plan view, FIG. 8B is a sectional view taken along line X-X' in FIG. 8A, FIG. 8C is a sectional view taken along line Y1-Y1' in FIG. 8A, and FIG. 8D is a sectional view taken along line Y2-Y2' in FIG. 8A.

In the first embodiment, as illustrated in FIGS. 1GA to 1GD, the resist layer 13 is formed so as to partly cover the upper surfaces of the tops of the Si pillars 4a and 4b. On the other hand, in this embodiment, as illustrated in FIGS. 8A to 8D, a resist layer 13a is formed by lithography so as to have an upper surface positioned lower than the upper surfaces of the tops of the Si pillars 4a and 4b. The resist layer 13a is formed such that the upper surface of a resist layer (not illustrated) entirely applied is positioned lower than the upper surfaces of the tops of the Si pillars 4a and 4b by controlling, for example, the material for the resist layer, the viscosity, or the rotational speed during spin coating. The SiO$_2$ layer 8 (refer to FIGS. 1FA to 1FD) and the WSi$_2$ layers 7a and 7b (refer to FIGS. 1FA to 1FD) are etched by RIE using the resist layer 13a, the SiN layers 3a and 3b, and the SiO$_2$ layers 11a and 11b as masks to form a SiO$_2$ layer 8a and WSi$_2$ layers 7aa and 7bb as illustrated in FIGS. 1GA to 1GD. As in the first embodiment, the first alloy layers of the WSi$_2$ layers 7aa and 7bb that lie below the SiO$_2$ layers 11a and 11b are formed in a tubular shape with an equal width so as to surround the entire peripheries of the P$^+$ region 12a and the N$^+$ region 12b regardless of the mask misalignment in lithography during formation of the resist layer 13a.

This embodiment provides the following advantage.

In the first embodiment, a resist film (not illustrated) is applied so as to have an upper surface positioned higher than the upper surfaces of the tops of the Si pillars 4a and 4b, and then the resist layer 13 is formed by lithography. In this case, a thick resist film is used and thus the forming precision of the resist layer 13 may deteriorate. In contrast, in this embodiment, a thin resist film is used and thus the resist layer 13a is formed with high forming precision. In particular, this embodiment is effective for production of high-density SGT circuits.

Ninth Embodiment

Figure 9B:
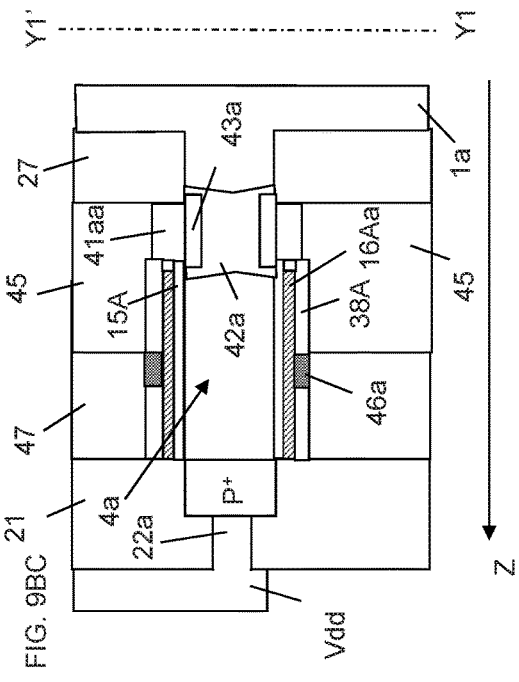
FIGS. 9BA to 9BD are a plan view and sectional views illustrating a CMOS inverter circuit for describing a method for producing a semiconductor device including an SGT according to a ninth embodiment.
Figure 9B:
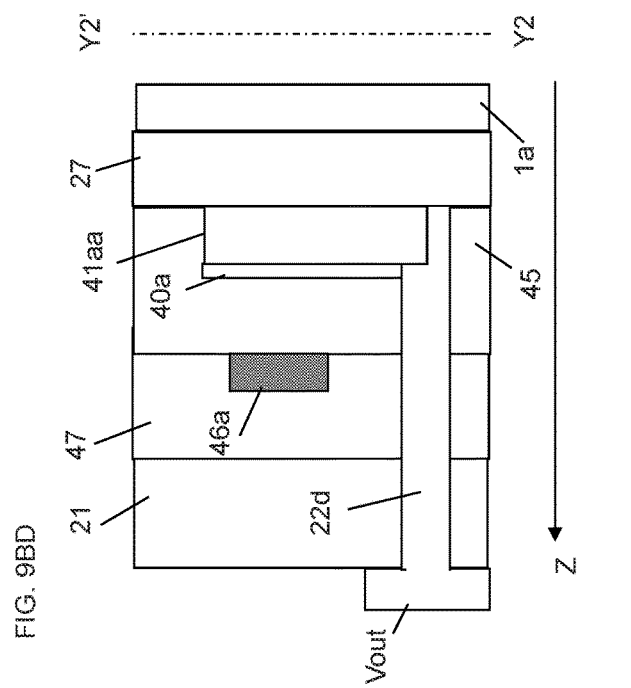
Figure 9B:
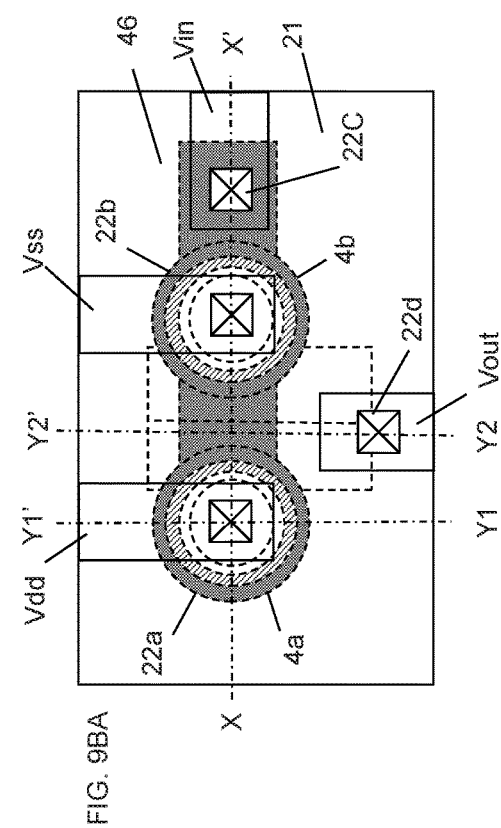
Figure 9B:
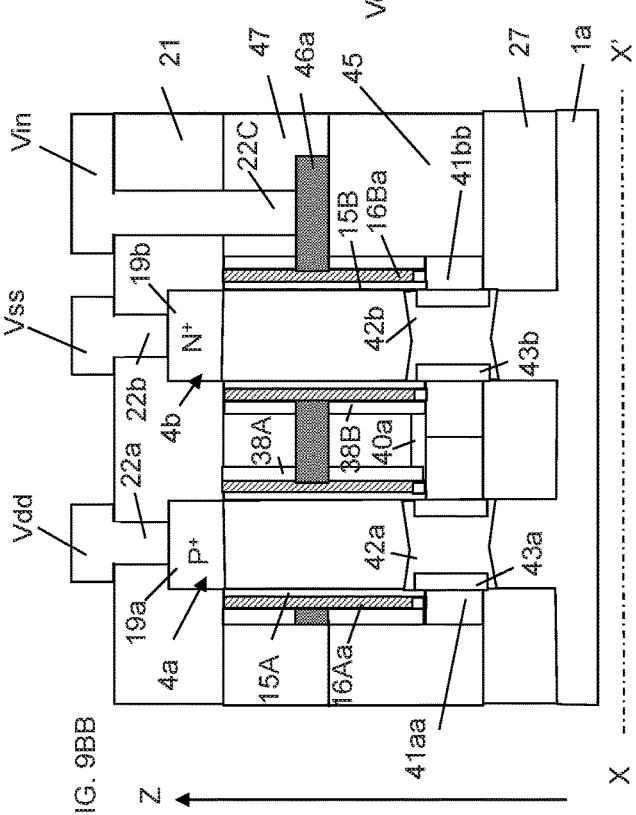

FIG. 9AA to FIG. 9BD illustrate a method for producing a CMOS inverter circuit including an SGT according to a ninth embodiment of the present invention. This embodiment is provided to further enhance the features of the fourth embodiment. Among FIG. 9AA to FIG. 9BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 9AA to 9AD, a SiN layer 45 is formed on the peripheries of the Si pillars 4a and 4b so as to have an upper surface positioned higher than the P$^+$ region 42a and the N$^+$ region 42b as in the case of FIGS. 4DA to 4DD. Holes that surround the side surfaces of the TiN layers 16a and 16b are formed in the side surfaces of the SiO$_2$ layers 38a and 38b such that the upper surface of the SiN layer 45 is flush with the lower ends of the holes. For example, a NiSi layer (not illustrated) is formed on the peripheries of the Si pillars 4a and 4b in plan view so as to be connected to the TiN layers 16a and 16b. A resist layer 13b is formed on the NiSi layer by lithography so as to be partly connected to the peripheries of the SiO$_2$ layers 38a and 38b. The NiSi layer is etched using the resist layer 13a and the SiO$_2$ layers 38a and 38b as masks to form a NiSi layer 46a. The resist layer 13b is removed.

Subsequently, by performing the same processes as those illustrated in FIGS. 4DA to 4DD, a CMOS inverter circuit is formed on the i layer substrate 1a as illustrated in FIGS. 9BA to 9BD.

This embodiment provides the following advantages.

1. The SiO$_2$ layers 38a and 38b that surround the side surfaces of the gate TiN layers 16A and 16B function as material layers for forming contact holes used to connect the NiSi layer 46a and the TiN layers 16A and 16B and also function as etching mask layers for forming the NiSi layer 46a that surrounds the peripheries of the Si pillars 4a and 4b with an equal width. This allows formation of the NiSi layer 46a that surrounds the peripheries of the Si pillars 4a and 4b with an equal width, and therefore a high-density circuit including SGTs can be produced without performing particular processes.

2. The NiSi layer 46a is constituted by first conductor layers that are directly in contact with the side surfaces of the TiN layers 16A and 16B and surround the entire peripheries of the TiN layers 16A and 16B in a tubular shape with an equal width in plan view and a second conductor layer that is partly connected to the first conductor layers and extends in a horizontal direction. Since the first conductor layers are formed in a self-aligned manner with the SiO$_2$ layers 38A and 38B that surround the peripheries of the Si pillars 4a and 4b with an equal width, the first conductor layers can be formed regardless of the planar shape of the NiSi layer 46a for forming the second conductor layer. Furthermore, in terms of design, the second conductor layer is not necessarily formed so as to surround the Si pillars 4a and 4b unlike in the fourth embodiment. This can increase the density of a circuit and improve the performance of the circuit compared with in the fourth embodiment.

Tenth Embodiment

FIG. 10AA to FIG. 10FD illustrate a method for producing a CMOS inverter circuit including an SGT according to a tenth embodiment of the present invention. Among FIG. 10AA to FIG. 10FD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

In the process illustrated in FIGS. 1AA to 1AD, an i layer substrate 1 is disposed on a P layer substrate 70. In the same manner as in FIGS. 1AA to 1AD, the i layer substrate 1 is etched by, for example, RIE using the resist layers 5a and 5b, the SiN layers 3a and 3b, and the $SiO_2$ layers 2a and 2b as etching masks to form an i layer substrate 1a and Si pillars 71a and 71b that lie on the i layer substrate 1a. The resist layers 5a and 5b are removed. Thus, a structure illustrated in FIGS. 10AA to 10AD is obtained. The Si pillar 71a is located below the $SiO_2$ layer 2a and the SiN layer 3a. The Si pillar 71b is located below the $SiO_2$ layer 2b and the SiN layer 3b.

Figure 10B:
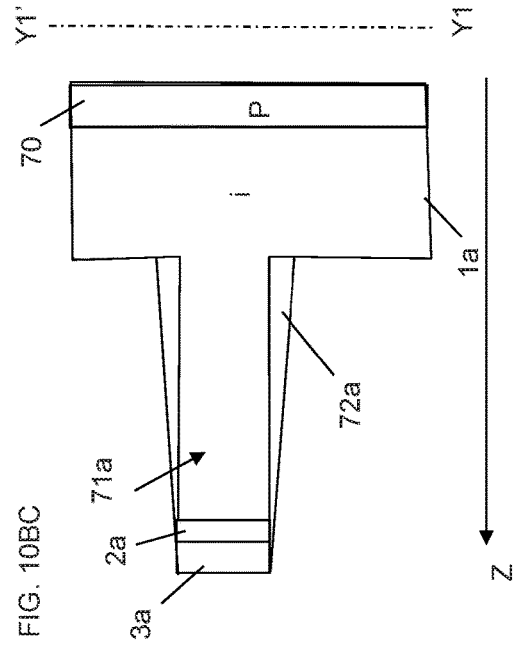
FIGS. 10BA to 10BD are a plan view and sectional views illustrating a CMOS inverter circuit for describing a method for producing a semiconductor device including an SGT according to a tenth embodiment.
Figure 10B:
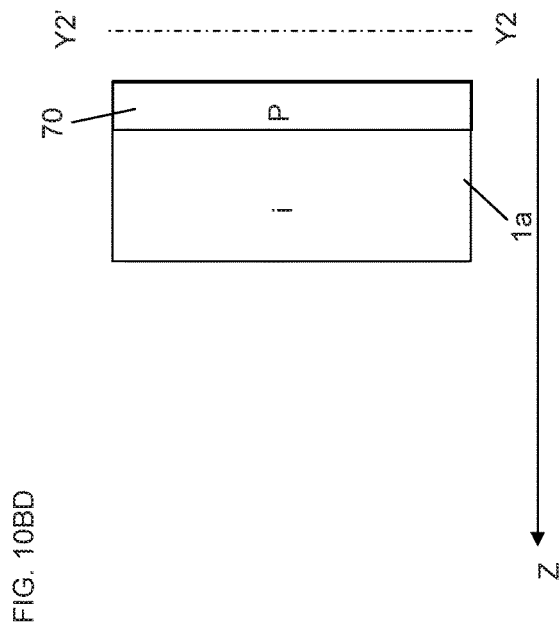
Figure 10B:
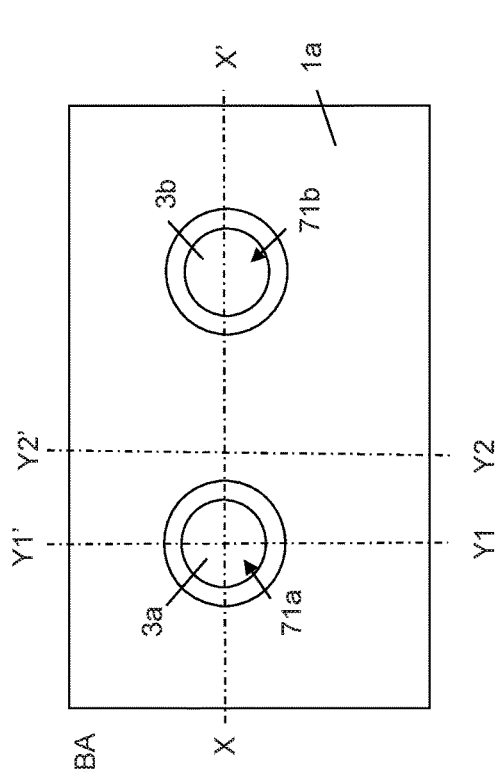
Figure 10B:
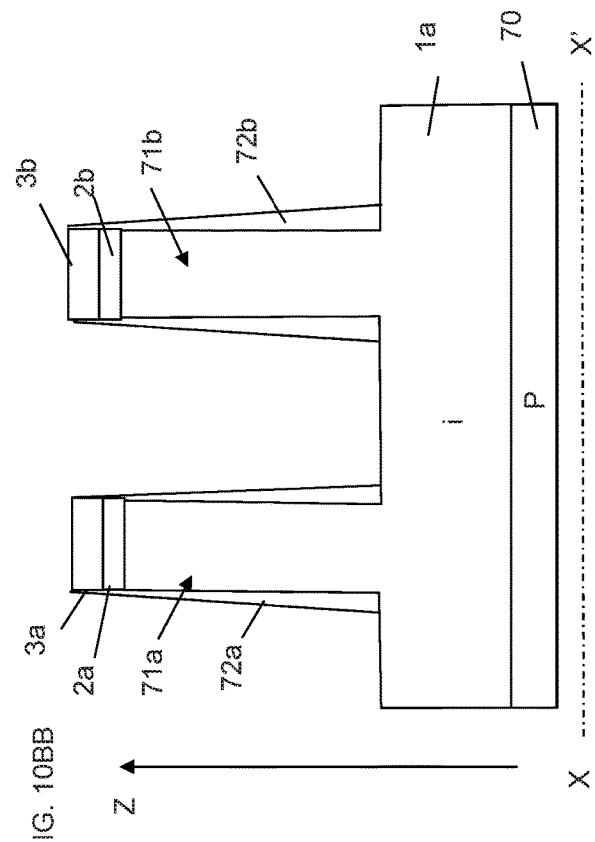

Next, as illustrated in FIGS. 10BA to 10BD, for example, $SiO_2$ layers 72a and 72b are formed so as to surround the side surfaces of the Si pillars 71a and 71b.

Next, as illustrated in FIGS. 10CA to 10CD, an N layer 73 is formed in a surface layer of the i layer substrate 1a on the peripheries of the Si pillars 71a and 71b by performing ion implantation of phosphorus (P) using the $SiO_2$ layers 2a, 2b, 72a, and 72b and the SiN layers 3a and 3b as masks. Subsequently, a $P^+$ region 74 is formed in a surface layer of the N layer 73 on the periphery of the Si pillar 71a by performing lithography and ion implantation of B. Similarly, an $N^+$ region 75 is formed in a surface layer of the N layer 73 on the periphery of the Si pillar 71b by performing lithography and ion implantation of As. The $P^+$ region 74 and the $N^+$ region 75 are desirably separated from each other in plan view in consideration of diffusion of donor or acceptor impurity atoms in a width direction during heat treatment performed later.

Figure 10D:
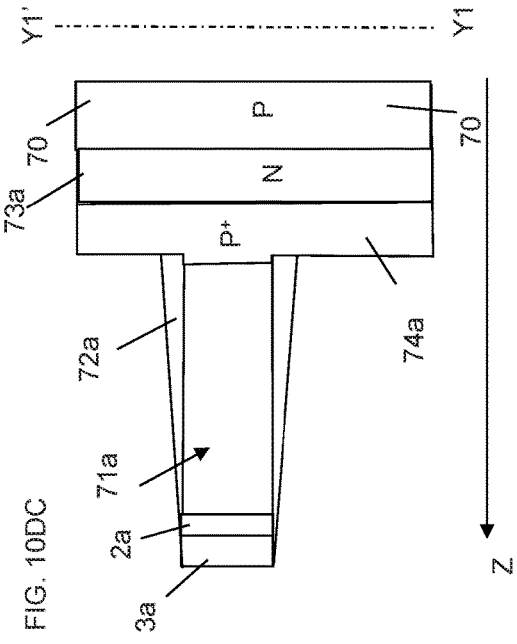
FIGS. 10DA to 10DD are a plan view and sectional views illustrating a CMOS inverter circuit for describing a method for producing a semiconductor device including an SGT according to a tenth embodiment.
Figure 10D:
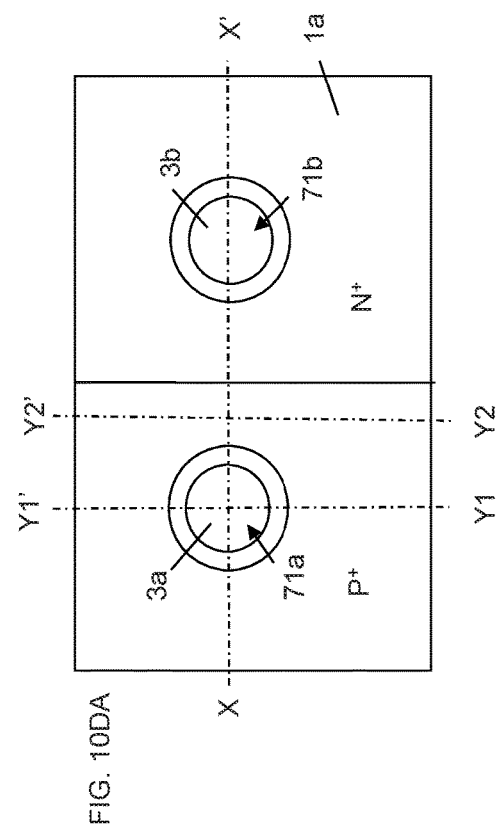
Figure 10D:
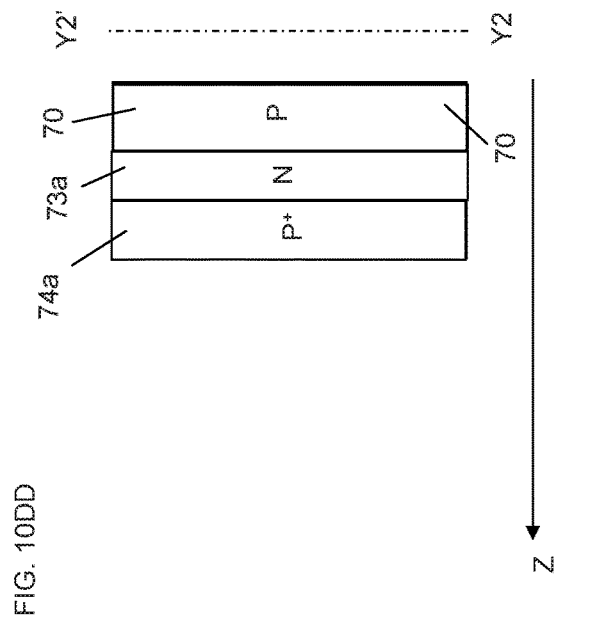
Figure 10D:
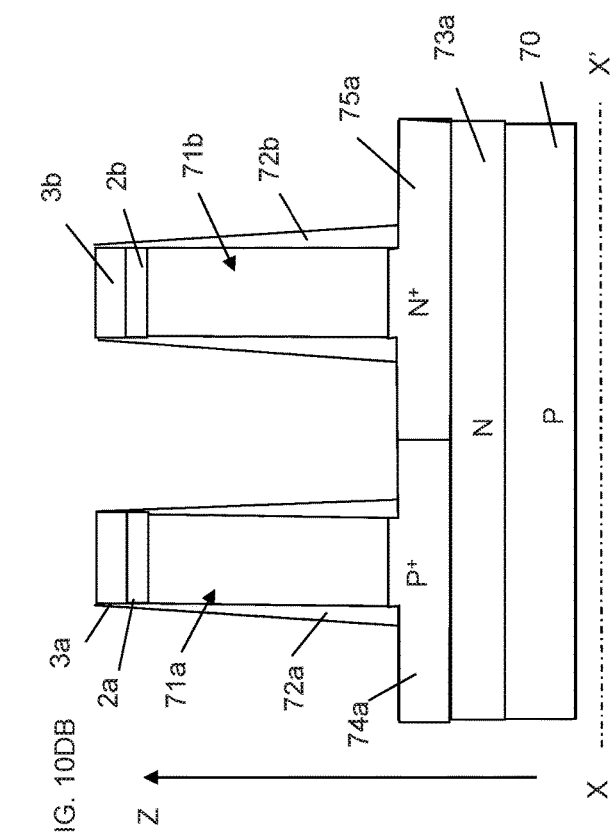

Next, as illustrated in FIGS. 10DA to 10DD, heat treatment is performed to cause diffusion, thereby expanding the $P^+$ region 74, the $N^+$ region 75, and the N layer 73 in a length direction and a width direction. Thus, a $P^+$ region 74a, an $P^+$ region 75a, and an N layer 73a are formed on the P layer substrate 70.

Next, as illustrated in FIGS. 10EA to 10ED, a resist layer 77 is formed between the Si pillars 71a and 71b so as to be in contact with the peripheries of the Si pillars 71a and 71b. Then, the $P^+$ region 74a, the $N^+$ region 75a, the N layer 73a, and a surface layer of the P layer substrate 70 is etched using the resist layer 77, the $SiO_2$ layers 2a, 2b, 72a, and 72b, and the SiN layers 3a and 3b as masks. Thus, a P layer 70b, an N layer 73aa, and a $P^+$ region 74aa located in a bottom portion of the Si pillar 71a and an $N^+$ region 75aa located in a bottom portion of the Si pillar 71b are formed on the P layer 70a from the bottom. Consequently, the Si pillars 71a and 71b are formed on a Si pillar base 76 that is constituted by the P layer 70b, the N layer 73aa, the $P^+$ region 74aa located in a bottom portion of the Si pillar 71a, and the IV' region 75aa located in a bottom portion of the Si pillar 71b. The resist layer 77 is removed.

Thus, as illustrated in FIGS. 10FA to 10FD, in the Si pillar base 76, the P+ region 74aa and the N+ region 75aa are formed so as to surround the entire peripheries of the bottom portions of the Si pillars 71a and 71b in a tubular shape with an equal width in plan view. The P+ region 74aa and the N+ region 75aa are constituted by regions below the Si pillars 71a and 71b, tubular regions with an equal width, and a region that is partly connected to the tubular regions with an equal width and extends between the Si pillars 71a and 71b. Subsequently, by performing the same processes as those illustrated in FIG. 1HA to FIG. 1JD, a CMOS inverter circuit including SGTs on the Si pillar base 76 can be produced. The P+ region 74aa and N+ region 75aa are single crystal semiconductor layers containing donor or accepter impurity regions and constitute the impurity regions and the wiring conductive layers.

In this embodiment, donor or acceptor impurity atoms are implanted into the $P^+$ region 74aa and the $N^+$ region 75aa in a high concentration to reduce the resistance of the $P^+$ region 74aa and the $N^+$ region 75aa. On the other hand, in the process illustrated in FIGS. 10DA to 10DD, a conductor layer such as a metal or alloy layer made of W, WSi, the like may be formed on the $P^+$ region 74a and the $N^+$ region 75a while the $SiO_2$ layers 72a and 72b are left. In the process illustrated in FIGS. 10EA to 10ED, a conductor layer such as a metal or alloy layer made of W, WSi, or the like may be formed on the exposed upper and side surfaces of the Si pillar base 76 while the $SiO_2$ layers 72a and 72b are left after removal of the resist layer 77. A conductor layer such as a metal or alloy layer made of W, WSi, or the like may also be formed in the whole region between the $SiO_2$ layers 72a and 72b in plan view. This can generate a uniform electric field because of the PN junction of the $P^+$ region 74a and the $N^+$ region 75a in the bottom portions of the Si pillars 4a and 4b.

This embodiment provides the following advantage.

The $SiO_2$ layers 72a and 72b that surround the side surfaces of the Si pillars 71a and 71b are used as mask material layers for forming first conductive regions that surround the peripheries of the bottom portions of the Si pillars 71a and 71b in a tubular shape with an equal width as in the first embodiment. Furthermore, as illustrated in FIGS. 10CA to 10CD, the $SiO_2$ layers 72a and 72b function as mask material layers for forming the N layer 73, the $P^+$ region 74, and the $N^+$ region 75 in the ion implantation of donor or acceptor impurities. This can increase the density of a circuit and improve the performance of the circuit as in the first embodiment.

Eleventh Embodiment

Figure 11A:
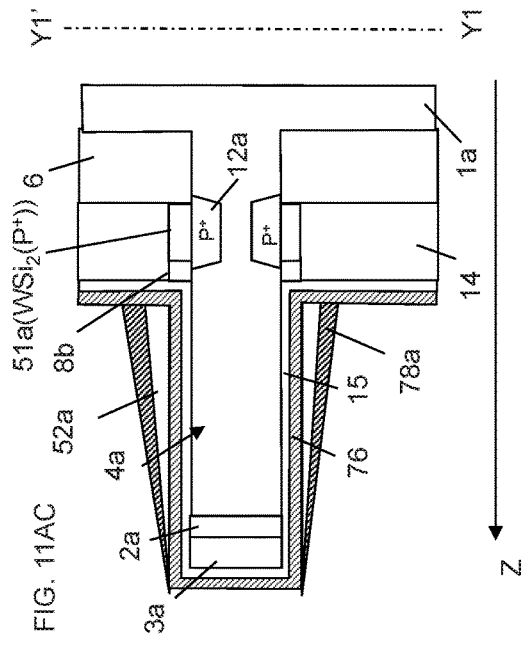
FIGS. 11AA to 11AD are a plan view and sectional views illustrating a CMOS inverter circuit for describing a method for producing a semiconductor device including an SGT according to an eleventh embodiment.
Figure 11A:
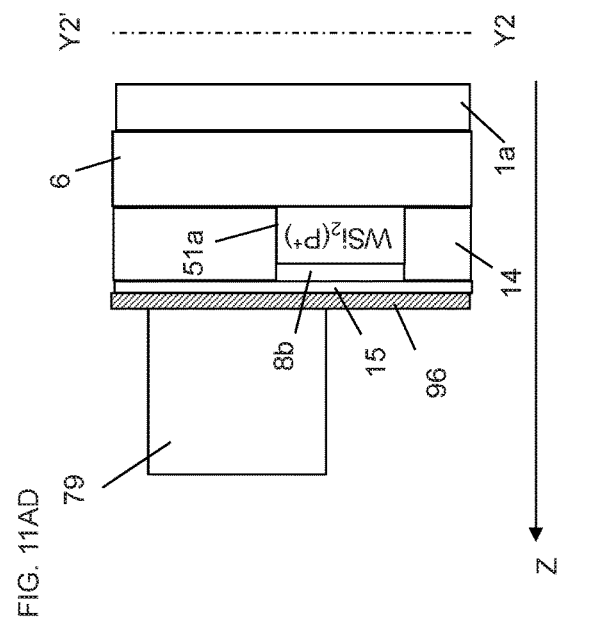
Figure 11A:
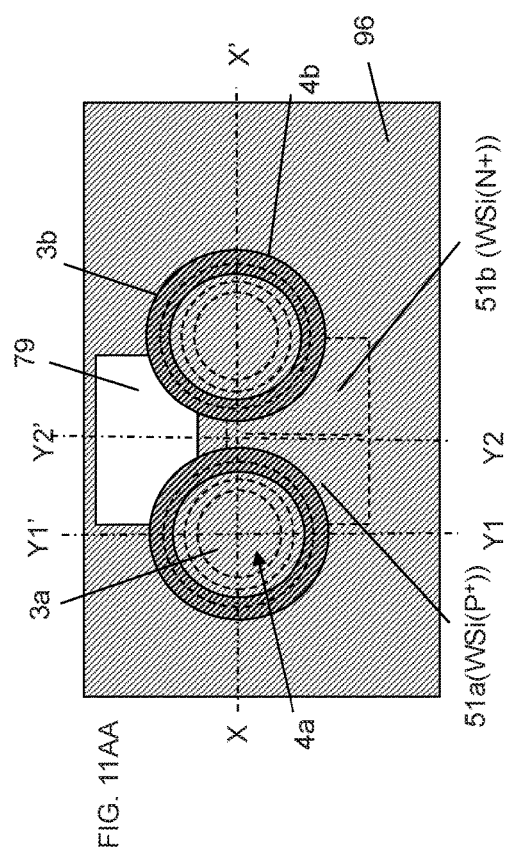
Figure 11A:
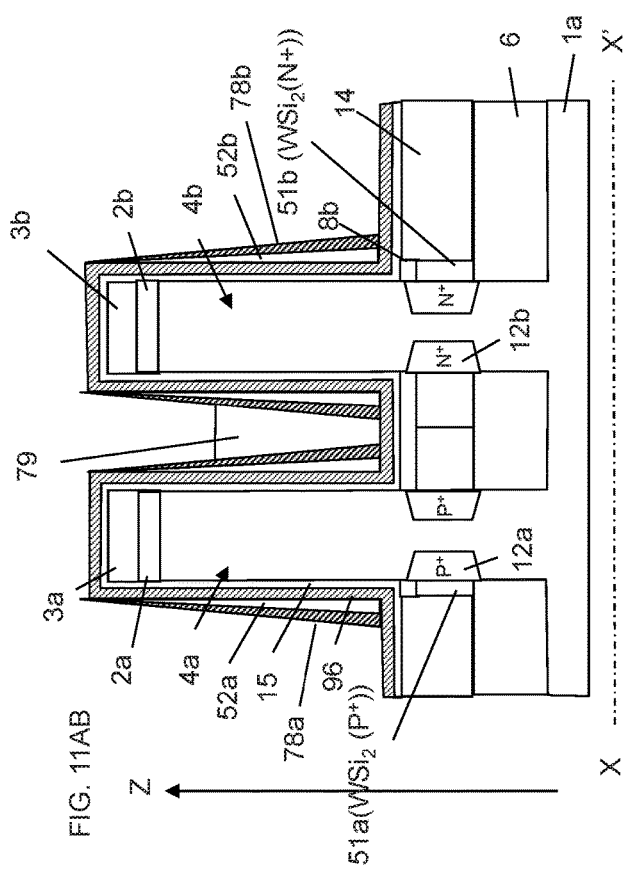

FIG. 11AA to FIG. 11CD illustrate a method for producing a CMOS inverter circuit including an SGT according to an eleventh embodiment of the present invention. Among FIG. 11AA to FIG. 11CD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

In FIGS. 1HA to 1HD, instead of the TiN layer 16, a SiN/TiN layer 96 obtained by covering a TiN layer (not illustrated) with a thin SiN layer (not illustrated) is formed so as to surround the $HfO_2$ layer 15. As illustrated in FIGS.

11AA to 11AD, SiO₂ layers 52a and 52b and SiN layers 78a and 78b are formed around the Si pillars 4a and 4b so as to surround the side surface of the SiN/TiN layer 96. A resist layer 79 is formed so as to be partly in contact with the SiN layers 78a and 78b and extend between the Si pillars 4a and 4b in plan view.

Figure 11B:
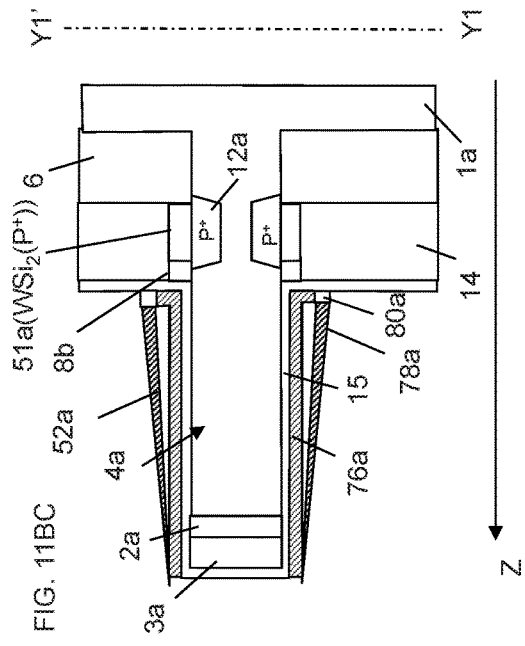
FIGS. 11BA to 11BD are a plan view and sectional views illustrating a CMOS inverter circuit for describing a method for producing a semiconductor device including an SGT according to an eleventh embodiment.
Figure 11B:
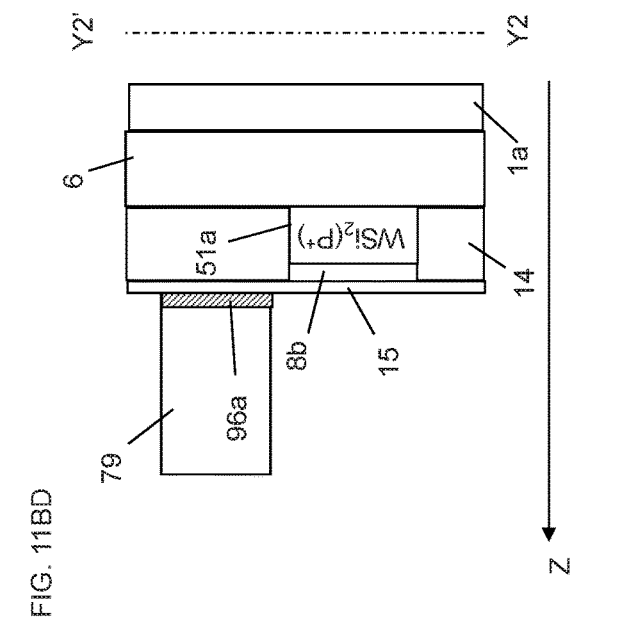
Figure 11B:
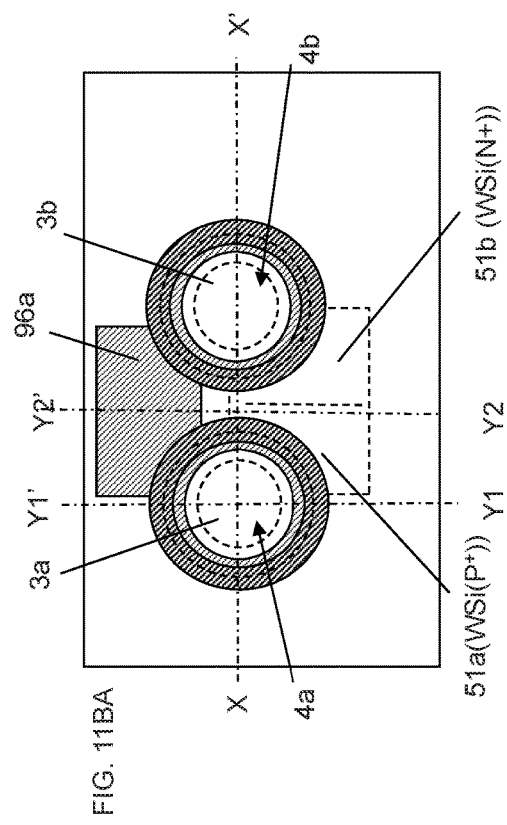
Figure 11B:
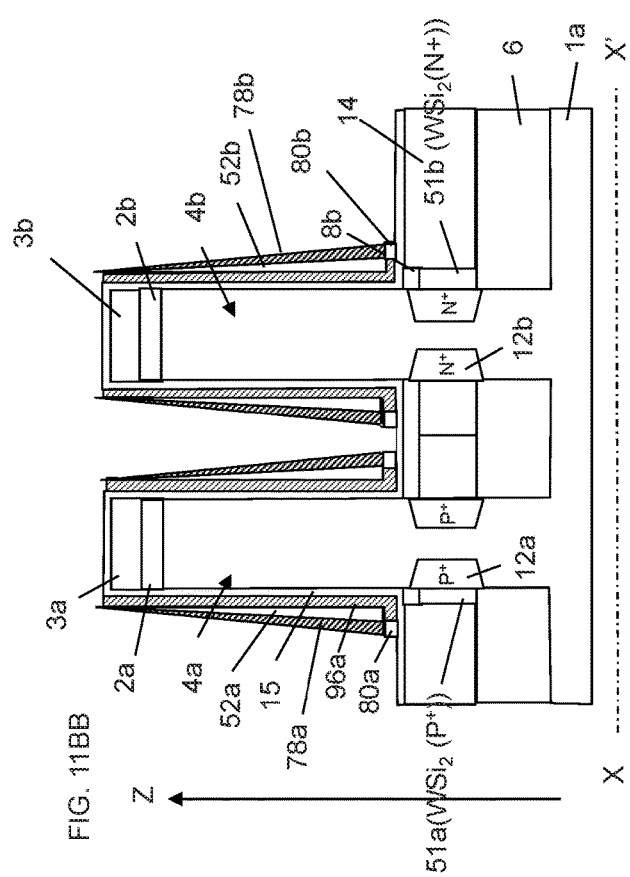

Next, as illustrated in FIGS. 11BA to 11BD, the SiN/TiN layer 96 is etched using the resist layer 79 and the SiN layers 78a and 78b as masks. Thus, a SiN/TiN layer 96a is formed that is constituted by regions on the side surfaces of the Si pillars 4a and 4b, regions that surround the peripheries of the Si pillars 4a and 4b in a tubular shape with an equal width, and a region that is partly in contact with the tubular regions and extends between the Si pillars 4a and 4b. The resist layer 79 is removed. The TiN layers at the end surfaces of the exposed SiN/TiN layer 96a are oxidized to form TiNO layers 80a and 80b.

Next, the same processes as those illustrated in FIGS. 1IA to 1ID and FIGS. 1JA to 1JD are performed. In this embodiment, as illustrated in FIGS. 11CA to 11CD, a contact hole 83 through which an input wiring metal layer Vin is connected is formed on the SiN/TiN layer 96a between the Si pillars 4a and 4b so as to extend through the SiO₂ layers 21 and 18. A contact hole 84 through which an output wiring metal layer Vout is connected is formed on the WSi₂ layers 51a and 51b between the Si pillars 4a and 4b so as to extend through the SiO₂ layers 21 and 18, the HfO₂ layer 15, and the SiO₂ layer 8a. Even when the contact hole 84 overlaps the SiN layers 78a and 78b that surround the Si pillars 4a and 4b in plan view, the SiN layers 78a and 78b serve as etching stop layers, which prevents a short-circuit between the output wiring metal layer Vout and the SiN/TiN layer 96a. Thus, a CMOS inverter circuit including an SGT can be produced.

This embodiment provides the following advantages.

1. The SiN layers 78a and 78b that surround the side surfaces of the SiN/TiN layer 96 in a tubular shape with an equal width in plan view have both functions as etching masks for forming the SiN/TiN layer 96a and etching stop layers for preventing a short-circuit between the output wiring metal layer Vout and the SiN/TiN layer 96a through the contact hole 84. Thus, the distance between the contact hole 84 and the Si pillars 4a and 4b can be decreased in terms of design. This enables an increase in the density of a circuit including an SGT.

2. Similarly, in the formation of the contact hole 83 through which the input wiring metal layer Vin and the SiN/TiN layer 96a are connected, the side surface of the SiN/TiN layer 96a that surrounds the Si pillars 4a and 4b can be prevented from being etched when the contact hole 83 comes close to the Si pillars 4a and 4b in plan view because of mask misalignment in lithography. This enables an increase in the density of a circuit including an SGT.

Twelfth Embodiment

FIG. 12AA to FIG. 12DD illustrate a method for producing a CMOS inverter circuit including an SGT according to a twelfth embodiment of the present invention. Among FIG. 12AA to FIG. 12DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 12AA to 12AD, for example, SiN layers 86a and 86b are formed instead of the SiO₂ layers 11a and 11b that surround the side surfaces of the Si pillars 4a and 4b with an equal width in FIGS. 1FA to 1FD.

Figure 12B:
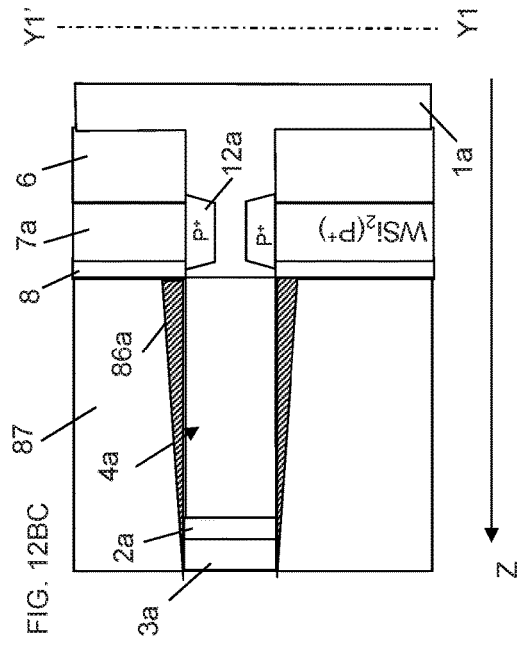
FIGS. 12BA to 12BD are a plan view and sectional views illustrating a CMOS inverter circuit for describing a method for producing a semiconductor device including an SGT according to a twelfth embodiment.
Figure 12B:
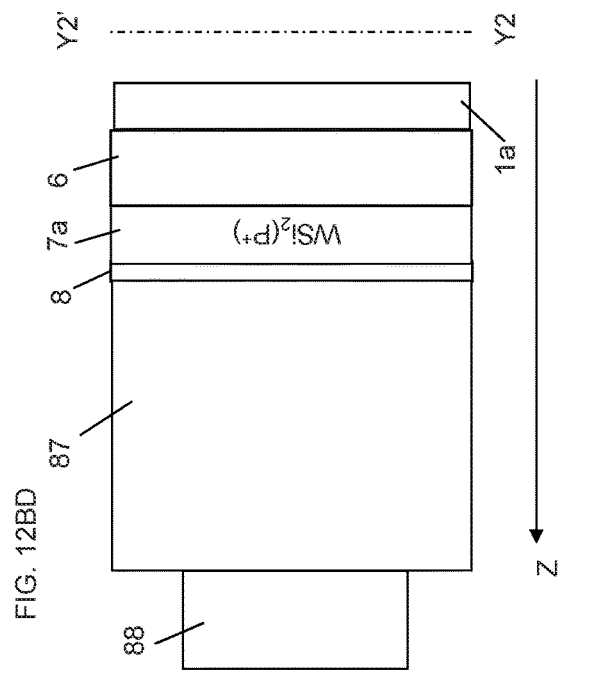
Figure 12B:
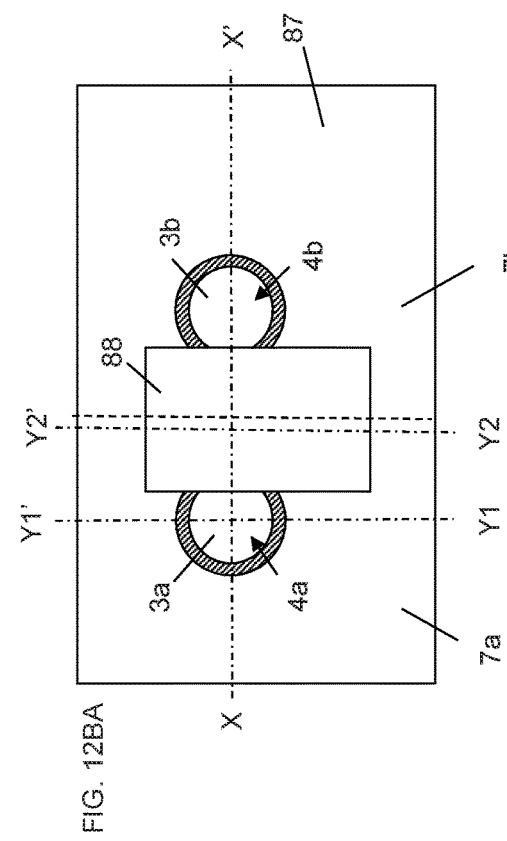
Figure 12B:
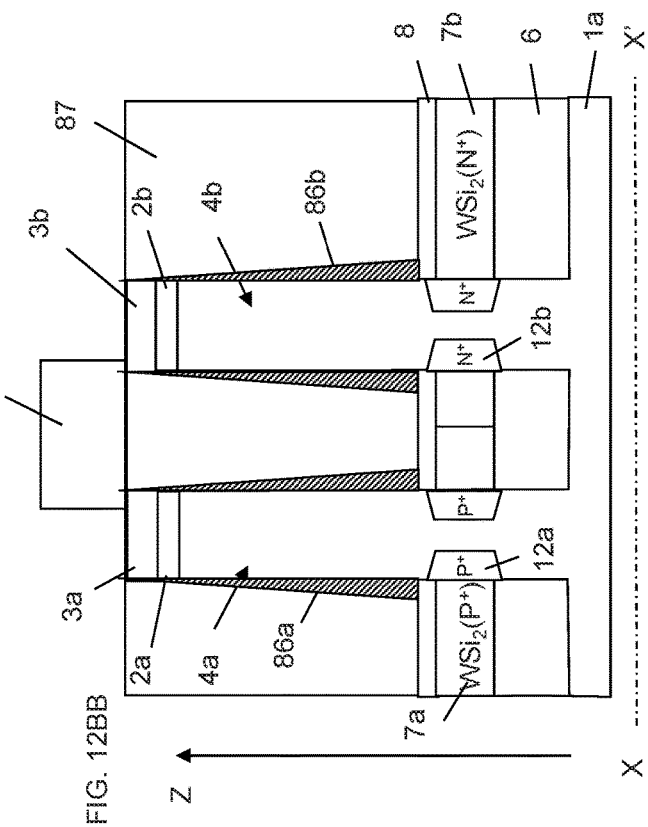

Next, as illustrated in FIGS. 12BA to 12BD, a SiO₂ layer (not illustrated) is entirely deposited by CVD and then polished by CMP so as to have an upper surface that is flush with the upper surfaces of the SiN layers 3a and 3b. Thus, a SiO₂ layer 87 is formed. A resist layer 88 is formed by lithography so as to partly cover the Si pillars 4a and 4b in plan view and extend between the Si pillars 4a and 4b.

Next, as illustrated in FIGS. 12CA to 12CD, the SiO₂ layer (SiO₂ layer 8 in FIGS. 1EA to 1ED) is etched using the resist layer 88 and the SiN layers 86a and 86b as masks. Thus, WSi layers 7aa and 7bb and a SiO₂ layer 8a are formed. The WSi layers 7aa and 7bb are constituted by regions that surround the peripheries of the Si pillars 4a and 4b in a tubular shape with an equal width so as to be in contact with the side surfaces of the Si pillars 4a and 4b and a region that is partly in contact with the tubular regions and extends between the Si pillars 4a and 4b. The resist layer 88 and the SiO₂ layer 83a are removed.

Next, the SiN layers 86a and 86b illustrated in FIGS. 12DA to 12DD are removed. Then, by performing the same processes as those illustrated in FIG. 1HA to FIG. 1JD, a CMOS inverter circuit including an SGT can be formed on the i layer substrate 1a.

This embodiment provides the following advantage.

In the first embodiment, the resist layer 13 having a thickness from the upper surface of the SiO₂ layer 8 to the tops of the Si pillars 4a and 4b needs to be patterned by lithography. It is difficult to pattern the thick resist layer 13 with high precision in the production of a high-density circuit. In contrast, in this embodiment, the SiO₂ layer 87 having an upper surface that is flush with the upper surfaces of the SiN layers 3a and 3b located in upper portions of the Si pillars 4a and 4b is formed, and the resist layer 88 is formed on a flat surface by lithography. Therefore, a high-density circuit is more easily produced in this embodiment than in the first embodiment.

Modification of Twelfth Embodiment

It has been described in the twelfth embodiment that a SiO₂ layer (not illustrated) is entirely deposited by CVD and then polished by CMP so as to have an upper surface that is flush with the upper surfaces of the SiN layers 3a and 3b, thereby forming a SiO₂ layer 87. This is performed in order to form the resist layer 88 on a flat surface by lithography. In the case where, for example, a SiO₂ layer or a C layer is formed by spin coating in which a flat upper surface is formed instead of the SiO₂ layer 87 formed by CVD, the upper surface of the SiO₂ layer or C layer is not necessarily flush with the upper surfaces of the SiN layers 3a and 3b located in upper portions of the Si pillars 4a and 4b and may be positioned higher than the tops of the Si pillars 4a and 4b. That is, this embodiment shows that a high-density circuit is easily produced by forming a resist layer on a flat material layer.

Thirteenth Embodiment

Figure 13A:
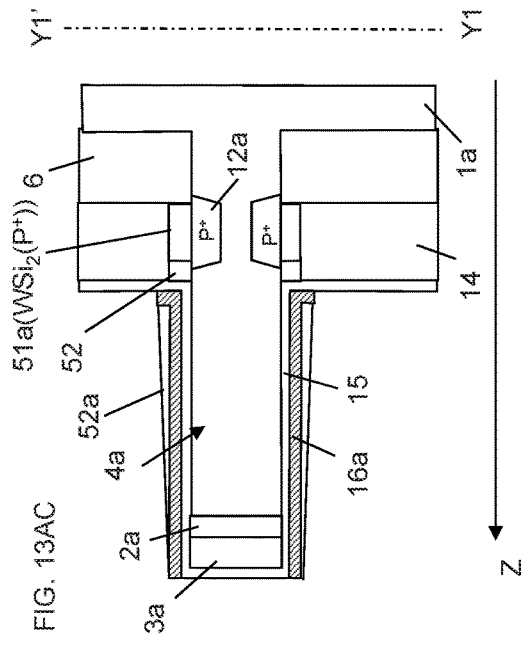
FIGS. 13AA to 13AD are a plan view and sectional views illustrating a CMOS inverter circuit for describing a method for producing a semiconductor device including an SGT according to a thirteenth embodiment.
Figure 13A:
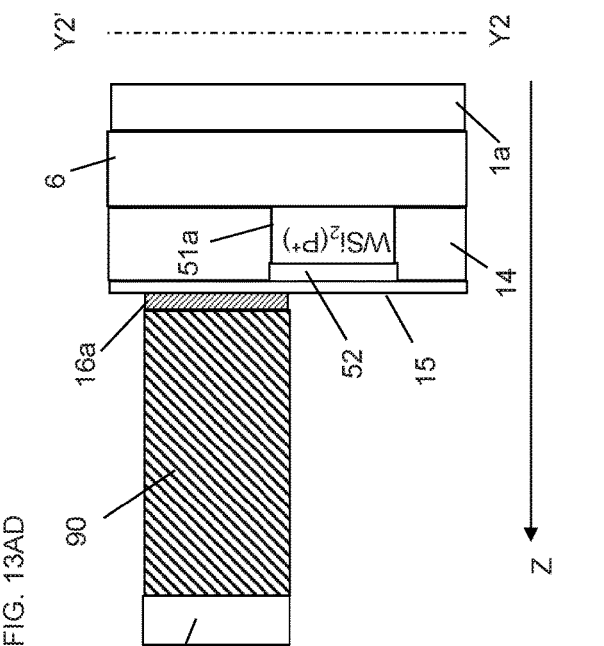
Figure 13A:
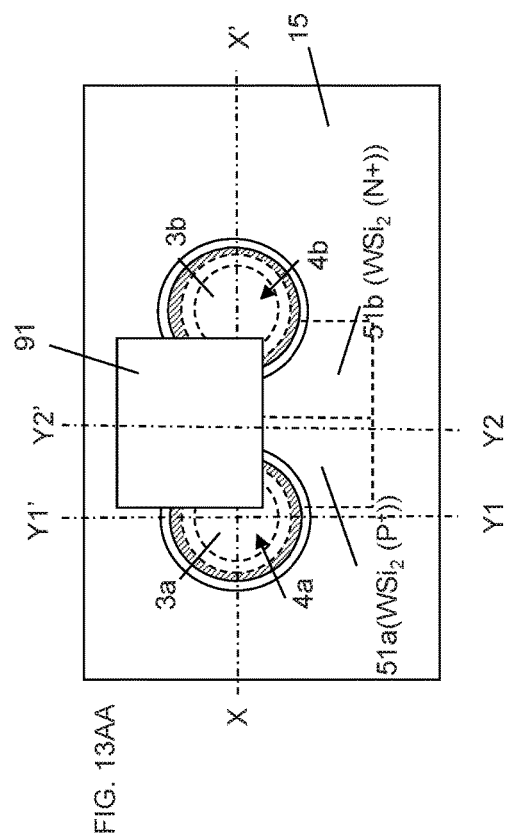
Figure 13A:
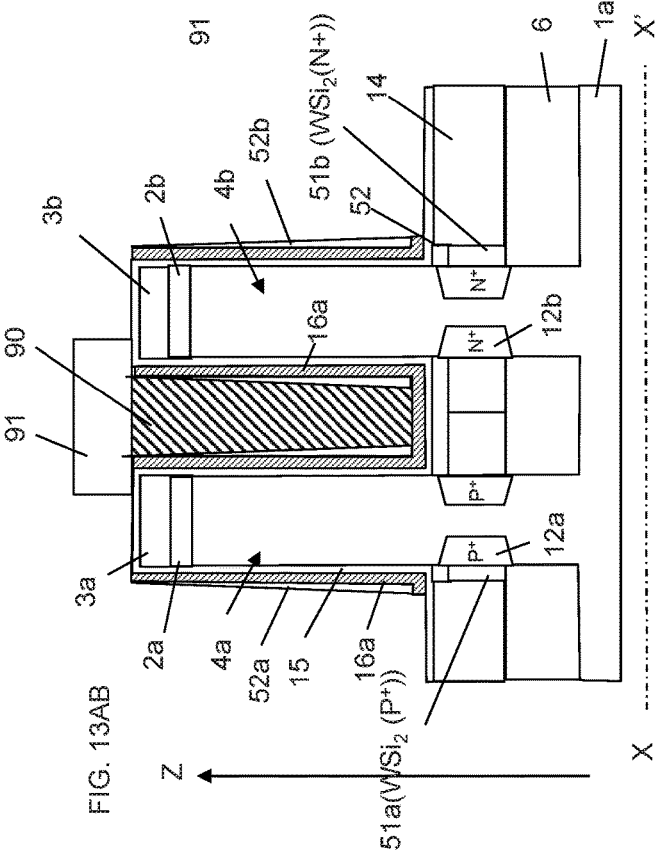

FIG. 13AA to FIG. 13BD illustrate a method for producing a CMOS inverter circuit including an SGT according to a thirteenth embodiment of the present invention. Among FIG. 13AA to FIG. 13BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

After the processes illustrated in FIG. 5AA to FIG. 5CD are performed, a W layer (not illustrated) is entirely deposited. A W layer (not illustrated) is formed by CMP so as to have a flat upper surface that is flush with the HfO$_2$ layer 15 positioned higher than the tops of the Si pillars 4a and 4b. As illustrated in FIGS. 13AA to 13AD, a resist layer 91 is formed on the HfO$_2$ layer 15 and the W layer (not illustrated) by lithography so as to partly overlap the Si pillars 4a and 4b in plan view. The W layer (not illustrated) and the TiN layer (TiN layer 16 in FIGS. 5BA to 5BD) are etched using, as masks, the resist layer 91, the SiO$_2$ layers 52a and 52b that surround the peripheries of the Si pillars 4a and 4b in a tubular shape with an equal width, the HfO$_2$ layer 15 on the Si pillars 4a and 4b, the SiN layers 3a and 3b, and the SiO$_2$ layers 2a and 2b. Thus, a W layer 90 and a TiN layer 16A are formed. The resist layer 91 is removed.

The same processes as those illustrated in FIGS. 5DA to 5DD are performed, except that instead of the contact hole 22e, a contact hole 22E is formed on the W layer 90 on the TiN layer 16A as illustrated in FIGS. 13BA to 13BD. Thus, an input wiring metal layer VIN is electrically connected to the TiN layer 16A serving as a gate conductor layer through the contact hole 22E and the W layer 90 serving as a conductor. Consequently, a CMOS inverter circuit including SGTs can be formed on the i layer substrate 1a. Instead of the W layer 90, a material layer that is constituted by a single layer or plural layers and is made of another metal or alloy or a low-resistance semiconductor containing a donor or acceptor impurity in a high concentration may be used.

This embodiment provides the following advantages.

1. In this embodiment, a W layer serving as a conductor is used instead of the SiO$_2$ layer 87 serving as an insulating layer in the twelfth embodiment. As in the twelfth embodiment, the resist layer 88 is formed on the HfO$_2$ layer 15 whose upper surface is flat and the W layer by lithography. Thus, as in the twelfth embodiment, a high-density circuit is also easily produced in this embodiment.

2. In the fifth embodiment, the contact hole 22e is formed on the TiN layer 16a as illustrated in FIGS. 5DA to 5DD. On the other hand, in this embodiment, the contact hole 22E is formed on the W layer 90 on the TiN layer 16A. Thus, the contact hole 22E can be formed so as to be shallower than the contact hole 22e. Consequently, an SGT circuit is easily produced.

Fourteenth Embodiment

Figure 14C:
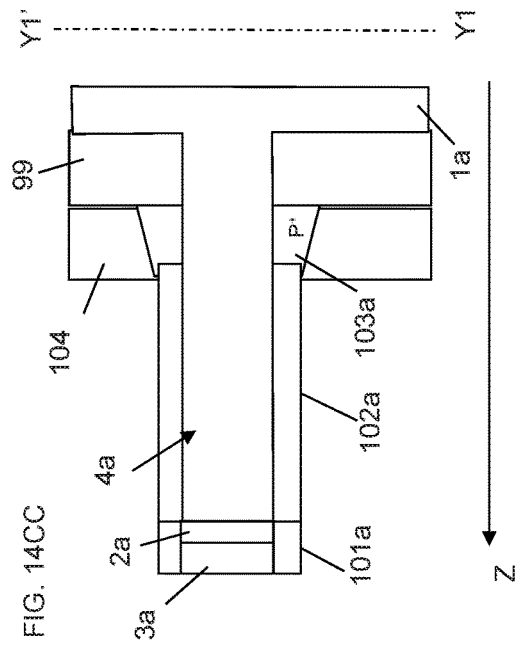
FIGS. 14CA to 14CD are a plan view and sectional views illustrating a CMOS inverter circuit for describing a method for producing a semiconductor device including an SGT according to a fourteenth embodiment.
Figure 14C:
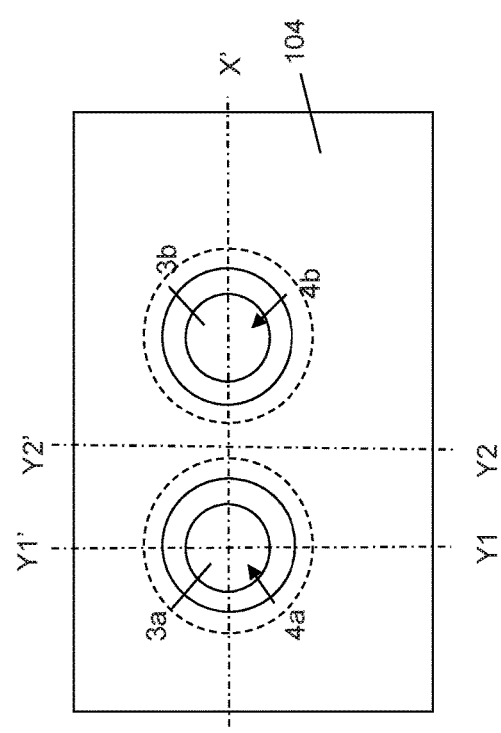
Figure 14C:
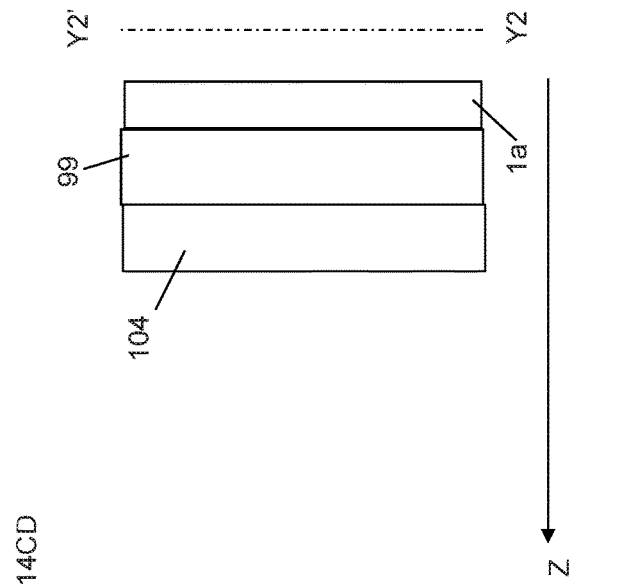
Figure 14C:
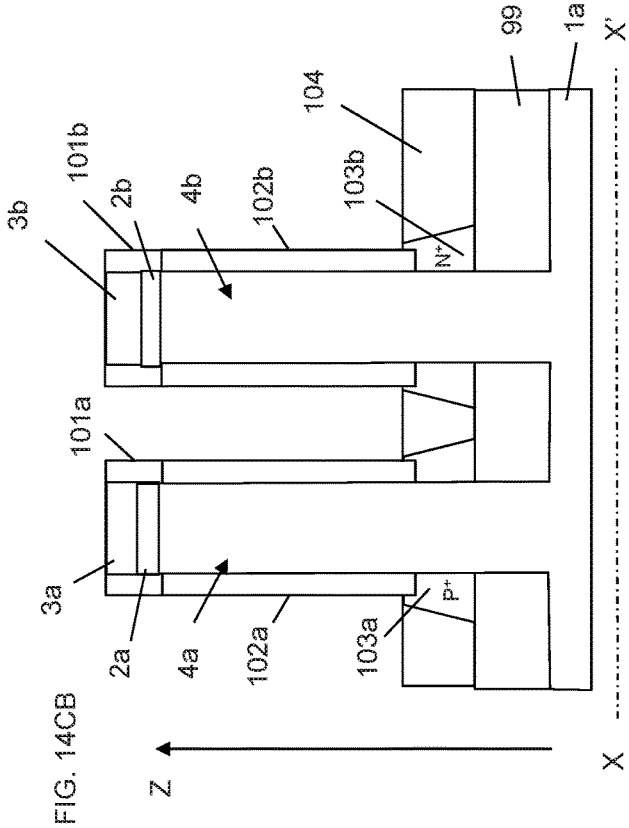
Figure 14D:
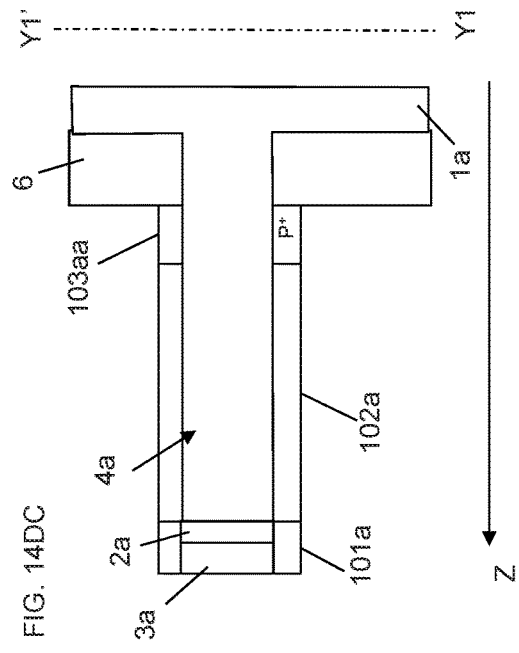
FIGS. 14DA to 14DD are a plan view and sectional views illustrating a CMOS inverter circuit for describing a method for producing a semiconductor device including an SGT according to a fourteenth embodiment.
Figure 14D:
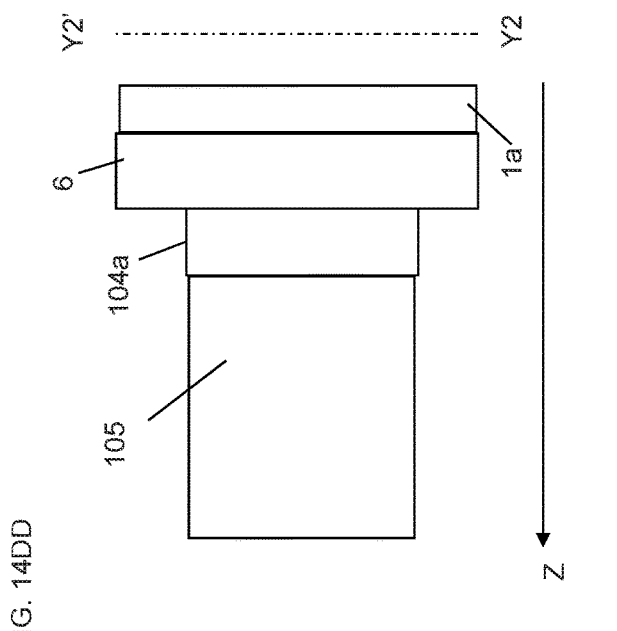
Figure 14D:
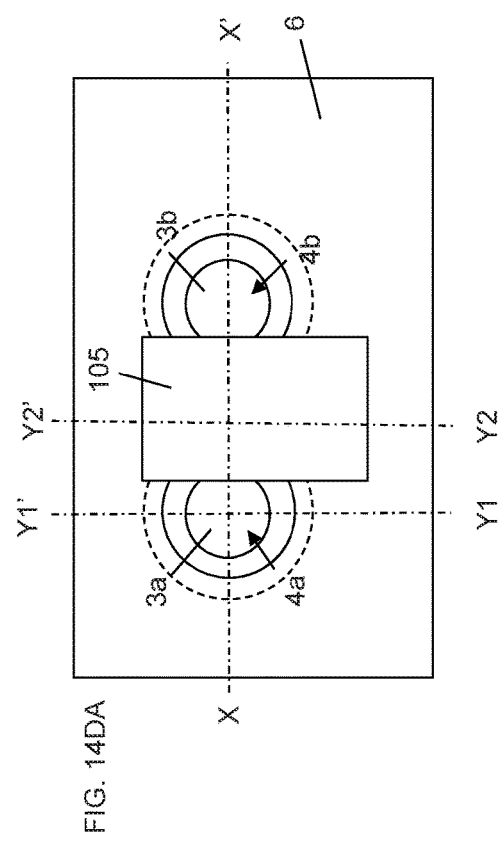
Figure 14D:
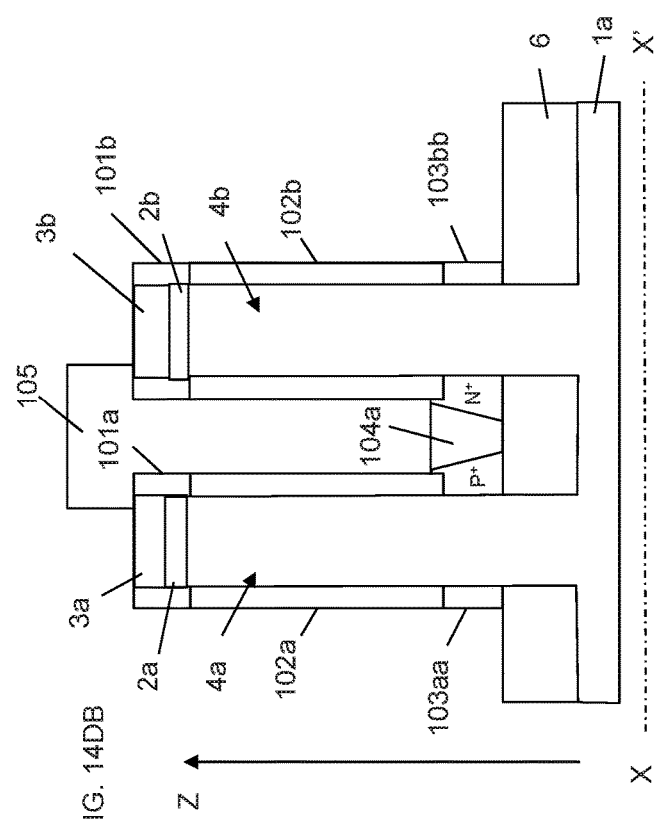

FIG. 14AA to FIG. 14DD illustrate a method for producing a CMOS inverter circuit including SGTs according to a fourteenth embodiment of the present invention. Among FIG. 14AA to FIG. 14DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 14AA to 14AD, AlO layers 3aa and 3bb are formed instead of the SiN layers 3a and 3b in FIGS. 1CA to 1CD, and a SiN layer 99 is formed instead of the SiO$_2$ layer 6 in FIGS. 1CA to 1CD. A SiO$_2$ layer 100 is formed on the SiN layer 99 and on the peripheries of the bottom portions of the Si pillars 4a and 4b by a flowable chemical vapor deposition (FCVD) method. A SiN layer (not illustrated) is entirely deposited. Polishing is performed such that the upper surface of the SiN layer is flush with the upper surfaces of the AlO layers 3aa and 3bb. Etching is performed by RIE until the upper surface of the smoothened SiN layer reaches the tops of the Si pillars 4a and 4b. An AlO layer (not illustrated) is entirely deposited. The AlO layer is etched by RIE such that AlO layers 101a and 101b are left on the side surfaces of the SiO$_2$ layers 2a and 2b and the AlO layers 3aa and 3bb. The SiN layer on the peripheries of the Si pillars 4a and 4b is etched by RIE using the AlO layers 3aa, 3bb, 101a, and 101b as masks to form SiN layers 102a and 102b that surround the side surfaces of the Si pillars 4a and 4b.

Next, as illustrated in FIGS. 14BA to 14BD, the SiO$_2$ layer 100 is etched by RIE using the AlO layers 3aa, 3bb, 101a, and 101b as masks to form SiO$_2$ layers 100a and 100b below the SiN layers 102a and 102b and on the side surfaces of the Si pillars 4a and 4b.

Subsequently, for example, after the Si pillar 4b is covered with a resist layer by lithography, the SiO$_2$ layer 100a is removed by etching. Then, the resist layer is removed. As illustrated in FIGS. 14CA to 14CD, a P$^+$ region 103a containing acceptor impurities is formed on the exposed side surface of the bottom portion of the Si pillar 4a by a selective epitaxial crystal growth method, which is one of epitaxial crystal growth methods. A thin SiO$_2$ layer (not illustrated) is entirely deposited by ALD. After the Si pillar 4b is covered with a resist layer, the thin SiO$_2$ layer that covers the entirety in advance and the SiO$_2$ layer 100b are removed by etching. Then, the resist layer is removed. An N$^+$ layer 103b containing donor impurities is formed on the side surface of the bottom portion of the Si pillar 4b by a selective epitaxial crystal growth method. A W layer 104 connected to the P$^+$ region 103a and the N$^+$ region 103b is formed.

Next, as illustrated in FIGS. 14DA to 14DD, a mask material layer 105 that is formed of a resist layer and partly overlaps the Si pillars 4a and 4b or the AlO layers 101a and 101b in plan view is formed. The W layer 104, the P+ region 103a, and the N$^+$ region 103b are etched using the mask material layer 105, the AlO layers 3a, 3b, 101a, and 101b, and the SiN layers 102a and 102b as masks to form a W layer 104a, a P+ region 103aa, and an N$^+$ region 103bb that are present on the inner sides of the mask material layer 105 and the AlO layers 101a and 101b in plan view. Thus, a W layer 104a connected to the P+ region 103aa and the N$^+$ region 103bb is formed below the mask material layer and the P+ region 103aa and the N$^+$ region 103bb that surround the Si pillars 4a and 4b with an equal width in plan view. By performing the processes illustrated in FIG. 1GA to FIG. 1JD, a CMOS inverter circuit including SGTs is formed. The P+ region 103aa and N$^+$ region 103bb are single crystal semiconductor layers containing donor or accepter impurity regions and constitute the impurity regions and the wiring conductive layers. After forming the P+ region 103a and the N$^+$ region 103b, acceptor and donor impurity atoms diffuse into the Si pillars 4a and 4b by thermal processes. And the N$^+$ region 103aa and the P+ region 103bb are formed in the side surface or the inside of the Si pillars 4a and 4b.

This embodiment provides the following advantages.

1. Since the P$^+$ region 103aa and the N$^+$ region 103bb are formed by a selective epitaxial crystal growth method, the P$^+$ region 103aa and the N$^+$ region 103bb are single-crystal layers. Therefore, the P$^+$ region 103aa and the N$^+$ region 103bb serve as a source and a drain of SGTs. For example, when the diameters of the Si pillars 4a and 4b decrease as the size of the circuit decreases, the increase in the electrical resistance of the P+ region 12a and the N+ region 12b formed inside the Si pillars 4a and 4b in FIGS. 1JA to 1JD can be prevented. In the heating process after the process in FIGS. 14DA to 14DD, a P+ layer and an N+ layer are formed on the side surfaces of or inside the Si pillars 4a and 4b that are in contact with the P+ region 103aa and the N+ region 103bb through thermal diffusion of acceptor or donor impurities, which does not impair a decrease in the resistance of the source and the drain. The same applies to the case where a P+ region and an N+ region are formed on the side surfaces of or inside the Si pillars 4a and 4b before formation of the P+ region 103a and the N+ region 103b. The same also applies to a P+ region and an N+ region formed on the tops of the Si pillars 4a and 4b.

2. In the description of this embodiment, the P+ region 103aa and the N+ region 103bb are formed by a selective epitaxial crystal growth method. Alternatively, the P+ region 103aa and the N+ region 103bb may be formed by, for example, alternately performing epitaxial crystal growth of Si and chemical dry etching (CDE) in a repeated manner. In the epitaxial crystal growth, a Si layer is deposited not only on the exposed portions of the Si pillars 4a and 4b, but also on the SiN layers 99, 102a, and 101b and the AlO layers 3a, 3b, 101a, and 101b serving as insulating layers. The Si layer deposited on the SiN layers 99, 102a, and 101b and the AlO layers 3a, 3b, 101a, and 101b is not a single-crystal layer, but an amorphous layer. The amorphous layer has a higher etching rate than the single-crystal layer. By intermittently performing CDE during epitaxial growth, a P+ region 103a and an N+ region 103b each formed of a single-crystal layer can be formed so as to be connected to the exposed side surfaces of the Si pillars 4a and 4b. Thus, a P+ region 103a and an N+ region 103b each formed of a single-crystal layer can be formed by an epitaxial crystal growth method different from the epitaxial crystal growth method described in FIGS. 14CA to 14CD.

3. In the first embodiment, as illustrated in FIGS. 1EA to 1ED, a SiO$_2$ film (not illustrated) is entirely deposited by CVD, and then the SiO$_2$ film is etched by RIE so as to remain on the side surfaces of the Si pillars 4a and 4b. Thus, the SiO$_2$ layers 11a and 11b are formed on the side surfaces of the Si pillars 4a and 4b. In this case, the thickness of the SiO$_2$ layers 11a and 11b decreases in the upper part and increases in the lower part. Since the SiO$_2$ layers 11a and 11b are etched in plan view during the RIE of the SiO$_2$ layer 8 and the WSi$_2$ layers 7a and 7b at a low etching rate, the decrease in the width of the bottom portions of the SiO$_2$ layers 11a and 11b in plan view cannot be avoided. This causes a variation in the width of the WSi$_2$ layers 7aa and 7bb in plan view. As a result, the mask alignment tolerance in the mask design needs to be increased, which makes it difficult to increase the density of the circuit. On the other hand, in this embodiment, the AlO layers 101a and 101b having an equal width in plan view are first formed on the peripheries of the AlO layers 3aa and 3bb and the SiO$_2$ layers 2a and 2b. The SiN layer (not illustrated) formed on the outer sides of the Si pillars 4a and 4b is etched by RIE using the AlO layers 101a and 101b as masks to form the SiN layers 102a and 102b having an equal width in plan view on the side surfaces of the Si pillars 4a and 4b. The heights of the AlO layers 101a and 101b are sufficiently smaller than those of the Si pillars 4a and 4b, and thus AlO layers 101a and 101b having a small variation in width in plan view are formed. Since the SiN layer is etched using the AlO layers 101a and 101b as masks, SiN layers 102a and 102b having a small variation in width in plan view are formed. This increases the density of the circuit.

4. In this embodiment, the P+ region 103a and the N+ region 103b are formed so as to be present outward with respect to the peripheral lines of the SiN layers 102a and 102b in plan view. In this case, the P+ region 103a and the N+ region 103b that are not in contact with the low-resistance W layer 104a in plan view are formed on the peripheries of the Si pillars 4a and 4b. This increases the PN junction resistance. Alternatively, the P+ region 103a and the N+ region 103b may be formed so as to be present inward with respect to the peripheral lines of the SiN layers 102a and 102b in plan view, and then a W layer may be formed on the side surfaces of the P+ region 103a and the N+ region 103b by a selective growth method. Thus, the P+ region 103aa and the N+ region 103bb are formed such that the entire peripheries of the P+ region 103aa and the N+ region 103bb are in contact with the W layer 104a in plan view. This decreases the PN junction resistance of the P+ region 103aa and the N+ region 103bb.

In each of the above embodiments, a Si pillar made of silicon is used. However, the technical idea of the present invention is applicable to SGTs partly or wholly formed of a semiconductor material other than silicon.

In the first embodiment, the TiN layer 16a is used as a gate conductive layer. However, the gate conductive layer may be a different metal layer or a conductor material layer. The gate conductor layer may be a multilayer conductor layer. The same applies to other embodiments according to the present invention.

In the first embodiment, the SiO$_2$ layers 11a and 11b that surround the Si pillars 4a and 4b are used. However, any other material layer functioning as an etching mask may be used for the etching of the WSi$_2$ layers 7a and 7b. The material layer may be constituted by a single layer or plural layers. The same applies to other embodiments according to the present invention.

In the first embodiment, the SiO$_2$ layers 11a and 11b that surround the Si pillars 4a and 4b are used as etching masks for the WSi$_2$ layers 7a and 7b. The SiO$_2$ layers 11a and 11b are formed by entirely depositing a SiO$_2$ film (not illustrated) by CVD and etching the SiO$_2$ film by RIE such that portions of the SiO$_2$ film are left on the side surfaces of the Si pillars 4a and 4b. In this case, as illustrated in FIGS. 1FA to 1FD, the sections of the SiO$_2$ layers 11a and 11b are small in the upper portions and large in the bottom portions. In this case, the side surfaces of the upper portions of the Si pillars 4a and 4b also need to be covered with the SiO$_2$ layers 11a and 11b. On the other hand, for example, a SiO$_2$ layer is formed so as to cover the Si pillars 4a and 4b, the SiO$_2$ layers 2a and 2b, and the SiN layers 3a and 3b. Then, the SiO$_2$ layer is polished by CMP so as to have an upper surface that is flush with the upper surfaces of the SiN layers 3a and 3b. Subsequently, the SiN layers 3a and 3b are etched back so as to have an upper surface positioned higher than the tops of the Si pillars 4a and 4b. A mask SiN layer for the SiO$_2$ layers 11a and 11b is formed on the side surfaces of the peripheries of the SiO$_2$ layers 2a and 2b and the SiN layers 3a and 3b. The SiO$_2$ layer is etched using the mask SiN layer as a mask to form a mask SiO$_2$ layer. Thus, a mask SiO$_2$ layer for the SiO$_2$ layers 11a and 11b is formed on the side surfaces of the Si pillars 4a and 4b with an equal thickness in the vertical direction. Thus, the WSi$_2$ layers 7a and 7b are etched with certainty. The same (including the formation of the gate TiN layer 16a in the thirteenth embodiment) applies to other embodiments according to the present invention.

In the first embodiment, the resist layer 13 constituted by a single layer is used as a mask material layer. Instead of the resist layer 13, a single inorganic material layer or a single organic material layer, a plurality of inorganic material layers, a plurality of organic material layers, or a plurality of material layers including at least one inorganic material layer and at least one organic material layer may be used. For example, a material layer patterned by lithography is disposed in an upper part, and one or more inorganic material layers or organic material layers disposed below the patterned material layer are etched using the patterned material layer as a mask. The $WSi_2$ layers 7a and 7b may be etched by partly or wholly using the one or more inorganic material layers or organic material layers as masks. The same applies to other embodiments according to the present invention.

In the first embodiment, the $SiO_2$ layer 6, the $WSi_2$ layer 7, and the $SiO_2$ layer 8 are formed by sputter deposition, but they may be formed by entirely depositing material layers by, for example, CVD and then etching back the material layers. Alternatively, another method may be employed in which any of the $SiO_2$ layer 6, the $WSi_2$ layer 7, and the $SiO_2$ layer 8 is formed by an etch-back process and the other is formed by a sputtering process. The same applies to other embodiments according to the present invention.

In the first embodiment, as illustrated in FIGS. 1AA to 1AD, the SiN layers 3a and 3b are formed below the resist layers 5a and 5b. However, for example, a two-layer structure including $SiO_2$ and SiN from above may be employed. Alternatively, another material layer constituted by a single layer or plural layers may be used, or such material layers may be combined with each other. The same applies to the $SiO_2$ layers 2a and 2b. The same applies to other embodiments according to the present invention.

In the first embodiment, before the $SiO_2$ layers 11a and 11b are formed on the side surfaces of the Si pillars 4a and 4b, ion implantation of As and B into the $WSi_2$ layer 7 is performed to form the $WSi_2$ layers 7a and 7b containing As and B. However, the ion implantation of As and B may be performed after the $SiO_2$ layers 11a and 11b are formed. By the heat treatment performed later, the $WSi_2$ layers 7a and 7b containing As and B can be formed to the side surfaces of the Si pillars 4a and 4b through thermal diffusion of As and B. Alternatively, the $WSi_2$ layers 7a and 7b containing a donor or acceptor impurity may be formed by applying a gas containing donor or acceptor impurity atoms from the outside or through thermal diffusion from an impurity layer. In this case, a diffusion mask material layer needs be formed on each of the $WSi_2$ layers 7a and 7b. The same applies to other embodiments according to the present invention.

In each of the above embodiments, the case where the Si pillars 4a, 4b, and 4B have a circular shape in plan view has been described. However, it is obvious that the Si pillars 4a, 4b, and 4B may have an elliptical shape.

In each of the above embodiments, the case where the side surfaces of the Si pillars 4a, 4b, and 4B have a columnar shape that is vertical to the plane of the i layer substrate has been described. However, the side surfaces of the Si pillars 4a, 4b, and 4B may have a trapezoidal shape or a barrel-like shape as long as the structure in each embodiment is realized.

The $WSi_2$ layer is used in the first embodiment, the $CoSi_2$ layer is used in the second embodiment, and conductive material layers such as the $P^+$ region 74aa and $N^+$ region 75aa serving as semiconductor layers containing a donor or acceptor impurity are used in the tenth embodiment. However, another material layer formed of, for example, a metal, a semiconductor, or an alloy may be used in each embodiment as long as the structure in each embodiment is realized. The same applies to other embodiments according to the present invention.

In the first embodiment, the $P^+$ region 12a and the $N^+$ region 12b are formed on the peripheries of the Si pillars 4a and 4b. In the fourth embodiment, the $P^+$ region 42a and the $N^+$ region 42b are formed so as to extend to the centers of the Si pillars 4a and 4b. In both the embodiments, the depth of such a $P^+$ region and an $N^+$ region formed in the Si pillars 4a and 4b varies depending on the width of the Si pillars 4a and 4b and the process temperature. As a result, such a $P^+$ region and an $N^+$ region may be formed to the peripheries of the Si pillars 4a and 4b or to the centers of the Si pillars 4a and 4b. The same applies to other embodiments according to the present invention.

In the descriptions of the second embodiment and the fourth embodiment, the $CoSi_2$ layers 24a, 24b, 43a, and 43b serving as silicide layers are formed on the peripheries of the Si pillars 4a and 4b. The formation of the silicide layers to the centers of the Si pillars 4a and 4b does not depart from the scope of the present invention at all. The same applies to other embodiments according to the present invention.

In the first embodiment, the description has been made using the $WSi_2$ layers 7aa and 7bb as wiring alloy layers. In this case, almost no silicide layer is formed in the Si pillars 4a and 4b. However, when the interface between the $WSi_2$ layers 7aa and 7bb and the Si pillars 4a and 4b is observed under magnification, a thin silicide layer is formed in the Si pillars depending on the heat treatment conditions in the processes.

In the first embodiment, a well layer is not formed in lower portions of the Si pillars 4a and 4b below the $P^+$ region 12a and the $N^+$ region 12b. However, after the formation of the Si pillars 4a and 4b, a well layer may be formed by using, for example, ion implantation, solid-state diffusion, or an epitaxial layer. This does not depart from the scope of the present invention at all. The same applies to other embodiments according to the present invention.

In the fourth embodiment, the TiN layers 16A and 16B and the NiSi layer 46 serving as a wiring conductor layer are connected to each other at the intermediate positions of the TiN layers 16A and 16B in the vertical direction. This reduces the capacitance between the gate TiN layers 16A and 16B and the source $P^+$ region 42a and $N^+$ region 42b. The same applies to other embodiments according to the present invention.

In the fifth embodiment, the $WSi_2$ layers 51a and 51b that extend between the two Si pillars 4a and 4b are formed so as not to overlap the TiN layer 16a in plan view. Even when this embodiment is applied to formation of a circuit including one Si pillar or three or more Si pillars, the capacitance can be reduced in the same manner.

In the fifth embodiment, the $WSi_2$ layers 51a and 51b and the TiN layer 16a are formed such that the $WSi_2$ layers 51a and 51b and a portion of the TiN layer 16a that extends in a horizontal direction do not overlap each other in plan view. This reduces the capacitance between the $WSi_2$ layers 51a and 51b and the TiN layer 16a. The same applies to other embodiments according to the present invention.

It has been described in the fifth embodiment that the overlapping of the $WSi_2$ layers 51a and 51b and the TiN layer 16a can be easily controlled by changing the rectangular pattern of the resist layer 50 used for forming the $WSi_2$ layers 51a and 51b and the rectangular pattern of the resist layer (not illustrated) used for forming the TiN layer 16a. This is applicable to, for example, not only reduction in the capacitance between the WSi$_2$ layers 51a and 51b and the TiN layer 16a, but also reduction in the capacitance between other wiring layers. The same applies to other embodiments according to the present invention.

In the eleventh embodiment, the SiO$_2$ layers 52a and 52b and the SiN layers 78a and 78b are formed so as to surround the Si pillars 4a and 4b in a tubular shape with an equal width. In this case, the SiN layers 78a and 78b serve as etching stoppers when the contact holes 83 and 84 that extend through the SiO$_2$ layers 18 and 21 are formed. Any other material layer that serves as an etching stopper may be used instead of the SiN layers 78a and 78b. The eleventh embodiment is applicable to other embodiments according to the present invention.

In the eleventh embodiment, the TiN layers at the end surfaces of the exposed SiN/TiN layers 96a are oxidized to form the TiNO layers 80a and 80b, so that a short-circuit between the output wiring metal layer Vout and the SiN/TiN layer 96a is prevented. However, instead of the TiNO layers 80a and 80b, another material layer such as a SiO$_2$ layer formed by a fluid process may be embedded. Alternatively, the short-circuit between the output wiring metal layer Vout and the SiN/TiN layer 96a may be prevented by another method. The same applies to other embodiments according to the present invention.

It has been described in the twelfth embodiment that by forming the resist layer 88 on a flat material layer (the SiO$_2$ layer 87 and the SiN layers 3a and 3b in FIGS. 12BA to 12BD) having an upper surface positioned higher than the tops of the Si pillars 4a and 4b, a high-density circuit is easily produced compared with in the first embodiment. The same applies to other embodiments according to the present invention.

The resist layer 88 and the SiO$_2$ layer 83a in the twelfth embodiment may each be another material layer constituted by a single layer or plural layers.

The twelfth embodiment is an embodiment in which the present invention is applied to the formation of the WSi$_2$ layers 7aa and 7bb connected to the P$^+$ region 12a and the N$^+$ region 12b. This embodiment is also applicable to the formation of the TiN layer 16a serving as a gate conductor layer in the fifth embodiment. The same applies to other embodiments according to the present invention.

In the twelfth embodiment, the SiO$_2$ layer 87 is formed on the peripheries of the Si pillars 4a and 4b. However, another material layer constituted by a single layer or plural layers may be used instead of the SiO$_2$ layer 87. The same applies to other embodiments according to the present invention.

In the thirteenth embodiment, the TiN layer 16a is formed using the SiO$_2$ layers 2a and 2b as masks. In this case, another material layer such as a conductor material layer may be used instead of the SiO$_2$ layers 2a and 2b as long as the other material layer serves as a mask for TiN etching. When a conductor material layer is employed, the contact resistance between the TiN layer 16a and the W layer 90 can be reduced. The same applies to other embodiments according to the present invention.

In the thirteenth embodiment, the contact hole 22E is formed on the W layer 90. However, the contact hole 22E may be formed so as to be in contact with the side surface of the W layer 90 as long as the W layer 90 and the input wiring metal layer VIN are connected to each other.

The P$^+$ region 103aa and the N$^+$ region 103bb formed by a selective epitaxial crystal growth method in the fourteenth embodiment may be formed of another semiconductor material such as Si or SiGe.

The W layers 104 and 104a in the fourteenth embodiment may be formed using another conductor layer including one or more layers.

In each of the above embodiments, a SOI (silicon on insulator) substrate including an insulating substrate may also be used instead of the i layer substrate 1a.

In each of the above embodiments, the HfO$_2$ layers 15, 15a, 15A, 15B, and 36 are used as gate insulating layers. However, the material for the gate insulating layers is not limited to HfO$_2$, and another insulating layer constituted by a single layer or plural layers may be used.

In the first embodiment, the case where a single SGT is formed in each of the Si pillars 4a and 4b has been described. However, since the present invention relates to the P$^+$ region 12a and the N$^+$ region 12b formed in the bottom portions of the Si pillars 4a and 4b and to the WSi$_2$ layers 7aa and 7bb serving as wiring alloy layers connected to the P$^+$ region 12a and the N$^+$ region 12b, the present invention is applicable to formation of a circuit including a plurality of SGTs in a single semiconductor pillar. The same applies to other embodiments according to the present invention.

In the first embodiment, the description has been made using the case where the source and drain located in the upper and lower portions of SGTs are constituted by the same P$^+$ regions 12a and 19a or the same N$^+$ regions 12b and 19b. However, the first embodiment is also applicable to a tunneling SGT in which the source and drain of one or both of SGTs are formed of impurity layers having different conductivity types. The same applies to other embodiments according to the present invention.

The SGT has a structure in which a gate insulating layer is formed on a periphery of a semiconductor pillar and a gate conductor layer is formed on a periphery of the gate insulating layer. A flash memory device including a conductor layer electrically floating between the gate conductor layer and the gate insulating layer is also one embodiment of the SGT, and the technical idea of the present invention can be applied to such a flash memory device.

In each of the above embodiments, the case where only an SGT is formed in the semiconductor pillar has been described. However, the technical idea of the present invention is applicable to a method for producing a semiconductor device including an SGT and an element (e.g., a photodiode) other than the SGT incorporated therein.

In the first embodiment, the P$^+$ region 12a, the N$^+$ region 12b, and the WSi$_2$ layers 7Aa and 7Ba are formed so as to surround the semiconductor pillars in a tubular shape with an equal width in plan view, but these structures are not limited thereto. The sectional outer shapes of these structures in plan view may be dependent on the sectional shape of the semiconductor pillar, that is, may be shapes similar to the sectional shape of the semiconductor pillar. For example, when the sectional shape of the semiconductor pillar is a square, the sectional outer shape of such a structure may be a square or a rectangle. When the sectional shape of the semiconductor pillar is an ellipse, the sectional outer shape of such a structure may be an ellipse, a circle, or an oval. The sectional shape of such a structure may be any shape that surrounds the semiconductor pillar in plan view. In the case where such a sectional shape is shared, by using, as an etching mask, a material layer that surrounds the semiconductor pillar and has the sectional shape, the P$^+$ region 12a and the WSi$_2$ layer 7Aa and/or the N$^+$ region 12b and the WSi$_2$ layer 7Ba that are arranged in a direction vertical to the substrate can be formed in a self-aligned manner so as to have the same sectional shape. The same applies to other embodiments according to the present invention.

Various embodiments and modifications of the present invention can be made without departing from the broad spirit and scope of the present invention. The above-described embodiments are illustrative examples of the present invention and do not limit the scope of the present invention. The above-described embodiments and modifications can be freely combined with each other. Furthermore, embodiments from which some of constituent features of the embodiments are removed as required are also within the technical idea of the present invention.

The method for producing a pillar-shaped semiconductor device according to the present invention is useful for providing high-density, high-performance semiconductor devices including SGTs.

The invention claimed is:

1. A method for producing a pillar-shaped semiconductor device consisting of a surrounding gate transistor ("SGT"), the method comprising steps of:
    forming, on a substrate, a first semiconductor pillar that stands on a plane of the substrate in a vertical direction;
    forming a first conductive layer extending in a horizontal direction, connected to a first impurity region containing a donor or acceptor impurity in contact with a bottom part of the first semiconductor pillar;
    forming a first mask material layer on/above the first conductive layer, surrounding the first semiconductor pillar;
    after forming the first mask material layer, forming a second mask material layer that is partly overlapped with the first mask material layer in plan view; and
    etching the first conductive layer using the first mask material layer and the second mask material layer as masks,
    wherein a first region consisting of the first conductive layer that surrounds the first semiconductor pillar in plan view is formed below the first mask material layer, and a second region consisting of the first conductive layer connected to a part of the first region in plan view is formed below the second mask material layer.

2. The method for producing the pillar-shaped semiconductor device according to claim 1, wherein at least a part of the first conductive layer is formed of a semiconductor material layer which is the same as that of the first impurity region.

3. The method for producing the pillar-shaped semiconductor device according to claim 1, wherein at least a part of the first conductive layer is formed of metal or alloy.

4. The method for producing the pillar-shaped semiconductor device according to claim 1, wherein the first impurity region is formed at a side surface of the bottom part of the first semiconductor pillar by epitaxial crystal growth.

5. The method for producing the pillar-shaped semiconductor device according to claim 1, wherein the first impurity region is formed inside the first semiconductor pillar by thermal diffusion from the first conductive layer containing a donor or acceptor impurity atom connected to the side surface of the bottom part of the first semiconductor pillar.

6. The method for producing the pillar-shaped semiconductor device according to claim 1, wherein the step of forming the first mask material layer comprises steps of:
    forming a first gate insulating layer surrounding the first semiconductor pillar;
    forming a first gate conductor layer surrounding the first gate insulating layer;
    forming a first material layer that surrounds the first gate conductor layer; and
    etching the first conductive layer using the first gate insulating layer, the first gate conductor layer, and the first material layer as the first mask material layer.

7. The method for producing the pillar-shaped semiconductor device according to claim 1, wherein the step of forming the first mask material layer comprises steps of:
    forming, from bottom up, a second material layer surrounding the first semiconductor pillar, and a third material layer surrounding the first semiconductor pillar with an equal width, and
    forming a fourth material layer by etching the second material layer using the third material layer as a mask;
    wherein the third material layer and the fourth material layer are the first mask material layer.

8. The method for producing the pillar-shaped semiconductor device according to claim 1, wherein the method comprising steps of:
    forming a second gate insulating layer surrounding the first semiconductor pillar;
    forming a second gate conductor layer surrounding the second gate insulating layer;
    forming a second conductive layer extending in a horizontal direction, connected to the second gate conductor layer;
    forming a third mask material layer surrounding outer periphery of the second gate conductor layer and on/above the second conductive layer;
    forming a fourth mask material layer, on/above the second conductive layer, that is partly overlapped with the third mask material layer in plan view; and
    etching the second conductive layer using the third mask material layer and the fourth mask material layer as masks;
    wherein a third region consisting of the second conductive layer that surrounds the first gate conductive layer in plan view is formed below the third mask material layer, and a fourth region consisting of the second conductive layer connected to a part of the third region in plan view is formed below the fourth mask material layer.

9. The method for producing the pillar-shaped semiconductor device according to claim 8, wherein the first conductive layer of the second region and the second conductive layer of the fourth region are at least partly overlapped in plan view.

10. The method for producing the pillar-shaped semiconductor device according to claim 8, wherein at least a part of the second conductive layer is formed of a conductor material layer which is the same as that of the first gate conductor layer.

11. The method for producing the pillar-shaped semiconductor device according to claim 1, the method comprising steps of:
    forming, on the substrate, a second semiconductor pillar that stands in a vertical direction adjacent to the first semiconductor pillar;
    forming a third conductive layer extending in a horizontal direction, connected to a second impurity region containing a donor or acceptor impurity in contact with a bottom part of the second semiconductor pillar;
    forming a fifth mask material layer surrounding the second semiconductor pillar and on/above the third conductive layer;

forming, on/above the third conductive layer, the second mask material layer that is partly overlapped with the fifth mask material layer in plan view; and etching the first conductive layer and the third conductive layer using the first mask material layer, the second mask material layer, and the fifth mask material layer as masks.

12. A method for producing a pillar-shaped semiconductor device consisting of a surrounding gate transistor ("SGT"), the method comprising steps of:

forming, on a substrate, a first semiconductor pillar that stands on a plane of the substrate in a vertical direction;

forming a first gate insulating layer surrounding the first semiconductor pillar;

forming a first gate conductor layer surrounding the first gate insulating layer;

forming a first conductive layer extending in a horizontal direction, connected to the first gate conductor layer;

forming a first mask material layer on/above the first conductive layer, surrounding outer periphery of the first gate conductor layer;

forming a second mask material layer, on/above the first conductive layer, that is partly overlapped with the first mask material layer in plan view; and etching the first conductive layer using the first mask material layer and the second mask material layer as masks, wherein a first region consisting of the first conductive layer that surrounds the first gate conductor layer in plan view is formed below the first mask material layer, and a second region consisting of the first conductive layer connected to a part of the first region in plan view is formed below the second mask material layer.

13. The method for producing the pillar-shaped semiconductor device according to claim 12, wherein at least a part of the first conductive layer is formed of a conductor material layer which is the same as that of the first gate conductor layer.

14. The method for producing the pillar-shaped semiconductor device according to claim 12, wherein at least a part of the first conductive layer is formed of metal or alloy.

15. The method for producing the pillar-shaped semiconductor device according to claim 12, wherein the step of forming the first mask material layer comprises steps of:

forming, from bottom up, a second material layer surrounding outer periphery of the first gate conductor layer, and a third material layer surrounding the first gate conductor layer with an equal width, and forming a fourth material layer by etching the second material layer using the third material layer as a mask;

wherein the third material layer and the fourth material layer are the first mask material layer.

16. The method for producing the pillar-shaped semiconductor device according to claim 12, the method comprising steps of:

forming a second conductive layer extending in a horizontal direction, connected to a first impurity region containing a donor or acceptor impurity in contact with a bottom part of the first semiconductor pillar;

forming a third mask material layer on/above the second conductive layer, surrounding the first semiconductor pillar;

forming, on/above the first conductive layer, a fourth mask material layer that is partly overlapped with the third mask material layer in plan view; and etching the second conductive layer using the third material layer and the fourth material layer as masks, wherein a third region consisting of the second conductive layer that surrounds the first semiconductor pillar in plan view is formed below the third mask material layer, and a fourth region consisting of the second conductive layer connected to a part of the third region in plan view is formed below the second mask material layer.

17. The method for producing the pillar-shaped semiconductor device according to claim 16, wherein the first conductive layer of the second region and the second conductive layer of the fourth region are at least partly overlapped in plan view.

18. The method for producing the pillar-shaped semiconductor device according to claim 16, wherein at least a part of the second conductive layer is formed of a semiconductor material layer which is the same as that of the first impurity region.

19. The method for producing the pillar-shaped semiconductor device according to claim 12, the method comprising steps of:

forming, on the substrate, a second semiconductor pillar that stands in a vertical direction adjacent to the first semiconductor pillar;

forming a second gate insulating layer surrounding the second semiconductor pillar;

forming a second gate semiconductor layer surrounding the second gate insulating layer;

forming a third conductive layer extending in a horizontal direction, connected to the second gate conductor layer, forming a fifth mask material layer on/above the second conductive layer, surrounding outer periphery of the second gate conductor layer;

forming, on/above the third conductive layer, the second mask material layer that is partly overlapped with the fifth mask material layer in plan view; and etching the first conductive layer and the third conductive layer using the first mask material layer, the second mask material layer, and the fifth mask material layer as masks.

* * * * *